(12) United States Patent
Takahashi et al.

(10) Patent No.: US 7,750,485 B2
(45) Date of Patent: Jul. 6, 2010

(54) SEMICONDUCTOR DEVICE AND METHOD FOR MANUFACTURING THE SAME

(75) Inventors: Makoto Takahashi, Kawasaki (JP); Kouichi Nagai, Kawasaki (JP)

(73) Assignee: Fujitsu Semiconductor Limited, Yokohama (JP)

(*) Notice: Subject to any disclaimer, the term of this patent is extended or adjusted under 35 U.S.C. 154(b) by 229 days.

(21) Appl. No.: 11/970,245

(22) Filed: Jan. 7, 2008

(65) Prior Publication Data

US 2008/0142864 A1 Jun. 19, 2008

Related U.S. Application Data

(63) Continuation of application No. PCT/JP2005/012404, filed on Jul. 5, 2005.

(51) Int. Cl.
*H01L 23/485* (2006.01)
(52) U.S. Cl. .......... 257/782; 257/306; 257/763; 257/765; 257/E27.071
(58) Field of Classification Search .......... 257/296, 257/306, 763, 765, E27.071
See application file for complete search history.

(56) References Cited

U.S. PATENT DOCUMENTS

| | | | |
|---|---|---|---|
| 5,438,023 A | 8/1995 | Argos, Jr. et al. | |
| 5,523,595 A | 6/1996 | Takenaka et al. | |
| 6,278,148 B1* | 8/2001 | Watanabe et al. | 257/296 |
| 6,635,918 B1* | 10/2003 | Narui et al. | 257/311 |
| 7,157,734 B2* | 1/2007 | Tsao et al. | 257/48 |
| 7,288,799 B2 | 10/2007 | Saigoh et al. | |
| 2007/0063241 A1* | 3/2007 | Sashida et al. | 257/296 |
| 2007/0145452 A1* | 6/2007 | Oh et al. | 257/306 |

FOREIGN PATENT DOCUMENTS

| | | |
|---|---|---|
| JP | 1214126 A | 8/1989 |
| JP | 3195025 A | 8/1991 |
| JP | 4102367 A | 4/1992 |
| JP | 7135203 A | 5/1995 |
| JP | 855850 A | 2/1996 |
| JP | 200091516 A | 3/2000 |
| JP | 2000277713 A | 10/2000 |
| JP | 2000340653 A | 12/2000 |
| JP | 2005175204 A | 6/2005 |

OTHER PUBLICATIONS

International Search Report of PCT/JP2005/012404, date of mailing Oct. 25, 2005.
Notification Concerning Transmittal of International Preliminary Report on Patentability (PCT/IB/338) dated Jan. 17, 2008, with Forms PCT/IB/326 and PCT/IB/373 issued in corresponding International application No. PCT/JP2005/012404 filed Jul. 5, 2005, with English translation of Written Opinion of the International Searching Authority (Form PCT/ISA/237).

* cited by examiner

*Primary Examiner*—Allan R. Wilson
(74) *Attorney, Agent, or Firm*—Westerman, Hattori, Daniels & Adrian, LLP

(57) ABSTRACT

According to the method for manufacturing a semiconductor device, a surface of a lower insulating film (55) is planarized by CMP or the like, and an upper insulating film (56) and a protective metal film (59) are formed on the lower insulating film (55). Accordingly, the upper insulating film (56) and the protective metal film (59) are formed in such a manner they have an excellent coverage and the water/hydrogen blocking capability of the upper insulating film (56) and the protective metal film (59) is maximized.

10 Claims, 32 Drawing Sheets

SEMICONDUCTOR DEVICE AND METHOD FOR MANUFACTURING THE SAME

TECHNICAL FIELD

The embodiments discussed herein are directed to a semiconductor device having a capacitor structure in which an dielectric film is sandwiched between a lower and upper electrodes and to a method for manufacturing the device and in particular is suitable for being applied to a semiconductor device having a ferroelectric capacitor structure in which the dielectric film is a ferroelectric film having a ferroelectric property.

BACKGROUND ART

Ferroelectric memories (FeRAMs) which use polarization reversal of a ferroelectric material to hold information in a ferroelectric capacitor structure are being developed today. Ferroelectric memories are especially drawing attention because they are non-volatile memories which do not lose information held in them when power is removed from them, can be integrated with high density, are driven at high speed, highly durable, and consume low power.

The ferroelectric film of the ferroelectric capacitor structure is typically made of a ferroelectric oxide having a perovskite crystalline structure, such as a PZT ($Pb(Zr,Ti)O_3$) film or SBT ($SrBi_2Ta_2O_9$) film, having a large remnant polarization, for example approximately 10 ($\mu C/cm^2$) to approximately 30 ($\mu C/cm^2$).

Patent document 1: Japanese Patent Application Laid-Open No. 2000-91516

Patent document 2: Japanese Patent Application Laid-Open No. Hei. 01-214126

Patent document 3: Japanese Patent Application Laid-Open No. Hei. 07-135203

Patent document 4: Japanese Patent Application Laid-Open No. Hei. 03-195025

SUMMARY

It is an aspect of the embodiments discussed herein to provide a semiconductor device, including a semiconductor substrate, a capacitor structure formed over the semiconductor substrate and including a lower electrode and an upper electrode that sandwich a dielectric film, a wiring structure formed over the capacitor structure and electrically connected to the capacitor structure, a pad electrode electrically connected to the wiring structure and providing electric connection to an external element, an insulating film covering a portion of the pad electrode, a surface of the insulating film being planarized, and a protective metal film made of a moisture-resistant metal formed on the insulating film.

DETAILED DESCRIPTION OF THE PREFERRED EMBODIMENTS

As has been stated above, when pad electrodes and around them that have possibly high water contents are covered with a moisture-resistant protective metal film in order to prevent penetration of water/hydrogen, the protective metal film can be damaged under stress especially during packaging and many cracks occur in the protective metal film and an insulating film isolating a pad electrode from the protective metal film is formed unevenly, promoting penetration of water/hydrogen into the device. The inventors have focused attention to this fact and come up with the idea of planarizing the surface of the insulating film, that is, the insulating film covering pad electrodes using a method such as chemical-mechanical polishing (CMP) and forming any of various kinds of protective metal films on the planarized insulating film in order to improve the resistance of the protective metal film to damage and to form the insulating film uniformly. With this approach, the coverage of the protective metal film can be maximized and the insulating film can be formed uniformly. Thus degradation of the ability of the protective metal film and the insulating film to prevent the penetration of water/hydrogen that would be caused by unevenness of pad electrodes, wiring and other element can be prevented.

SPECIFIC EMBODIMENTS OF THE INVENTION

Specific embodiments to which the embodiment is applied will be described in detail with reference to the accompanying drawings. While the embodiments will be described with respect to an example in which the embodiment is applied to an FeRAM, the embodiment is also applicable to semiconductor memories using a conventional dielectric film in a capacitor structure.

First Embodiment

FIGS. 1 to 5 are schematic cross-sectional views illustrating a configuration of an FeRAM of the present embodiment and a method for manufacturing the FeRAM step by step.

Figure 1A:
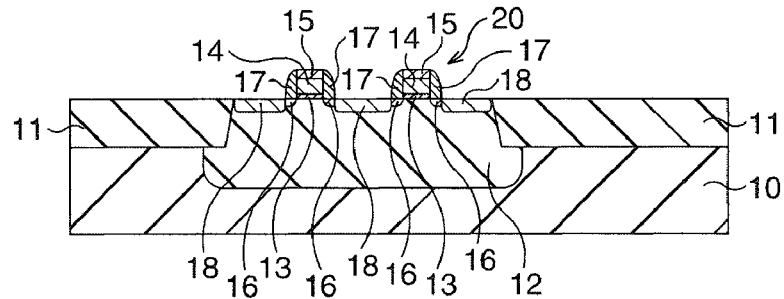
FIG. 1A is a schematic cross-sectional view illustrating a method for manufacturing an FeRAM according to a first embodiment.

First, a MOS transistor 20 that functions as a selection transistor is formed on a silicon semiconductor substrate 10 as shown in FIG. 1A.

In particular, an element isolating structure 11 is formed on a surface layer of the silicon semiconductor substrate 10 by using an STI (Shallow Trench Isolation) method to define an element active region.

Then, an impurity, boron (B) in this example, is introduced into the element active region by ion implantation with a doze of $3.0 \times 10^{13}/cm^2$ and an acceleration energy of 300 keV to form a well 12.

A thin gate insulating film 13 is formed in the element active region to a thickness of approximately 3.0 nm by a method such as thermal oxidation. A polysilicon film is deposited on the gate insulating film 13 to a thickness of approximately 180 nm by a CVD method and a film, for example a silicon nitride film is deposited to a thickness of approximately 29 nm. The silicon nitride film, polysilicon film, and gate insulating film 13 are patterned into an electrode by lithography and then by dry etching to form a gate electrode 14 on the gate insulating film 13. At the same time, a cap film 15 made of silicon nitride film is patterned on the gate electrode 14.

Then, the cap film 15 is used as a mask to introduce an impurity, As in this example, into the element active region with a dose of $5.0 \times 10^{14}/cm^2$ and an acceleration energy of 10 keV, for example, by ion implantation to form a so-called LDD region 16.

Then, a film, for example a silicon oxide film is deposited on the entire surface by a DVD method and the silicon oxide film is so-called etched back to leave the silicon oxide film only on the side surfaces of the gate electrode 14 and the cap film 15, thereby forming a sidewall insulating film 17.

Then, the cap film 15 and the sidewall insulating film 17 are used as a mask to introduce an impurity, phosphorus (P) in this example, into the element active region by ion implantation under conditions that make the impurity concentration higher than that of the LDD region 16, for example with a dose of $5.0 \times 10^{14}/cm^2$ and acceleration energy of 13 keV, to form a source/drain region 18 that overlaps the LDD region 16, thereby completing a MOS transistor 10. The silicon semiconductor substrate 10, the well 12, the element isolating structure 11, the LDD region 16, and the source/drain region 18 will be omitted from FIG. 1B and the subsequent figures.

Figure 1B:
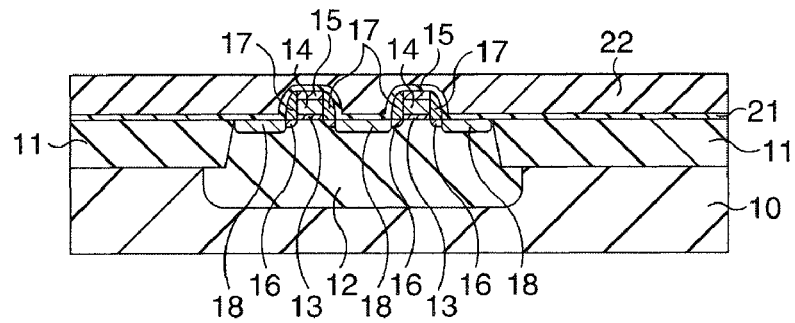
FIG. 1B is a schematic cross-sectional view illustrating a method for manufacturing an FeRAM according to the first embodiment.

Then, a protecting film 21 and a first interlayer insulating film 22 of the MOS transistor 10 are formed as shown in FIG. 1B.

In particular, the protecting film 21 and the first interlayer insulating film 22 are deposited in this order to cover the MOS transistor 10. The protecting film 21 is made of a silicon oxide film and is deposited by CVD to a thickness of approximately 20 nm. The first interlayer insulating film 22 is formed by depositing a plasma SiO film (to a thickness of approximately 20 nm), a plasma SiN film (to a thickness of approximately 80 nm), and a plasma TEOS film (to a thickness of approximately 100 nm) in this order to form a multilayered structure, and then polishing the multilayered structure by using CMP to a thickness of approximately 700 nm.

Figure 1C:
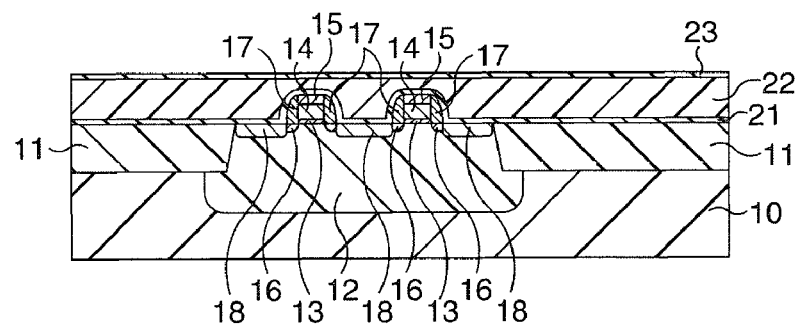
FIG. 1C is a schematic cross-sectional view illustrating a method for manufacturing an FeRAM according to the first embodiment.

Then, a film 23 for improving the orientation of a lower electrode of a ferroelectric capacitor structure 30, which will be described later, is formed as shown in FIG. 1C.

In particular, silicon oxide, for example, is deposited on the first interlayer insulating film 22 to form the orientation improving film 23.

Figure 1D:
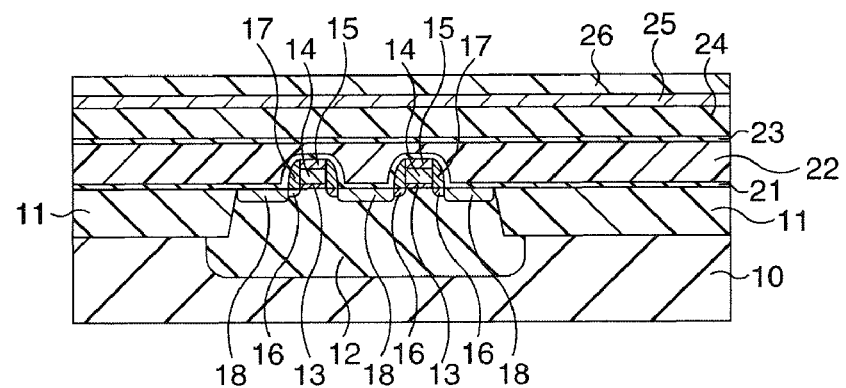
FIG. 1D is a schematic cross-sectional view illustrating the method for manufacturing the FeRAM according to the first embodiment.

Then, a lower electrode layer 24, a ferroelectric film 25, and an upper electrode layer 26 are formed in this order as shown in FIG. 1D.

In particular, first a Ti film with a thickness of approximately 20 nm and a Pt film with a thickness of approximately 150 nm, for example, are deposited by sputtering to form a lower electrode layer 24 having a multilayered structure consisting of the Ti film and the Pt film. Then, a ferroelectric film 25 made of a ferroelectric material, for example PZT, is deposited on the lower electrode layer 24 by RF sputtering to a thickness of approximately 200 nm. An RTA process is applied to the ferroelectric film 25 to crystallize the ferroelectric film 25. Then, an upper electrode layer 26 made of an electrically conductive oxide, for example, $IrO_2$, is formed on the ferroelectric film 25 by reactive sputtering to a thickness of approximately 200 nm. The upper electrode layer 26 may be made of Ir, Ru, $RuO_2$, $SrRuO_3$, or other electrically conductive oxide or a multilayered structure of any of these, instead of $IrO_2$.

Figure 2A:
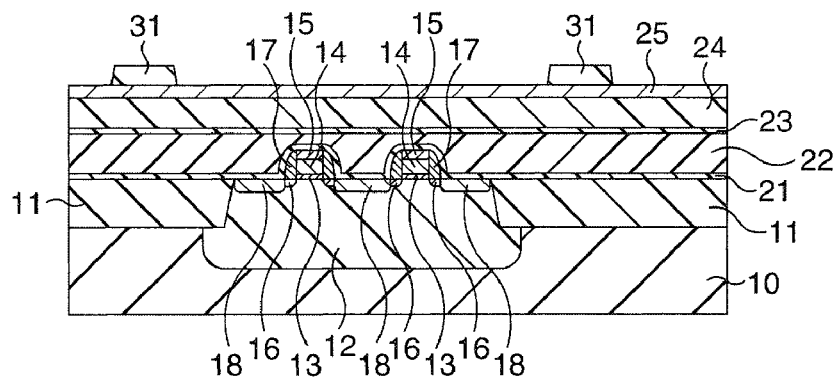
FIG. 2A is a schematic cross-sectional view illustrating a method for manufacturing an FeRAM according to the first embodiment.

Then, upper electrodes 31 are patterned as shown in FIG. 2A.

In particular, the upper electrode layer 26 is patterned into multiple electrode shapes to form upper electrodes 31 by lithography and then by dry etching.

Figure 2B:
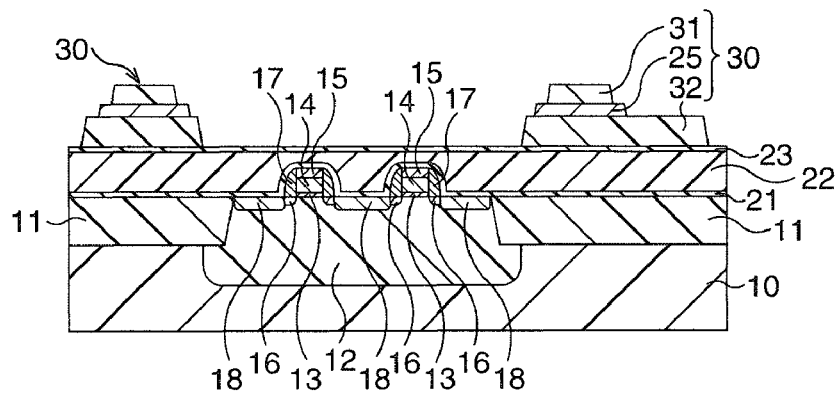
FIG. 2B is a schematic cross-sectional view illustrating a method for manufacturing an FeRAM according to the first embodiment.

Then, the ferroelectric film 25 and the lower electrode layer 24 are formed into a ferroelectric capacitor structure 30 as shown in FIG. 2B.

In particular, first the ferroelectric film 25 is formed into a shape somewhat larger than the upper electrode 31 in alignment with the upper electrode 31 by lithography and then by dry etching.

Then, the lower electrode layer 24 is patterned into a lower electrode 32 somewhat larger than the ferroelectric film 25 in alignment with the formed ferroelectric film 25 by lithography and then by dry etching. Thus, the ferroelectric film 25 and the upper electrode 31 are stacked on the lower electrode 32 in this order, to complete a ferroelectric capacitor structure 30 in which the lower electrode 32 is capacitively coupled with the upper electrode 31 via the ferroelectric film 25.

Figure 2C:
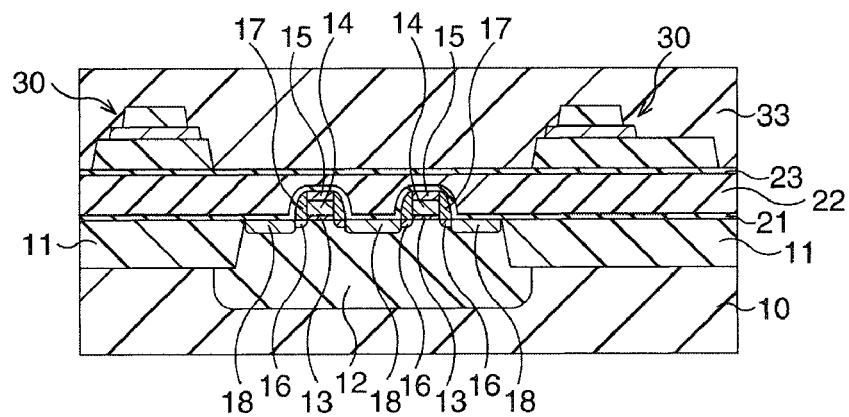
FIG. 2C is a schematic cross-sectional view illustrating a method for manufacturing an FeRAM according to the first embodiment.

Then, a second interlayer insulating film 33 is formed as shown in FIG. 2C.

In particular, a second interlayer insulating film 33 is formed to cover the ferroelectric capacitor structure 30. Here, the second interlayer insulating film 33 is formed by, for example, depositing a plasma TEOS film to a thickness of approximately 1400 nm and then polishing the plasma TEOS film by CMP to a thickness of approximately 1000 nm. After the CMP, $N_2O$ plasma annealing is applied in order to dehydrate the second interlayer insulating film 33.

Figure 2D:
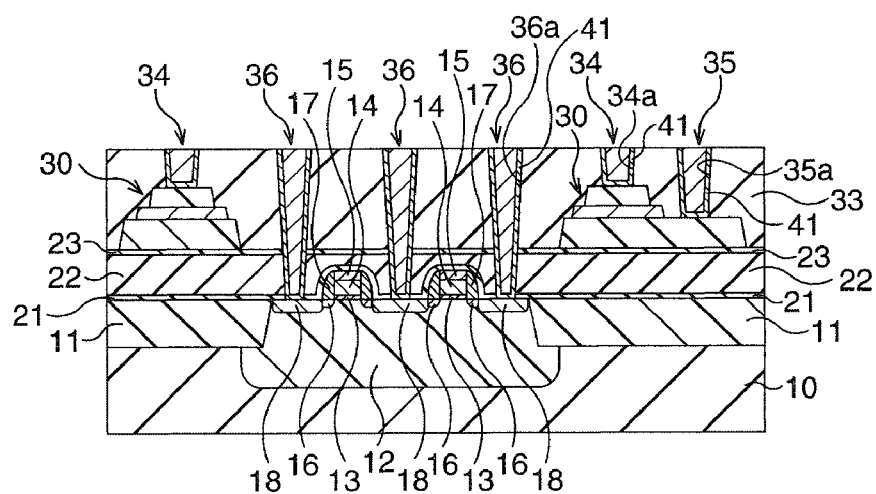
FIG. 2D is a schematic cross-sectional view illustrating a method for manufacturing an FeRAM according to the first embodiment.

Then, conductive plugs 34, 35 of the ferroelectric capacitor structure 30 and conductive plugs 36 connected to the source/drain region 18 of the transistor structure 10 are formed as shown in FIG. 2D.

First, via holes 34a, 35a to the ferroelectric capacitor structure 30 are formed.

In particular, lithography and then dry etching are applied to the second interlayer insulating film 33 to expose a portion of the surface of the upper electrode 31 and to expose a portion of the surface of the lower electrode 32 at the same time, thereby forming via holes 34a, 35a having a diameter of approximately 0.5 μm in these portions at the same time. The upper electrode 31 and the lower electrode 32 act as etching stoppers during formation of the via holes 34a, 35a.

Then, annealing is performed in order to repair damage to the ferroelectric capacitor structure 30 caused during processes subsequent to the formation of the ferroelectric capacitor structure 30. Here, the annealing is performed at a processing temperature of 500 degrees C. for 60 minutes under oxygen atmosphere.

Then, via holes 36a to the source/drain region 18 of the transistor structure 10 are formed.

In particular, lithography and then dry etching are applied to the second interlayer insulating film 33, the orientation improving film 23, the first interlayer insulating film 22, and the protecting film 21 by using the source/drain region 18 as an etching stopper to expose portions of the surface of the source/drain region 18 to form via holes 36a having a diameter of, for example, approximately 0.3 μm.

Then, conductive plugs 34, 35, and 36 are formed.

First, RF preprocessing equivalent to several tens nm, approximately 10 nm in this example, in terms of etching of a usual oxide film is performed. Then, a TiN film is deposited by sputtering to a thickness of approximately 75 nm, for example, to cover the sidewalls of the via holes 34a, 35a, and 36a to form an foundation film (glue film) 41. Then, for example a tungsten (W) film is formed using CVD so that the via holes 34a, 35a, and 36a are filled with W over the glue film 41. Then, the W film and glue film 41 are polished by CMP by using the second interlayer insulating film 33 as a stopper to form conductive plugs 34, 35, and 36 that fill via holes 34a, 35a, and 36a with W, with the glue film 41 between them.

Figure 3A:
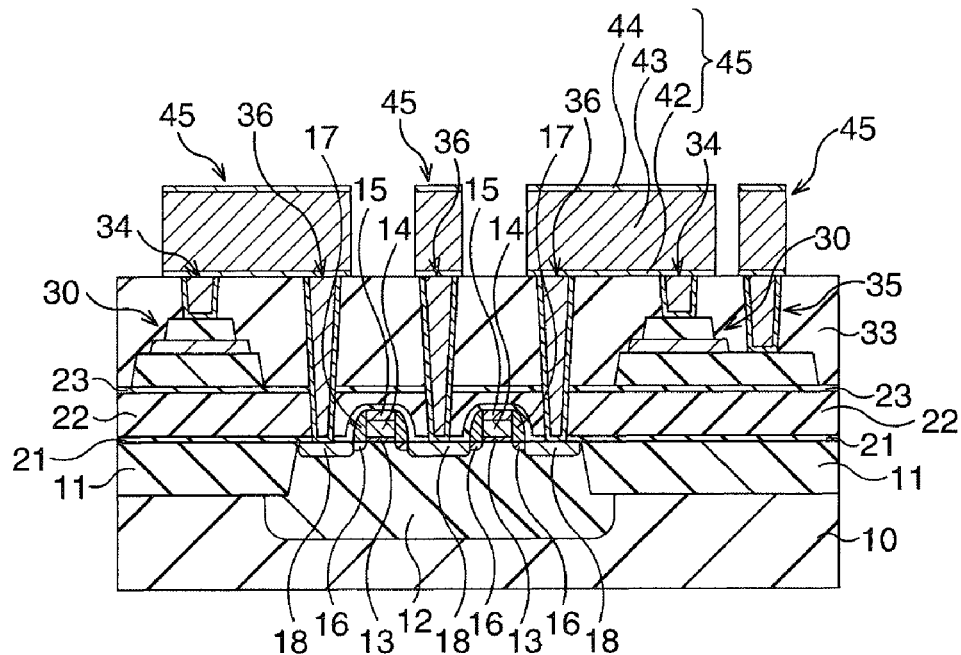
FIG. 3A is a schematic cross-sectional view illustrating a method for manufacturing an FeRAM according to the first embodiment.

Then, a first wiring 45 connecting with the conductive plugs 34, 35, and 36 is formed as shown in FIG. 3A.

In particular, first barrier metal film 42, a wiring film 43, and a barrier metal film 44 are deposited on the entire surface by a method such as sputtering. The barrier metal film 42 is formed by depositing for example a Ti film (to a thickness of approximately 60 nm) and a TiN film (to a thickness of approximately 30 nm) in this order by sputtering. The wiring film 43 may be an Al alloy film (Al—Cu film in this example) formed to a thickness of approximately 360 nm. The barrier metal film 44 is formed by depositing a Ti film (to a thickness of approximately 5 nm) and a TiN film (to a thickness of approximately 70 nm) in this order by sputtering. The structure of the wiring film 43 is the same as that of a logic section excluding an FeRAM designed with the same design rules. Therefore, this does not pose a problem in terms of making and reliability of the wiring.

An antireflection coat, for example a SiON film (not shown) is formed and then the antireflection coat, the barrier metal film 44, the wiring film 43, and the barrier metal film 42 are patterned into wiring geometries by lithography and then by dry etching to form a first wiring 45. Instead of the Al alloy film, a Cu film (or Cu alloy film) may be formed as the wiring film 43 by using a method such as the so-called damascene method and a Cu wiring may be formed as the first wiring 45.

Figure 3B:
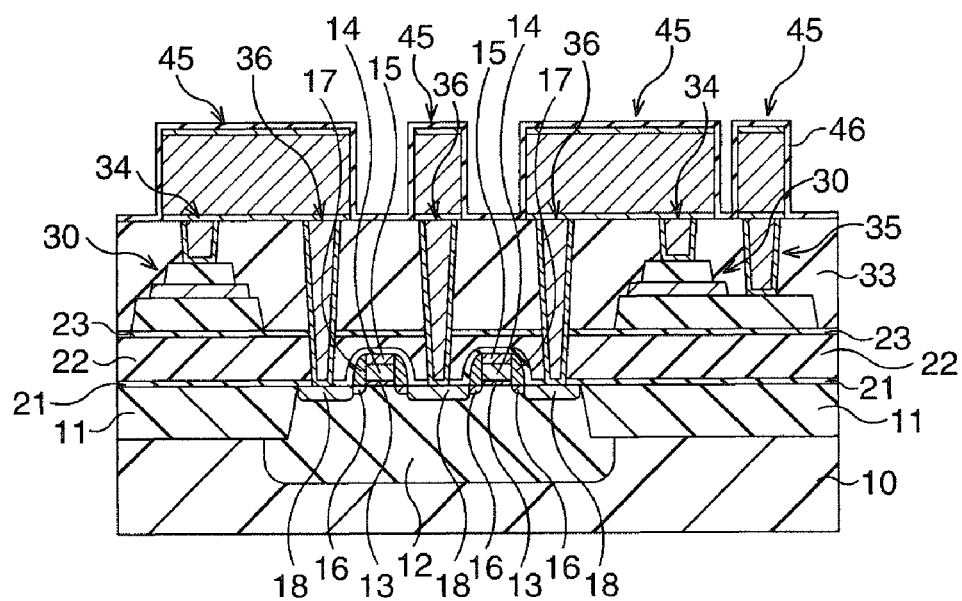
FIG. 3B is a schematic cross-sectional view illustrating a method for manufacturing an FeRAM according to the first embodiment.

Then, a protecting film 46 is formed as shown in FIG. 3B in order to prevent degradation of the properties of the ferroelectric capacitor structure 30.

In particular, a protecting film 46 is formed on the second interlayer insulating film 33 so as to cover the first wiring 45. The protecting film 46 is intended to reduce damage to the ferroelectric capacitor 30 during a layering process performed after the ferroelectric capacitor structure 30 is formed. The protecting film 46 is formed from a metal oxide film, for example alumina, to a thickness of approximately 20 nm by a method such as sputtering.

Figure 4:
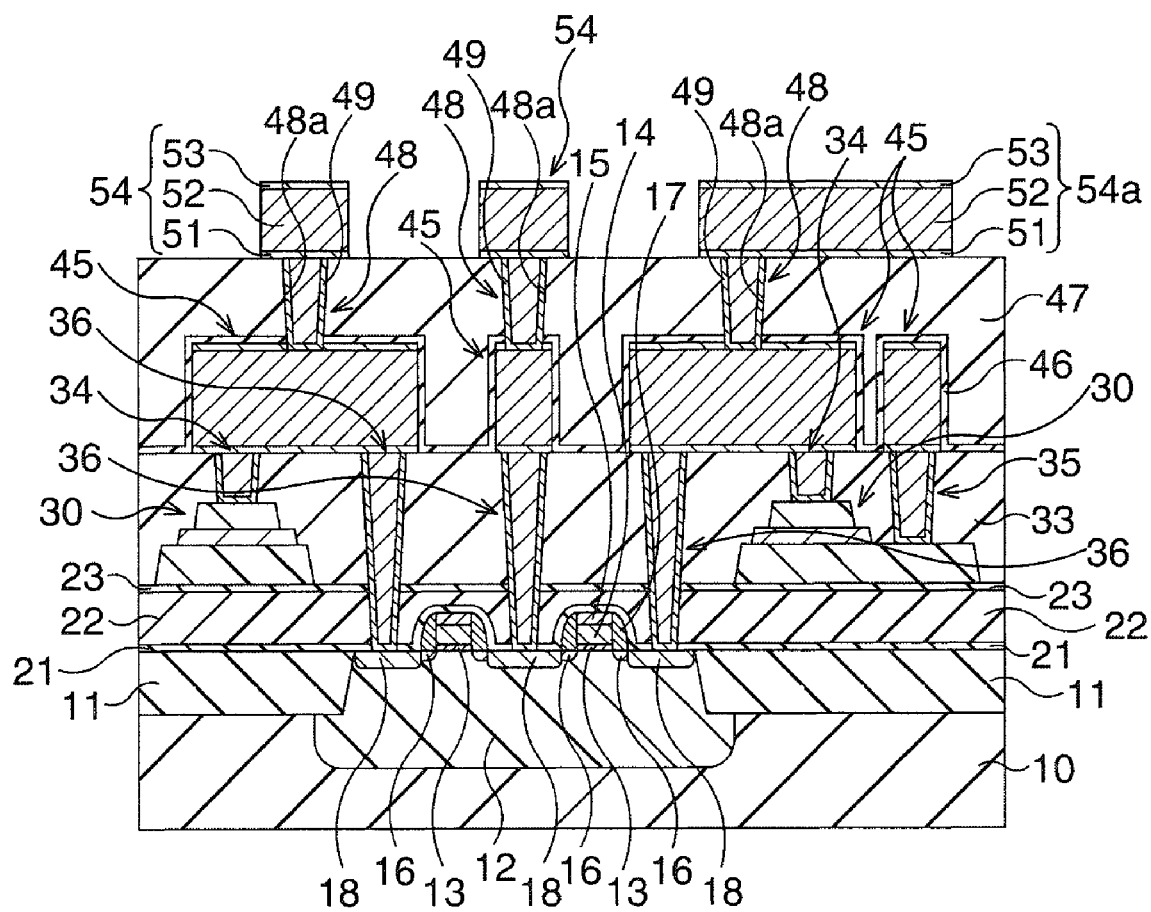
FIG. 4 is a schematic cross-sectional view illustrating a method for manufacturing an FeRAM according to the first embodiment.

Then, a second wiring 54 that connects with the first wiring 45 is formed as shown in FIG. 4.

In particular, first a third interlayer insulating film 47 is formed to cover the wiring 45, with the protecting film 46 between them. The third interlayer insulating film 47 is formed as follows. A silicon oxide film is formed to a thickness of approximately 700 nm and a plasma TEOS is formed to a thickness of 1,100 nm in total. Then the surface of the third interlayer insulating film 47 is polished by CMP to a thickness of approximately 750 nm.

Then, conductive plugs 48 that connect to the wiring 45 are formed.

Lithography and then dry etching are applied to the third interlayer insulating film 47 and the protecting film 46 to expose portions of the surface of the wiring 45 to form via holes 48a having a diameter of approximately 0.25 µm, for example. Then, a foundation film (glue film) 49 is formed to cover the sidewall of the via holes 48a and then a tungsten (W) film is formed by CVD so that the via holes 48a are filled with W over the glue film 49. The W film and the glue film 49 are polished by using the third interlayer insulating film 47 as a stopper, for example, to form conductive plugs 48 that fills the via hole 48a with W, with the glue film 49 between them.

Then, a second wiring 54 that connects with the conductive plugs 48 is formed.

First, a barrier metal film 51, a wiring film 52, and a barrier metal film 53 are deposited on the entire surface by a method such as sputtering. The barrier metal 51 may be formed by depositing a Ti film (to a thickness of approximately 60 nm) and a TiN film (to a thickness of approximately 30 nm) in this order by sputtering, for example. The wiring film 52 may be an Al alloy film (Al—Cu film in this example) formed to a thickness of approximately 360 nm. The barrier metal film 53 may be formed by depositing a Ti film (to a thickness of approximately 5 nm) and a TiN film (to a thickness of approximately 70 nm) in this order by sputtering, for example. The structure of the wiring film 52 is the same as that of the logic section, excluding a FeRAM designed with the same design rules. Therefore, this does not pose a problem in terms of making and reliability of the wiring.

Then, an antireflection film, for example a SiON film (not shown), is formed and then the antireflection film, the barrier metal film 53, the wiring film 52, and the barrier metal film 51 are patterned into wiring geometries by lithography and then dry etching to form a second wiring 54. Instead of the Al alloy film, a Cu film (or Cu alloy film) may be formed as the wiring film 52 by using a method such as the so-called damascene method, to form a Cu wiring as the second wiring 52.

While a two-layer structure consisting of the first wiring 45 and the second wiring 54 has been shown as an exemplary wiring structure in this embodiment, a multilayered structure consisting of three or more layers may be formed.

Figure 5A:
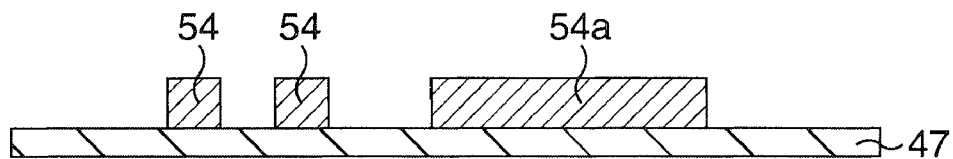
FIG. 5A is a schematic cross-sectional view illustrating a method for manufacturing an FeRAM according to the first embodiment.

FIG. 5A shows how such a structure is formed. In FIG. 5A, only layers above the third interlayer insulating film 47 are shown because the lower part of the structure is the same as that shown in FIG. 4 (barrier metal films 51, 53 and conductive plugs 48 are omitted from the figure). The layers below the third interlayer film 47 are omitted from FIGS. 5A to 5G for convenience. Among multiple second wirings 54 in this embodiment, the second wiring 54 in the right-hand side of the figures is a pad electrode (hereinafter referred to as the pad electrode 54a) for providing electric connection to the outside.

Figure 5B:
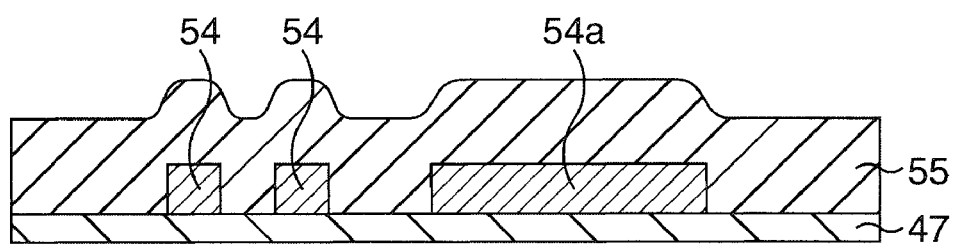
FIG. 5B is a schematic cross-sectional view illustrating a method for manufacturing an FeRAM according to the first embodiment.

Then, a lower insulating film 55 is formed to cover the second wirings 54 as shown in FIG. 5B.

In particular, a lower insulating film 55 is formed to cover the second wirings 54. The lower insulating film 55 may be formed by depositing a silicon oxide film by CVD using TEOS, for example, to a thickness such that the wirings 54 are embedded in the silicon oxide film. The surface of the lower insulating film 55 reflects the shape of the second wirings 54 and is uneven accordingly.

Figure 5C:
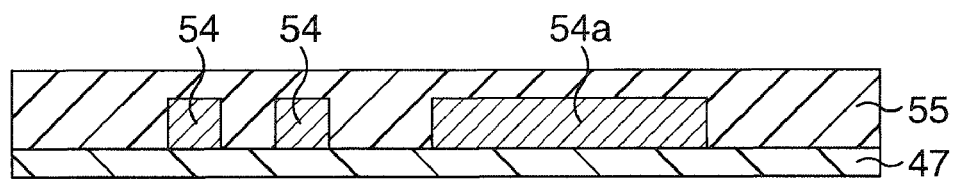
FIG. 5C is a schematic cross-sectional view illustrating a method for manufacturing an FeRAM according to the first embodiment.

Then, the surface of the lower insulating film 55 is planarized as shown in FIG. 5C.

In particular, the surface of the lower insulating film 55 is planarized by CMP. In the CMP, the surface of the lower insulating film 55 is polished to a predetermined thickness, for example approximately 100 nm, within limits that do not expose the surfaces of the second wirings 54.

Here, instead of the process steps shown in FIGS. 5B and 5C, steps shown in FIG. 6 may be used for forming the lower insulating film 55 having the planarized surface.

Figure 6A:
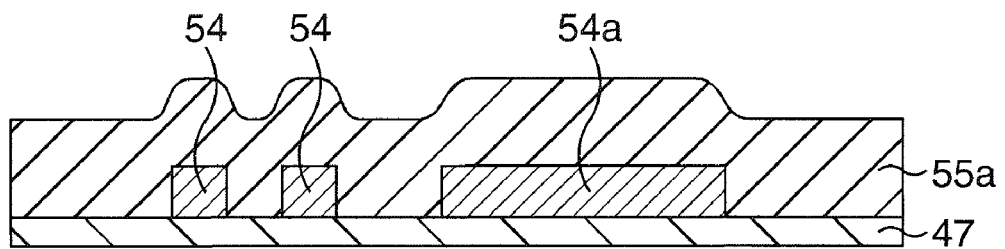
FIG. 6A is a schematic cross-sectional view illustrating another example of a method for manufacturing an FeRAM according to the first embodiment.

First, silicon oxide is deposited by CVD using TEOS, for example, to such a thickness that the second wirings 54 are embedded, thereby forming an insulating film 55a as shown in FIG. 6A. The surface of the insulating film 55a reflects the shapes of the second wirings 54 and is uneven accordingly.

Figure 6B:
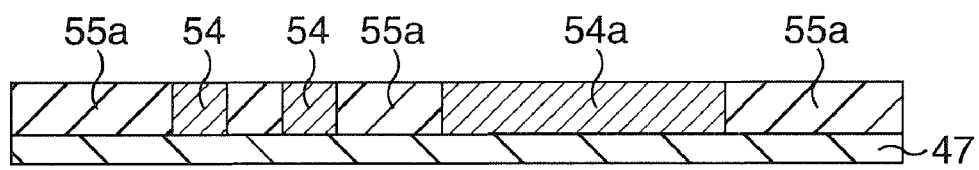
FIG. 6B is a schematic cross-sectional view illustrating another example of a method for manufacturing an FeRAM according to the first embodiment.
Figure 6C:
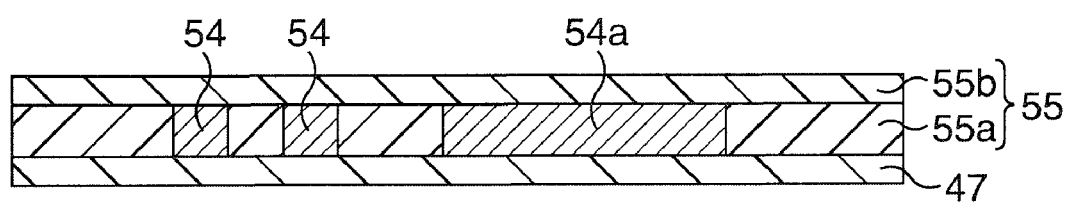
FIG. 6C is a schematic cross-sectional view illustrating another example of a method for manufacturing an FeRAM according to the first embodiment.

Then, the surface of the insulating film 55a is planarized to expose the surface of the second wirings 54 by CMP, for example, using the second wirings 54 as stoppers, as shown in FIG. 6B.

Then, an insulating film 55b is formed on the insulating film 55a having the planarized surface. The insulating film 55b may be a silicon oxide film formed by CVD using TEOS, for example. The insulating films 55a and 55b together form a lower insulating film 55 having a thickness of approximately 100 nm covering the second wirings 54.

Figure 5D:
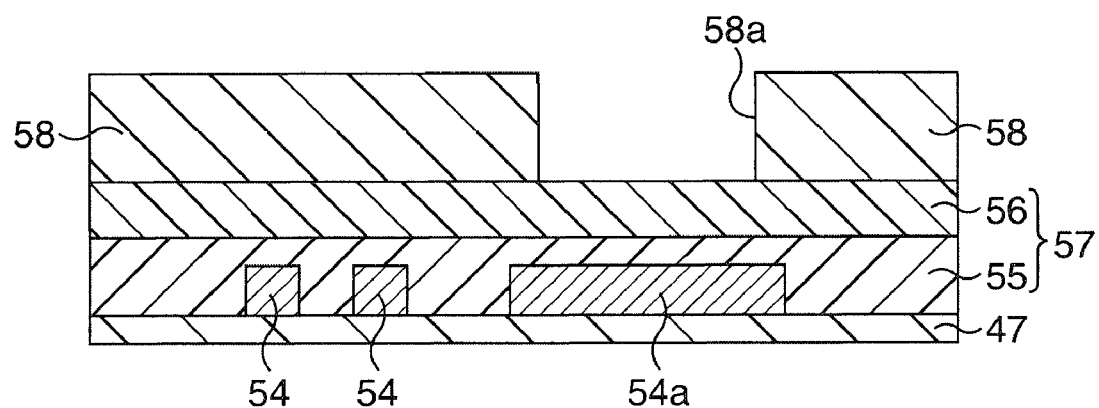
FIG. 5D is a schematic cross-sectional view illustrating a method for manufacturing an FeRAM according to the first embodiment.

Then, an upper insulating film 56 and a resist pattern 58 are formed as shown in FIG. 5D.

In particular, an upper insulating film 56 is formed on the lower insulating film 55. The upper insulating film 56 may be a film of a material, for example a silicon nitride film, that has an etching rate lower than that of the lower insulating film 55 and the capability of preventing penetration of hydrogen, formed to a thickness of approximately 400 nm by CVD. The lower insulating film 55 and the upper insulating film 56 make up a fourth interlayer insulating film 57.

Then a resist is applied to the entire surface of the upper insulating film 56 and then is patterned by lithography to form a resist pattern 58 having an opening 58a exposing a portion of the upper insulating film 56 above and in alignment with a pad electrode 54a.

Figure 5E:
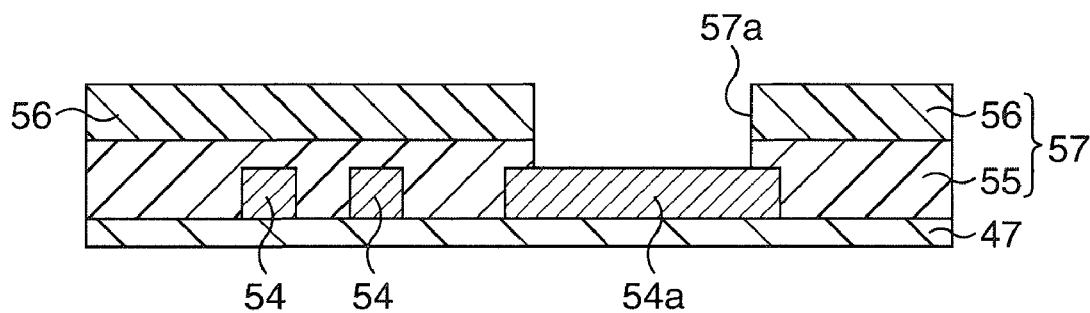
FIG. 5E is a schematic cross-sectional view illustrating a method for manufacturing an FeRAM according to the first embodiment.

Then, the fourth interlayer insulating film 57 is worked as shown in FIG. 5E.

In particular, the resist pattern 58 is used as a mask and the pad electrode 54a is used as an etching stopper to etch the fourth interlayer insulating film 57, here the upper insulating film 56 and an upper portion (the insulating film 55b in the example in FIG. 6C) of the lower insulating film 55, by dry etching. As a result, an opening 57a that exposes a portion of the surface of the pad electrode 54a is formed in alignment with the opening 58a of the resist pattern 58.

Then, the resist pattern 58 is removed by incineration or the like.

Figure 5F:
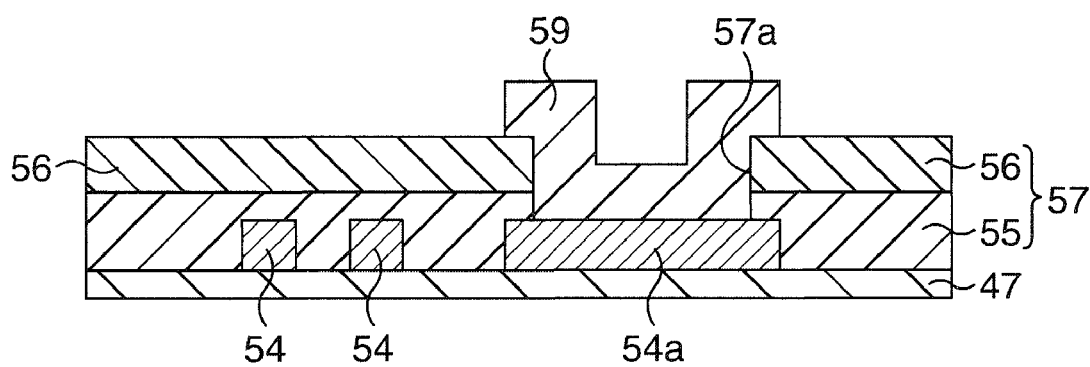
FIG. 5F is a schematic cross-sectional view illustrating a method for manufacturing an FeRAM according to the first embodiment.

Then, a protective metal film 59 is patterned as shown in FIG. 5F.

In particular, a moisture-resistant metal, Al in this example, is deposited on the fourth interlayer insulating film 57, including inside the opening 57a, by sputtering to a thickness of approximately 800 nm, for example, to form an Al film. The moisture-resistant film may be, instead of Al, an Al alloy, such as an Al—Cu alloy, or Ti, TiN, TiON, or Cu, or a multilayered film of any of these.

Then, the Al film is etched by dry etching using a resist pattern (not shown) and using the upper insulating film 56 as an etching stopper to form on the pad electrode 54a a protective metal film 59 electrically connected to the pad electrode 54a. Here, the two-layer structure consisting of the pad electrode 54a and the protective metal layer 59 forms a pad electrode for electrically connecting to an external element. Thus, the protective metal film 59 in effect functions as a pad electrode.

Then, the resist pattern is removed by a method such as incineration.

According to the present embodiment, the upper insulating film 56 formed on the lower insulating film 55 has an excellent coverage and is formed evenly because the surface of the lower insulating film 55 is planarized. The protective metal film 59 also has an excellent coverage, which significantly may improve the resistance to damage during processes such as packaging. Because the upper insulating film 56 and the protective metal film 59 having an excellent coverage are formed in this way, the ability of the upper insulating film 56 and the protective metal film 59 to prevent penetration of water/hydrogen is maximized. With this configuration, property degradation of the ferroelectric capacitor structure 30 can be reliably prevented.

Figure 5G:
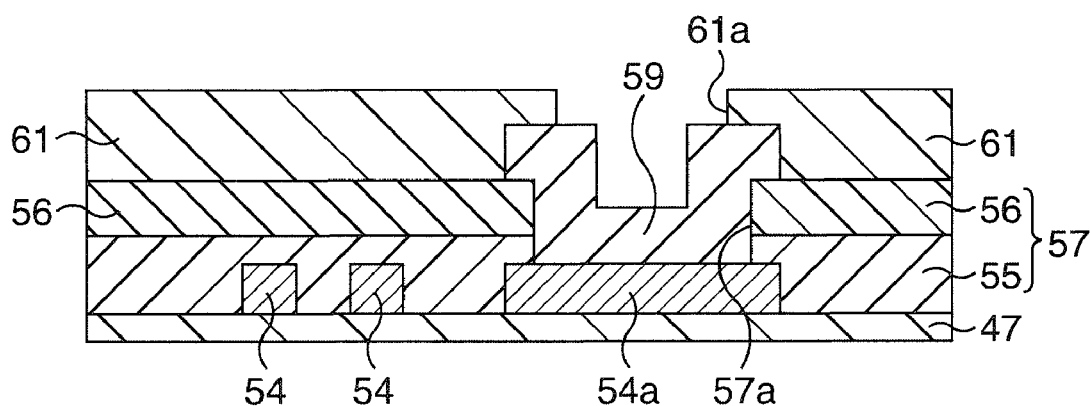
FIG. 5G is a schematic cross-sectional view illustrating a method for manufacturing an FeRAM according to the first embodiment.

Then, an upper protective layer 61 that covers the area surrounding the protective metal film 59 is formed as shown in FIG. 5G.

In particular, first an upper protective layer 61 is formed on the upper insulating film 56 to cover the protective metal film 59. The upper protective layer 61 may be formed by depositing polyimide, for example.

Then, an opening 61a is formed in the upper protective layer 61 to expose a portion of the surface of the protective metal film 59. Thus, an FeRAM is completed.

As has been described above, according to the present embodiment, a reliable FeRAM that reliably prevents penetration of water/hydrogen into a ferroelectric capacitor structure 30 to maintain a high performance of the ferroelectric capacitor structure 30 can be implemented with a relatively simple configuration.

Variations

Variations of the first embodiment will be described below. In the description of the variations, the same components as disclosed in the first embodiment will be labeled with the same reference numerals, detailed description of which will be omitted.

[First Variation]

In the first variation, a protective metal film that surrounds a pad electrode 54a is formed in the FeRAM configuration disclosed in the first embodiment.

FIG. 7 shows schematic cross-sectional views illustrating main steps of a method for manufacturing an FeRAM according to the first variation.

As in the first embodiment, first a MOS transistor 20, a ferroelectric capacitor structure 30, first wirings 45, second wirings 54, and so on are formed through the steps shown in FIGS. 1A to 1D, 2A to 2D, 3A and 3B, and 4 (5A).

Figure 7A:
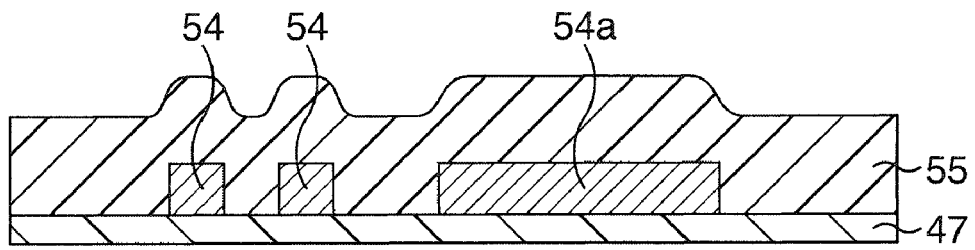
FIG. 7A is a schematic cross-sectional view illustrating a method for manufacturing an FeRAM according to a first variation of the first embodiment.

Then, a lower insulating film 55 is formed to cover second wirings 54 as shown in FIG. 7A, as in FIG. 5B.

In particular, a lower insulating film 55 is formed to cover the second wirings 54. The lower insulating film 55 may be formed by depositing a silicone oxide film by CVD using TEOS, for example, to such a thickness that the second wirings 54 are embedded. The surface of the lower insulating film 55 reflects the shape of the second wirings 54 and is uneven accordingly.

Figure 7B:
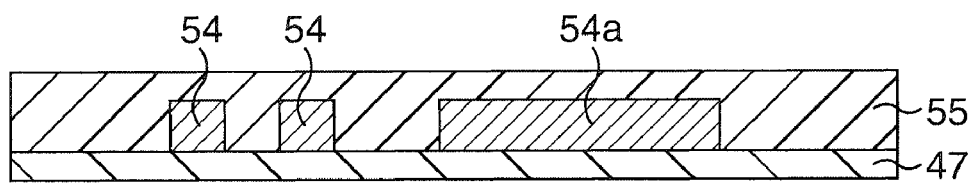
FIG. 7B is a schematic cross-sectional view illustrating a method for manufacturing an FeRAM according to the first variation of the first embodiment.

Then, the surface of the lower insulating film 55 is planarized as shown in FIG. 7B.

In particular, the surface of the lower insulating film 55 is planarized by CMP, for example. During the CMP, the surface of the lower insulating film 55 is polished to a predetermined thickness, for example approximately 100 nm, within the limits that do not expose the surfaces of the second wirings 54.

As in the first embodiment, the lower insulating film 55 having an even surface may be formed as shown in FIG. 6, instead of using the steps shown in FIGS. 7A and 7B.

Figure 7C:
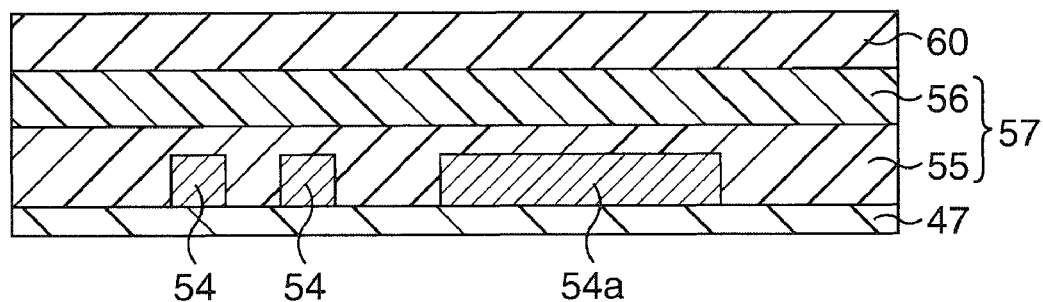
FIG. 7C is a schematic cross-sectional view illustrating a method for manufacturing an FeRAM according to the first variation of the first embodiment.

Then, an upper insulating film 56 and an Al film 60 are formed as shown in FIG. 7C.

In particular, first an upper insulating film 56 is formed on the lower insulating film 55. The upper insulating film 56 is formed by depositing a film of a material having a lower etching rate than that of the lower insulating film 55 and the capability of preventing penetration of hydrogen, for example a silicon nitride film, by CVD to a thickness of approximately 400 nm. The lower insulating film 55 and the upper insulating film 56 form a fourth interlayer insulating film 57.

Then, a moisture-resistant metal, Al in this example, is deposited on the fourth interlayer insulating film 57 by sputtering, for example, to a thickness of approximately 800 nm, for example, to form an Al film 60. Here, the moisture-resistant film may be an Al alloy such as Al—Cu, or Ti, TiN, TiON, or Cu, or a multilayered film of any of these, instead of Al.

Figure 7D:
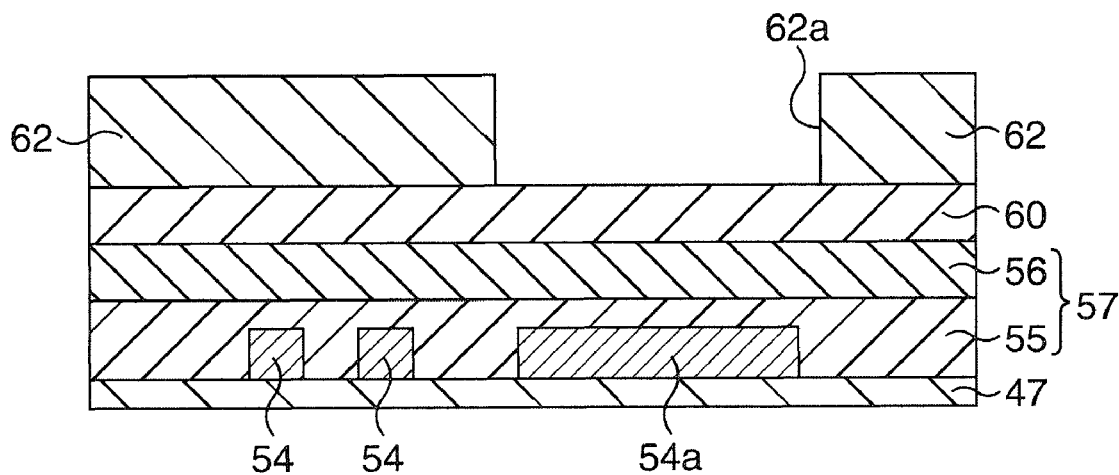
FIG. 7D is a schematic cross-sectional view illustrating a method for manufacturing an FeRAM according to the first variation of the first embodiment.

Then, a resist pattern 62 is formed on the Al film 60 as shown in FIG. 7D.

In particular, a resist is applied to the entire surface of the Al film 60, the resist is patterned by lithography to form a resist pattern 62 having an opening 62a that exposes a portion above and in alignment with a pad electrode 54a of the Al film 60.

Figure 7E:
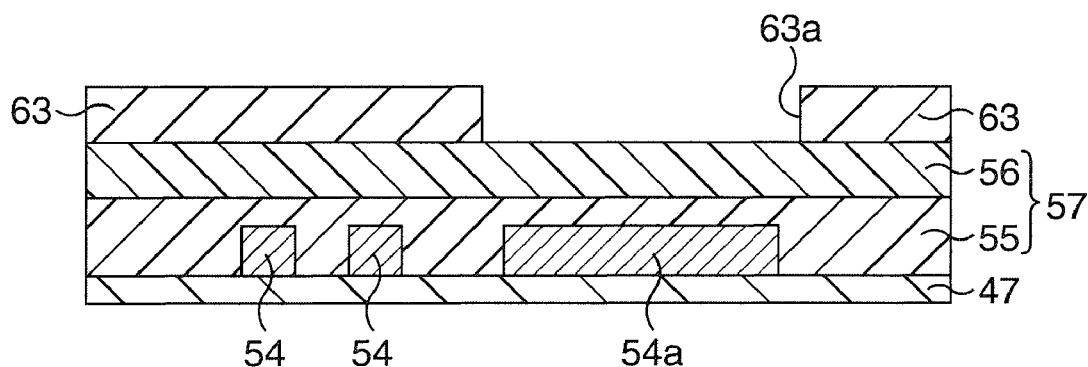
FIG. 7E is a schematic cross-sectional view illustrating a method for manufacturing an FeRAM according to the first variation of the first embodiment.

Then, the Al film 60 is patterned to form a protective metal film 63 as shown in FIG. 7E.

In particular, the resist pattern 62 is used as a mask and the upper insulating film 56 is used as an etching stopper to etch the Al film 60 by dry etching. In the dry etching, the Al film 60 on the upper insulating film 56 in the opening 62a of the resist pattern 62 is removed to form an opening 63a exposing the pad electrode 54a. By the etching, a protective metal film 63 is formed that is electrically insulated from the pad electrode 54a and surrounds the pad electrode 54a.

Figure 8:
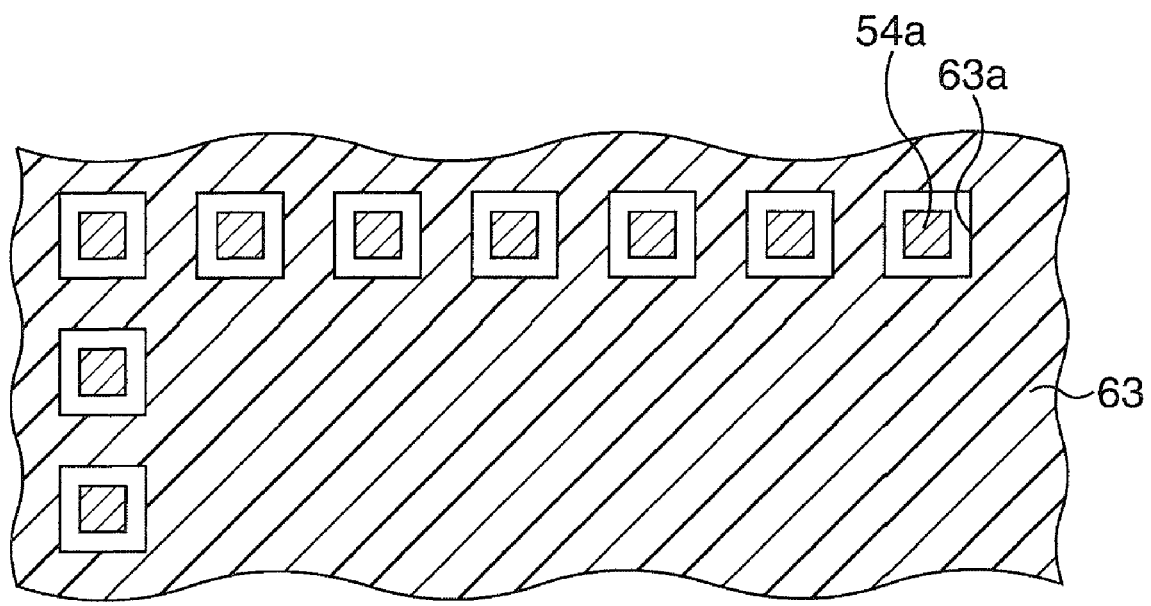
FIG. 8 is a schematic plan view showing a protective metal film according to the first variation of the first embodiment.

FIG. 8 shows a plan view of the protective metal film 63.

As shown, the protective metal film 63 is formed to cover the upper surface of the silicon semiconductor substrate 10 except the portions where the pad electrodes 54a are formed, and is electrically insulated from the pad electrodes 54a by surrounding the pad electrode 54a. Because the areas surrounding the pad electrodes 54a where water/hydrogen is most likely to enter are covered with the moisture-resistant protective metal film 63, penetration of water/hydrogen into the inside can be efficiently prevented.

Then, the resist pattern 62 is removed by incineration or the like.

Figure 7F:
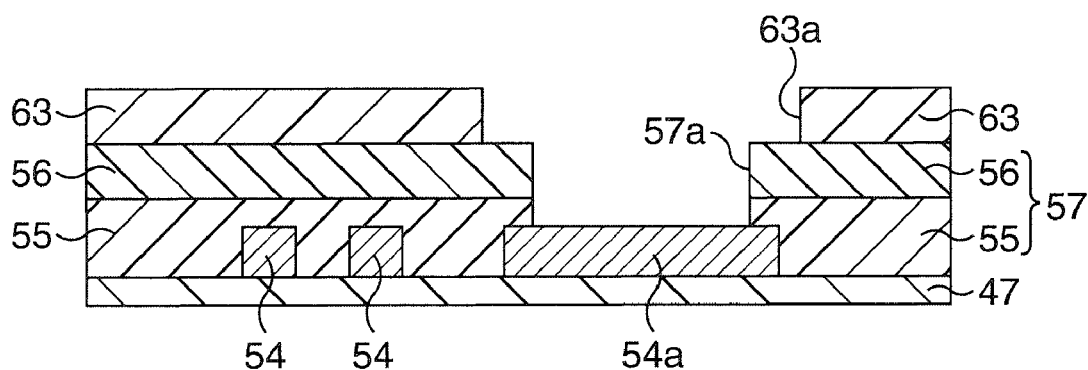
FIG. 7F is a schematic cross-sectional view illustrating a method for manufacturing an FeRAM according to the first variation of the first embodiment.

Then, the fourth interlayer insulating film 57 is worked as shown in FIG. 7F.

In particular the fourth interlayer insulating film 57, which is the upper insulating film 56 and an upper portion (the insulating film 55b in the example shown in FIG. 6C) of the lower insulating film 55 in this example is dry-etched by a resist pattern (not shown) and using the pad electrode 54a as an etching stopper to form an opening 57a that exposes a portion of the surface of the pad electrode 54a according to the resist pattern. The surface of the pad electrode 54a exposed in the opening 57a will function as a portion for providing electric connection to the outside.

Because the surface of the lower insulating film 55 is planarized in the first variation, the upper insulating film 56 formed on the lower insulating film 55 has an excellent coverage and a uniform thickness. The protective metal film 63 formed on the upper insulating film 56 also has an excellent coverage, which may significantly improve the resistance to damage during packaging, for example. Because the upper insulating film 56 and the protective metal film 59 are formed so that they have an excellent coverage in this way, the ability of the upper insulating film 56 and the protective metal film 59 to prevent penetration water/hydrogen is maximized. With this configuration, property degradation of the ferroelectric capacitor structure 30 can be reliably prevented.

Figure 7G:
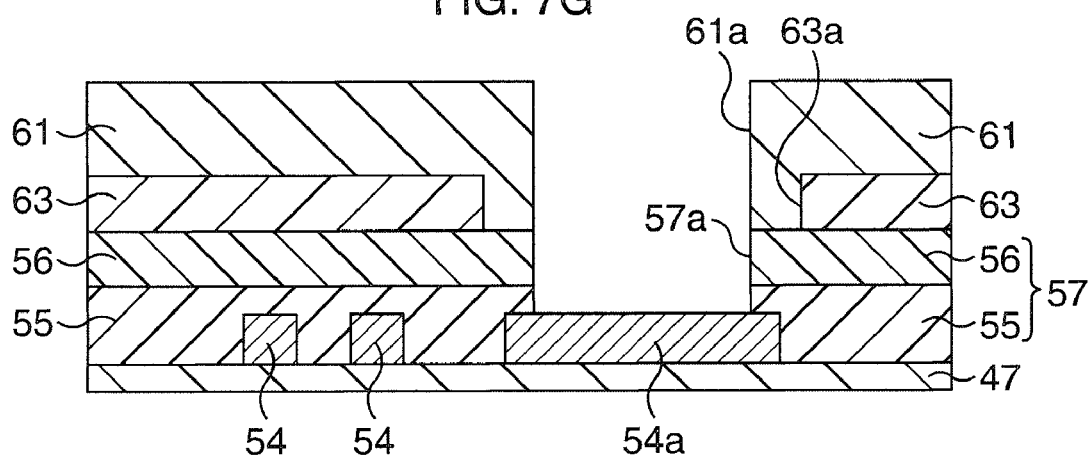
FIG. 7G is a schematic cross-sectional view illustrating a method for manufacturing an FeRAM according to the first variation of the first embodiment.

Then, an upper protective layer 61 covering the protective metal film 63 is formed as shown in FIG. 7G.

In particular, first an upper protective layer 61 is formed on the entire surface. The upper protective layer 61 may be formed by depositing polyimide, for example.

Then, an opening 61a is formed in alignment with the opening 57a of the upper protective layer 61 in such a manner that a portion of the surface of the pad electrode 54a is exposed in the opening 57a. Thus, an FeRAM is completed.

As has been described above, according to the first variation, a reliable FeRAM that reliably prevents penetration of water/hydrogen into a ferroelectric capacitor structure 30 to maintain a high performance of the ferroelectric capacitor structure 30 can be implemented with a relatively simple configuration.

[Second Variation]

In a second variation, a protective metal film that surrounds a pad electrode 54a is formed in the FeRAM configuration disclosed in the first embodiment.

FIG. 9 shows schematic cross-sectional view illustrating main steps of a method for manufacturing an FeRAM according to the second variation.

As in the first embodiment, first a MOS transistor 20, a ferroelectric capacitor structure 30, first wirings 45, second wirings 54, and so on are formed through the steps shown in FIGS. 1A to 1D, 2A to 2D, 3A and 3B, and 4 (5A).

Figure 9A:
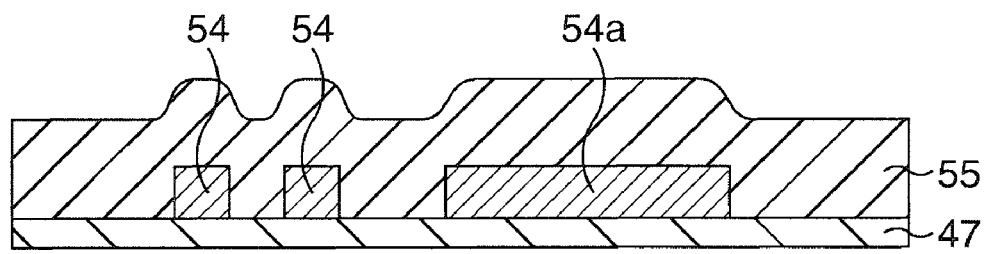
FIG. 9A is a schematic cross-sectional view illustrating a method for manufacturing an FeRAM according to a second variation of the first embodiment.

Then, a lower insulating film 55 is formed to cover the second wirings 54 as shown in FIG. 9A, as in FIG. 5B.

In particular, a lower insulating film 55 is formed to cover the second wirings 54. The lower insulating film 55 may be formed by depositing a silicone oxide film by CVD using TEOS, for example, to such a thickness that the second wirings 54 are embedded. The surface of the lower insulating film 55 reflects the shape of the second wirings 54 and is uneven accordingly.

Figure 9B:
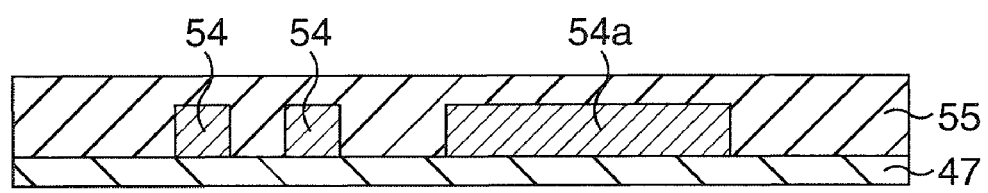
FIG. 9B is a schematic cross-sectional view illustrating a method for manufacturing an FeRAM according to the second variation of the first embodiment.

Then, the surface of the lower insulating film 55 is planarized as shown in FIG. 9B.

In particular, the surface of the lower insulating film 55 is planarized by CMP, for example. During the CMP, the surface of the lower insulating film 55 is polished to a predetermined thickness, for example approximately 100 nm, within limits that do not expose the surfaces of the second wirings 54.

As in the first embodiment, the lower insulating film 55 having an even surface may be formed as shown in FIG. 6, instead of using the steps shown in FIGS. 9A and 9B.

Figure 9C:
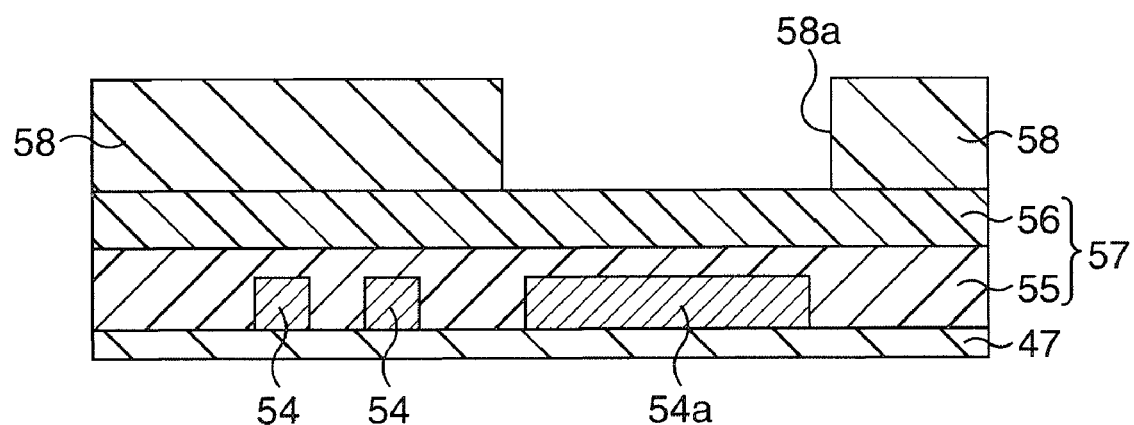
FIG. 9C is a schematic cross-sectional view illustrating a method for manufacturing an FeRAM according to the second variation of the first embodiment.

Then, an upper insulating film 56 and a resist pattern 58 are formed as shown in FIG. 9C.

In particular, first an upper insulating film 56 is formed on the lower insulating film 55. The upper insulating film 56 is formed by depositing a film of a material having a lower etching rate than that of the lower insulating film 55 and the capability of preventing penetration of hydrogen, for example a silicon nitride film, by CVD to a thickness of approximately 400 nm. The lower insulating film 55 and the upper insulating film 56 form a fourth interlayer insulating film 57.

Then a resist is applied to the entire surface of the upper insulating film 56 and then is patterned by lithography to form a resist pattern 58 having an opening 58a exposing a portion of the upper insulating film 56 above and in alignment with a pad electrode 54a.

Figure 9D:
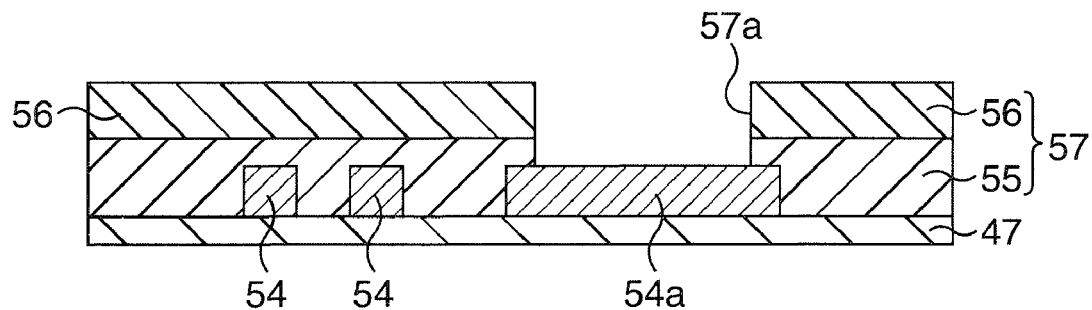
FIG. 9D is a schematic cross-sectional view illustrating a method for manufacturing an FeRAM according to the second variation of the first embodiment.

Then, the fourth interlayer insulating film 57 is formed as shown in FIG. 9D.

In particular, the resist pattern 58 is used as a mask and the pad electrode 54a is used as an etching stopper to etch the fourth interlayer insulating film 57, which is the upper insulating film 56 and an upper portion (the insulating film 55b in the example in FIG. 6C) of the lower insulating film 55 in this example, by dry etching. Here, an opening 57a exposing a portion of the surface of the pad electrode 54a is formed in the fourth interlayer insulating film 57 in accordance with the opening 58a of the resist pattern 58.

Then, the resist pattern 58 is removed by a method such as incineration.

Figure 9E:
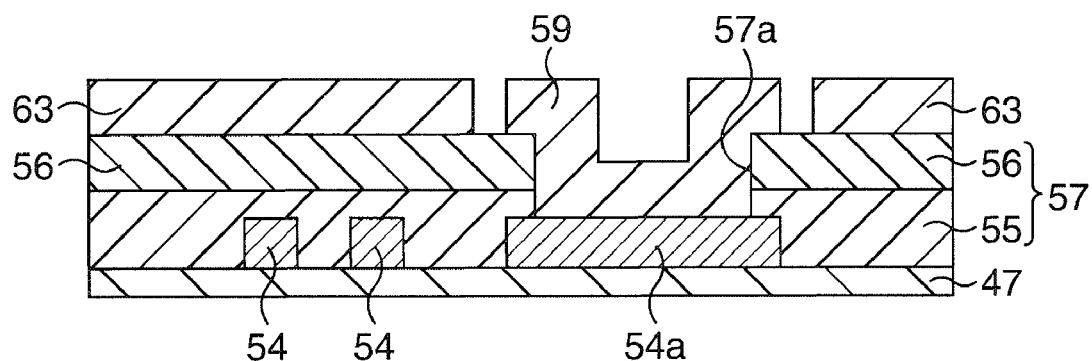
FIG. 9E is a schematic cross-sectional view illustrating a method for manufacturing an FeRAM according to the second variation of the first embodiment.

Then, protective metal films 59 and 63 are patterned at the same time as shown in FIG. 9E.

In particular, first a moisture-resistant metal, Al in this example, is deposited on the fourth interlayer insulating film 57 and inside the opening 57a by sputtering to a thickness of approximately 800 nm to form an Al film. The moisture-resistant metal may be an Al alloy such as Al—Cu, or Ti, TiN, TiON, or Cu, or a multilayered film of any of these, instead of Al.

Then, the Al film is etched by dry etching using a resist pattern (not shown) and using the upper insulating film 56 as an etching stopper. During the dry etching, a portion of the Al film on the upper insulating film 56 is removed according to the resist pattern to form an opening 63a. As a result of the etching, a protective metal film 59 that is electrically connected to the pad electrode 54a is formed on the pad electrode 54a and, at the same time, a protective metal film 63 that is electrically insulated from the protective metal film 59 (pad electrode 54a) and surrounds the pad electrode 54a is formed on the upper insulating film 56. Here, the two-layer structure consisting of the pad electrode 54a and the protective metal layer 59 forms a pad electrode for electrically connecting to an external element. Thus, the protective metal layer 59 in effect functions as a pad electrode.

Then, the resist pattern is removed by a method such as incineration.

Figure 10:
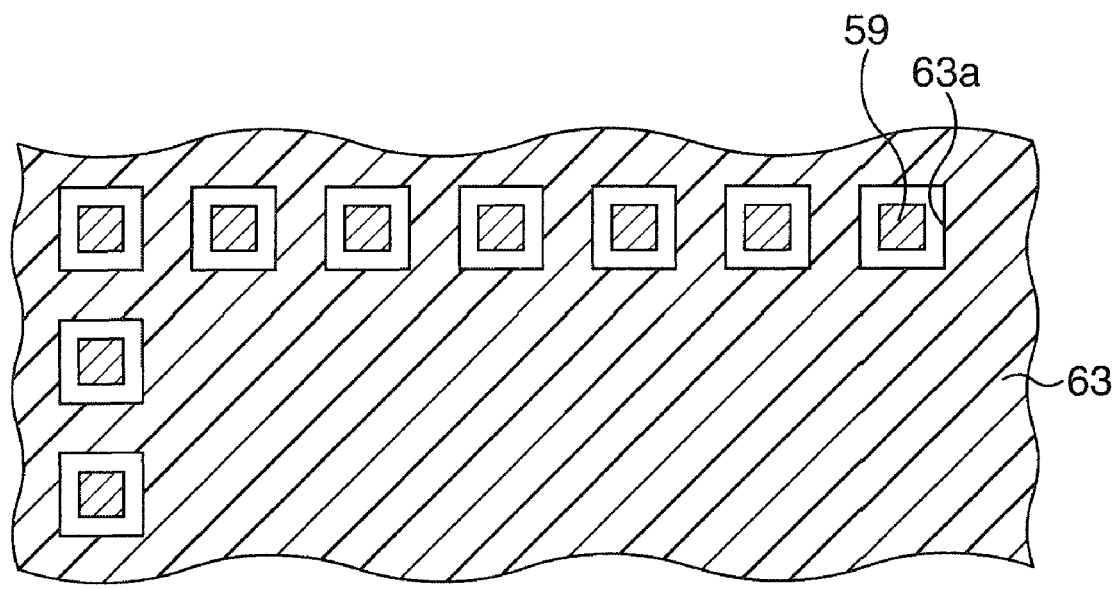
FIG. 10 is a schematic plan view showing a protective metal film according to the second variation of the first embodiment.

FIG. 10 shows a plan view of the protective metal films 59 and 63.

As shown, the protective metal film 59 covers the pad electrodes 54a and the protective metal film 63 covers the entire top surface of the silicon semiconductor substrate 10 except the portions where the pad electrodes 54a are formed. Because the areas in which the pad electrodes 54a are formed and areas surrounding the pad electrodes 54a where water/hydrogen is most likely to enter are covered with the moisture-resistant protective metal films 59 and 63, penetration of water/hydrogen into the inside can be efficiently prevented.

Because the surface of the lower insulating film 55 is planarized in the second variation, the upper insulating film 56 formed on the lower insulating film 55 has an excellent coverage and a uniform thickness. The protective metal films 59 and 63 formed on the upper insulating film 56 also have an excellent coverage, which may improve the resistance to damage during packaging, for example. Because the upper insulating film 56 and the protective metal films 59 and 63 are formed so that they have an excellent coverage in this way, the ability of the upper insulating film 56 and the protective metal films 59 and 63 to prevent penetration of water/hydrogen is maximized. With this configuration, property degradation of the ferroelectric capacitor structure 30 can be reliably prevented.

Figure 9F:
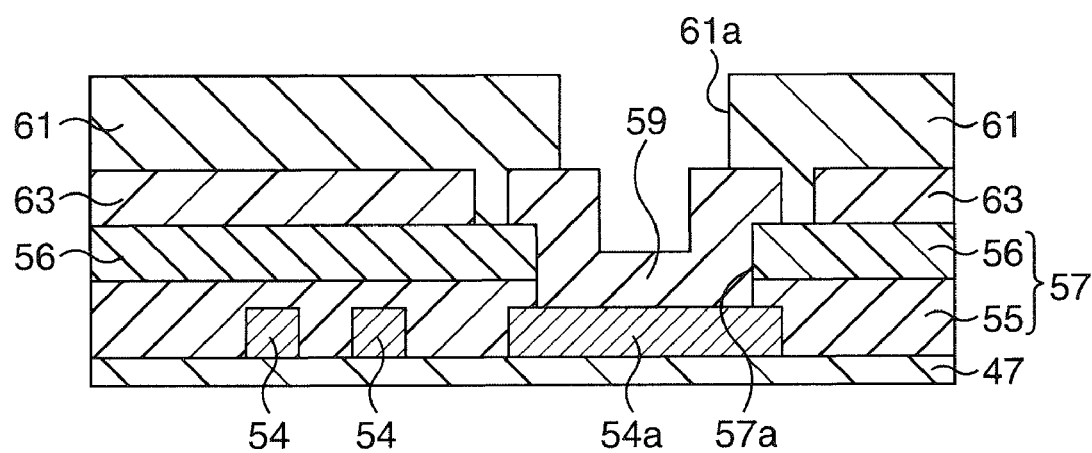
FIG. 9F is a schematic cross-sectional view illustrating a method for manufacturing an FeRAM according to the second variation of the first embodiment.

Then, an upper protecting layer 61 that covers the area surrounding the protective metal film 59 is formed as shown in FIG. 9F.

In particular, first an upper protecting layer 61 is formed on the protective metal film 63 to cover the protective metal film 59. The upper protecting layer 61 may be formed by depositing polyimide, for example.

Then, an opening 61a is formed in the upper protecting layer 61 to expose a portion of the surface of the protective metal film 59. Thus, an FeRAM is completed.

As has been described above, according to the second variation, a reliable FeRAM that reliably prevents penetration of water/hydrogen into a ferroelectric capacitor structure 30 to maintain a high performance of the ferroelectric capacitor structure 30 can be implemented with a relatively simple configuration.

[Third Variation]

A third variation differs from the FeRAM configuration disclosed in the first embodiment in the mode of formation of a protective metal film.

FIG. 11 shows schematic cross-sectional views illustrating main steps of a method for manufacturing an FeRAM according to the third variation.

As in the first embodiment, first a MOS transistor 20, a ferroelectric capacitor structure 30, first wirings 45, second wirings 54, and so on are formed through the steps shown in FIGS. 1A to 1D, 2A to 2D, 3A and 3B, and 4 (5A).

Figure 11A:
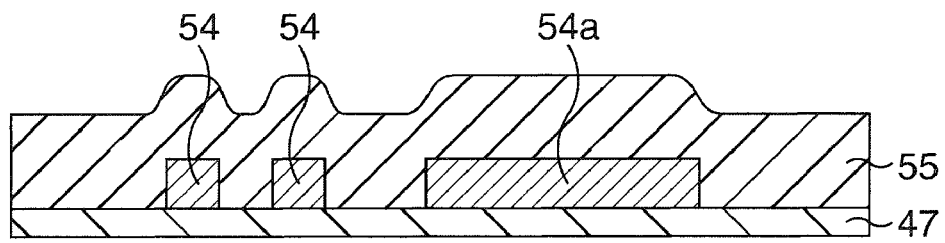
FIG. 11A is a schematic cross-sectional view illustrating a method for manufacturing an FeRAM according to a third variation of the first embodiment.

Then, a lower insulating film 55 is formed to cover second wirings 54 as shown in FIG. 11A, as in FIG. 5B.

In particular, a lower insulating film 55 is formed to cover the second wirings 54. The lower insulating film 55 may be formed by depositing a silicone oxide film by CVD using TEOS, for example, to such a thickness that the second wirings 54 are embedded. The surface of the lower insulating film 55 reflects the shape of the second wirings 54 and is uneven accordingly.

Figure 11B:
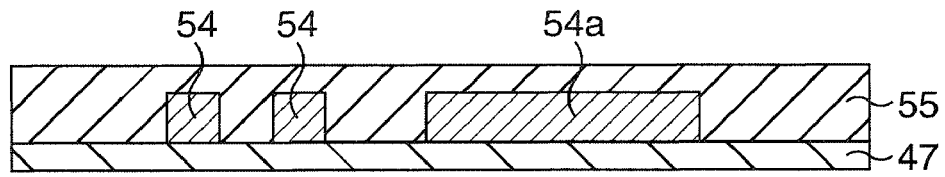
FIG. 11B is a schematic cross-sectional view illustrating a method for manufacturing an FeRAM according to the third variation of the first embodiment.

Then, the surface of the lower insulating film 55 is planarized as shown in FIG. 11B.

In particular, the surface of the lower insulating film 55 is planarized by CMP, for example. During the CMP, the surface of the lower insulating film 55 is polished to a predetermined thickness, for example approximately 100 nm, within limits that do not expose the surfaces of the second wirings 54.

As in the first embodiment, the lower insulating film 55 having an even surface may be formed as shown in FIG. 6, instead of using the steps shown in FIGS. 11A and 11B.

Figure 11C:
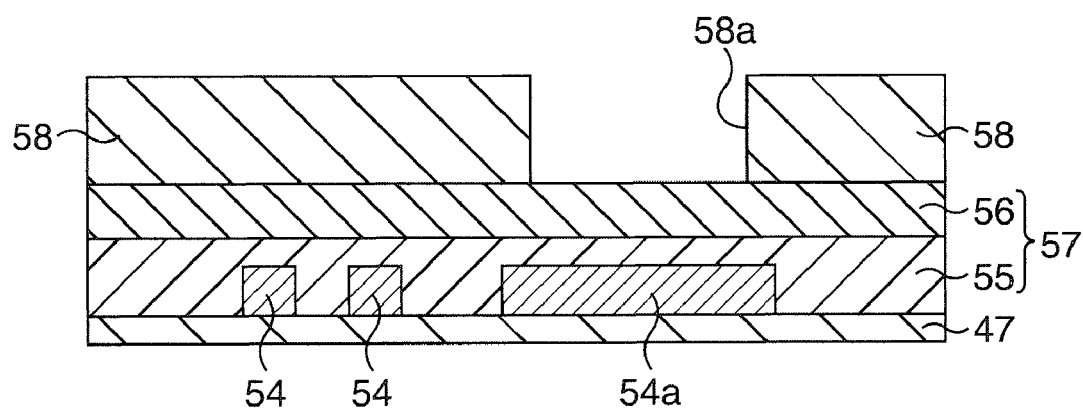
FIG. 11C is a schematic cross-sectional view illustrating a method for manufacturing an FeRAM according to the third variation of the first embodiment.

Then, an upper insulating film 56 and a resist pattern 58 are formed as shown in FIG. 11C.

In particular, first an upper insulating film 56 is formed on the lower insulating film 55. The upper insulating film 56 is formed by depositing a film of a material having a lower etching rate than that of the lower insulating film 55 and the capability of preventing penetration of hydrogen, for example a silicon nitride film, by CVD to a thickness of approximately 400 nm. The lower insulating film 55 and the upper insulating film 56 form a fourth interlayer insulating film 57.

Then a resist is applied to the entire surface of the upper insulating film 56 and then is patterned by lithography to form a resist pattern 58 having an opening 58a exposing a portion of the upper insulating film 56 above and in alignment with a pad electrode 54a.

Figure 11D:
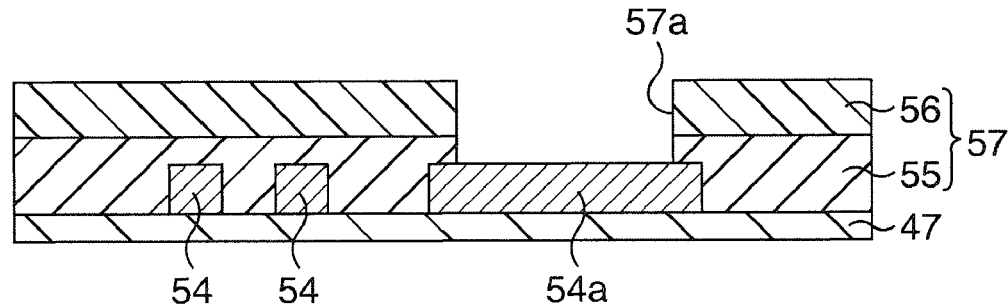
FIG. 11D is a schematic cross-sectional view illustrating a method for manufacturing an FeRAM according to the third variation of the first embodiment.

Then, the fourth interlayer insulating film 57 is worked as shown in FIG. 11D.

In particular, the resist pattern 58 is used as a mask and the pad electrode 54a is used as an etching stopper to etch the fourth interlayer insulating film 57, which is the upper insulating film 56 and an upper portion (the insulating film 55b in the example in FIG. 6C) of the lower insulating film 55 in this example, by dry etching. Here, an opening 57a exposing a portion of the surface of the pad electrode 54a is formed in the fourth interlayer insulating film 57 according to the opening 58a of the resist pattern.

Then, the resist pattern 58 is removed by a method such as incineration.

Figure 11E:
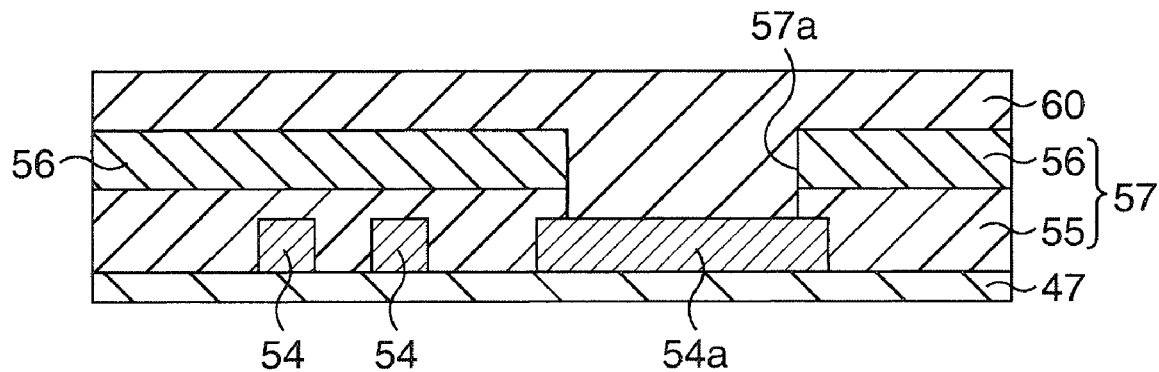
FIG. 11E is a schematic cross-sectional view illustrating a method for manufacturing an FeRAM according to the third variation of the first embodiment.

Then, an Al film 60 is formed as shown in FIG. 11E.

In particular, a moisture-resistant metal, Al in this example, is deposited on the fourth interlayer insulating film 57, including the inside of the opening 57a, by vapor deposition, for example, to form an Al film 60. The Al film 60 is formed thicker than the depth of the opening 57a, for example to a thickness of approximately 1 µm. The moisture-resistant metal may be an Al alloy such as Al—Cu, or Ti, TiN, TiON, or Cu, instead of Al.

Figure 11F:
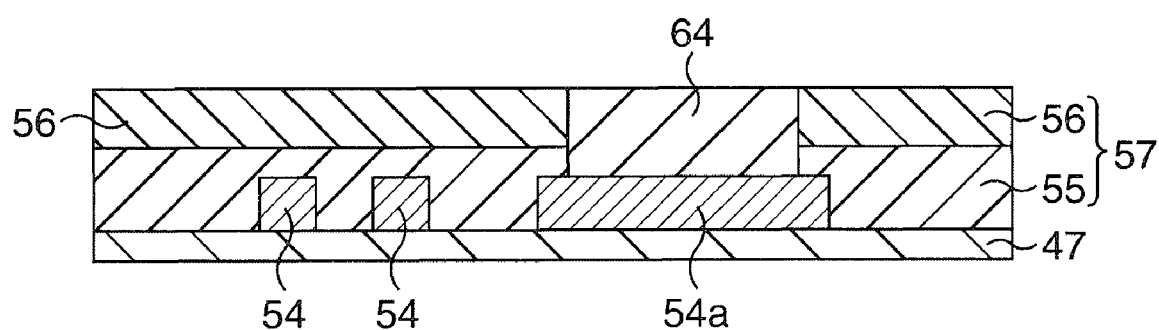
FIG. 11F is a schematic cross-sectional view illustrating a method for manufacturing an FeRAM according to the third variation of the first embodiment.

Then, the Al film 60 is worked to form a protective metal film 64 as shown in FIG. 11F.

In particular, the surface of the Al film 60 is polished by CMP, for example, using the upper insulating film 56 as a stopper to expose the surface of the upper insulating film 56. The Al film 60 remains only in the opening 57a and fills the opening 57a to form a protective metal film 64 on the pad electrode 54a that is electrically connected to the pad electrode 54. Here, the two-layer structure consisting of the pad electrode 54a and the protective metal layer 64 forms a pad electrode for electrically connecting to an external element. Thus, the protective metal layer 64 in effect functions as a pad electrode.

In the third variation, the surface of the lower insulating film 55 is planarized and CMP can be used when the protective metal film 64 is formed, as described above. The planarization is performed so that the protective metal film 64 and the upper insulating film 56 formed on the lower insulating film 55 form the same plane. Accordingly, both upper insulating film 56 and protective metal film 64 have an excellent coverage and even thicknesses. Consequently, the resistance of the protective metal film 64 to damage during packaging, for example, may be significantly improved. Because the upper insulating film 56 and the protective metal film 64 are formed so that they have an excellent coverage in this way, the ability of the upper insulating film 56 and the protective metal film 64 to prevent penetration of water/hydrogen is maximized. With this configuration, property degradation of the ferroelectric capacitor structure 30 can be reliably prevented.

Figure 11G:
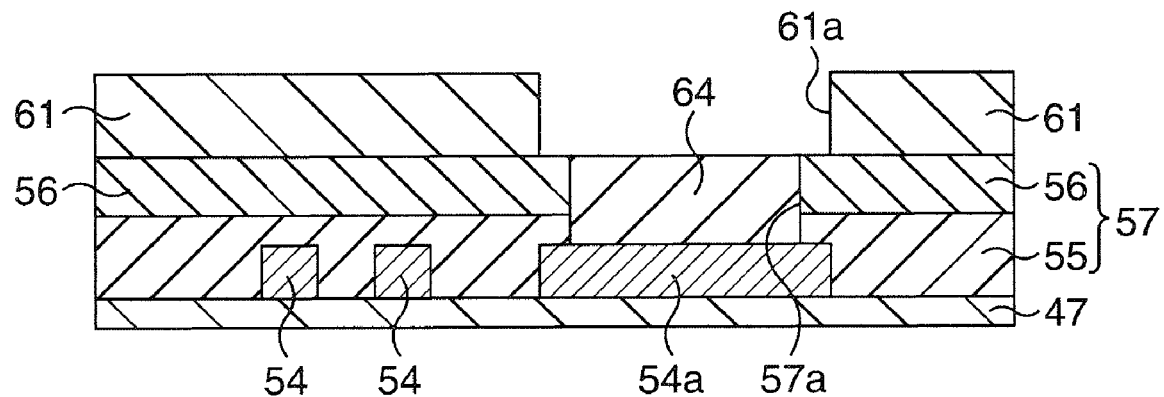
FIG. 11G is a schematic cross-sectional view illustrating a method for manufacturing an FeRAM according to the third variation of the first embodiment.

Then, an upper protecting layer 61 that covers the area surrounding the protective metal film 64 is formed as shown in FIG. 11G.

In particular, first an upper protecting layer 61 is formed on the upper insulating film 56 to cover the protective metal film 64. The upper protecting layer 61 may be formed by depositing polyimide, for example.

Then, an opening 61a is formed in the upper protecting layer 61 to expose a portion of the surface of the protective metal film 64. Thus, an FeRAM is completed.

As has been described above, according to the third variation, a reliable FeRAM that reliably prevents penetration of water/hydrogen into a ferroelectric capacitor structure 30 to maintain a high performance of the ferroelectric capacitor structure 30 can be implemented with a relatively simple configuration.

[Fourth Variation]

A fourth variation differs from the FeRAM configuration disclosed in the first embodiment in the mode of formation of a protective metal film.

FIG. 12 shows schematic cross-sectional views illustrating main steps of a method for manufacturing an FeRAM according to the fourth variation.

As in the first embodiment, first a MOS transistor 20, a ferroelectric capacitor structure 30, first wirings 45, second wirings 54, and so on are formed through the steps shown in FIGS. 1A to 1D, 2A to 2D, 3A and 3B, and 4 (5A).

Figure 12A:
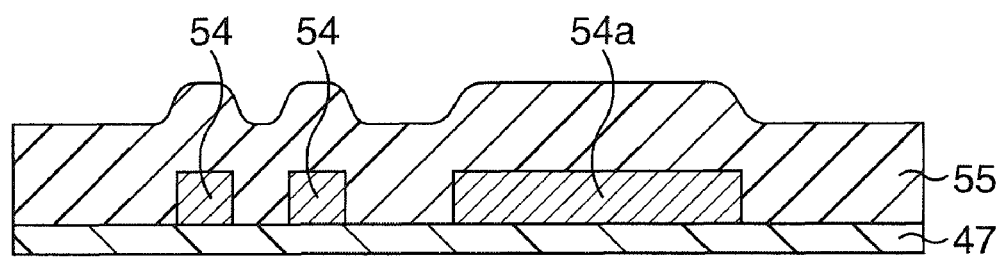
FIG. 12A is a schematic cross-sectional view illustrating a method for manufacturing an FeRAM according to a fourth variation of the first embodiment.

Then, a lower insulating film 55 is formed to cover second wirings 54 as shown in FIG. 12A, as in FIG. 5B.

In particular, a lower insulating film 55 is formed to cover the second wirings 54. The lower insulating film 55 may be formed by depositing a silicone oxide film by CVD using TEOS, for example, to such a thickness that the second wirings 54 are embedded. The surface of the lower insulating film 55 reflects the shape of the second wirings 54 and is uneven accordingly.

Figure 12B:
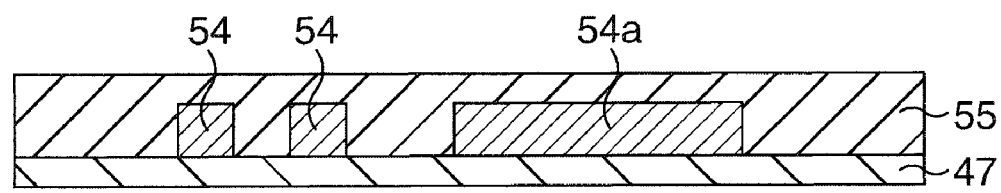
FIG. 12B is a schematic cross-sectional view illustrating a method for manufacturing an FeRAM according to the fourth variation of the first embodiment.

Then, the surface of the lower insulating film 55 is planarized as shown in FIG. 12B.

In particular, the surface of the lower insulating film 55 is planarized by CMP, for example. During the CMP, the surface of the lower insulating film 55 is polished to a predetermined thickness, for example approximately 100 nm, within limits that do not expose the surfaces of the second wirings 54.

As in the first embodiment, the lower insulating film 55 having an even surface may be formed as shown in FIG. 6, instead of using the steps shown in FIGS. 12A and 12B.

Figure 12C:
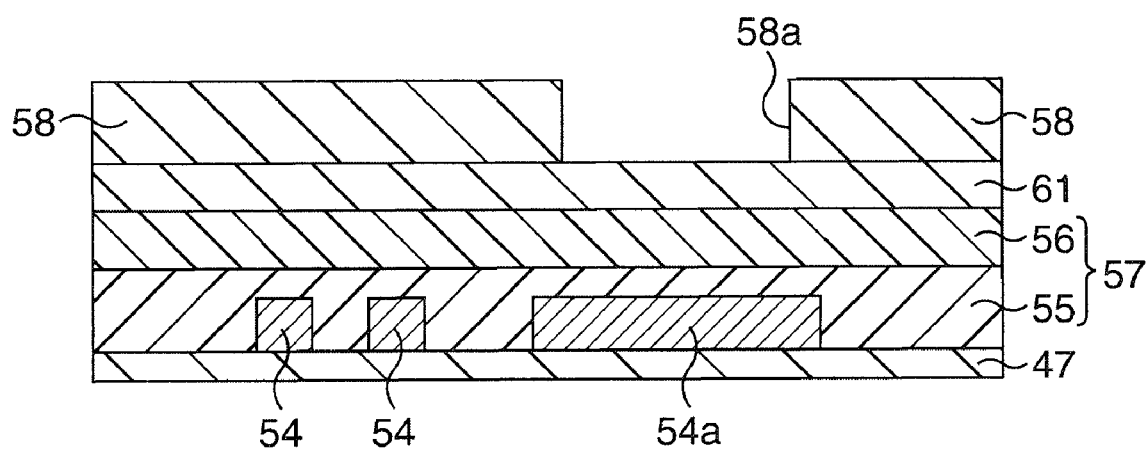
FIG. 12C is a schematic cross-sectional view illustrating a method for manufacturing an FeRAM according to the fourth variation of the first embodiment.

Then, an upper insulating film 56, an upper protecting layer 61, and a resist pattern 58 are formed as shown in FIG. 12C.

In particular, first an upper insulating film 56 is formed on the lower insulating film 55. The upper insulating film 56 is formed by depositing a film of a material having a lower etching rate than that of the lower insulating film 55 and the capability of preventing penetration of hydrogen, for example a silicon nitride film, by CVD to a thickness of approximately 400 nm. The lower insulating film 55 and the upper insulating film 56 form a fourth interlayer insulating film 57.

Then, an upper insulating film 61 is formed on the upper insulating film 56. The upper protecting layer 61 may be formed by depositing polyimide, for example.

Then a resist is applied to the entire surface of the upper protecting layer 61 and then is patterned by lithography to form a resist pattern 58 having an opening 58a exposing a portion of the upper protecting layer 61 above and in alignment with a pad electrode 54a.

Figure 12D:
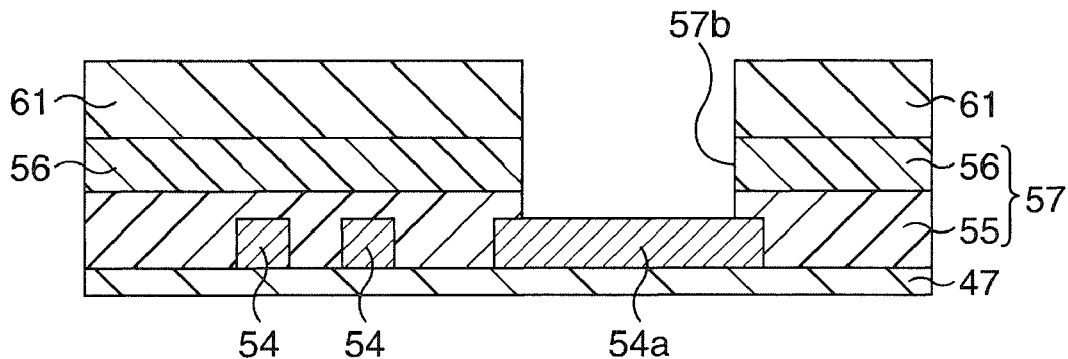
FIG. 12D is a schematic cross-sectional view illustrating a method for manufacturing an FeRAM according to the fourth variation of the first embodiment.

Then, the upper protecting layer 61 and the fourth interlayer insulating film 57 is worked as shown in FIG. 12D.

In particular, the resist pattern 58 is used as a mask and the pad electrode 54a is used as an etching stopper to etch the upper protecting layer 61 and the fourth interlayer insulating film 57 by dry etching. Here, in the fourth interlayer insulating film 57, the upper insulating film 56 and an upper portion (the insulating film 55b in the example in FIG. 6C) of the lower insulating film 55 are etched. An opening 57b exposing a portion of the surface of the pad electrode 54a is formed in the upper protecting layer 61 and the fourth interlayer insulating film 57 according to the opening 58a of the resist pattern 58.

Then, the resist pattern 58 is removed by a method such as incineration.

Figure 12E:
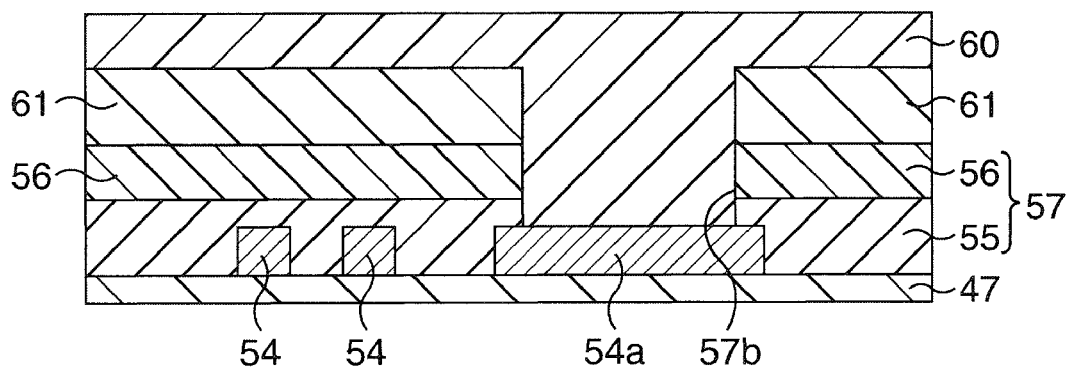
FIG. 12E is a schematic cross-sectional view illustrating a method for manufacturing an FeRAM according to the fourth variation of the first embodiment.

Then, an Al film 60 is formed as shown in FIG. 12E.

In particular, a moisture-resistant metal, Al in this example, is deposited on upper protecting film 61, including the inside of the opening 57b, by vapor deposition to form an Al film 60. The Al film 60 is formed thicker than the depth of the opening 57b, for example to a thickness of approximately 100 μm. The moisture-resistant metal may be an Al alloy such as Al—Cu, or Ti, TiN, TiON, or Cu, instead of Al.

Figure 12F:
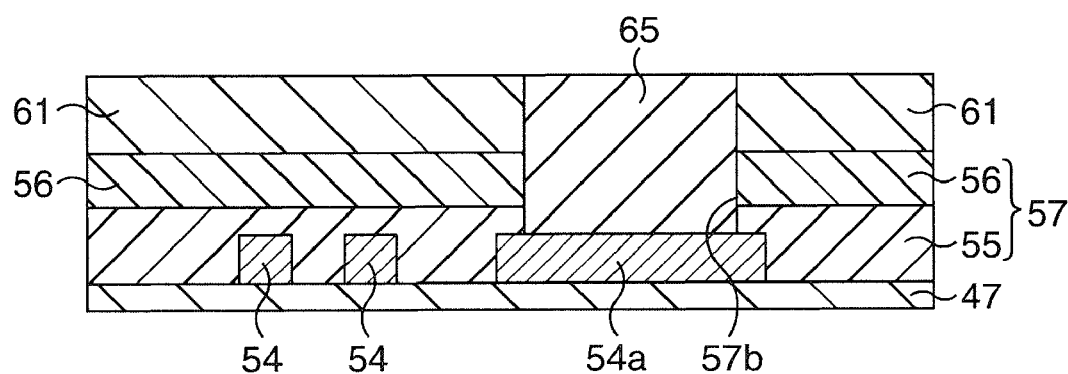
FIG. 12F is a schematic cross-sectional view illustrating a method for manufacturing an FeRAM according to the fourth variation of the first embodiment.

Then, the Al film 60 is worked to form a protective metal film 65 as shown in FIG. 12F.

In particular, the surface of the Al film 60 is polished by CMP, for example, using the upper protecting layer 61 as a stopper to expose the surface of the upper protecting layer 61. The Al film 60 remains only in the opening 57b and fills the opening 57b to form a protective metal film 65 on the pad electrode 54a that is electrically connected to the pad electrode 54a. Here, the two-layer structure consisting of the pad electrode 54a and the protective metal film 65 forms a pad electrode for electrically connecting to an external element. Thus, the protective metal film 65 in effect functions as a pad electrode.

Thus, an FeRAM is completed.

In the fourth variation, the surface of the lower insulating film 55 is planarized and CMP can be used when the protective metal film 65 is formed, as described above. The planarization is performed so that the upper protecting layer 61 formed on the upper insulating film 56 on the lower insulating film 55 is flush with the protective metal film 65. Accordingly, the upper insulating film 56, the upper protecting layer 61, and the protective metal film 65 have an excellent coverage and are formed to even thicknesses. Consequently, the resistance of the protective metal film 65 to damage during packaging, for example, may be significantly improved. Because the upper insulating film 56, the upper protecting layer 61 and the protective metal film 65 are formed so that they have an excellent coverage in this way, the ability of the upper insulating film 56, and the protective metal film 65 to prevent penetration of water/hydrogen is maximized. With this configuration, property degradation of the ferroelectric capacitor structure 30 can be reliably prevented.

During the process for manufacturing the FeRAM, a probe must be brought in contact with pad electrodes (the protective metal film 65 in the example) in order to inspect the pad electrodes to make sure that they properly function (probing). The probing can make a slight contact mark on the surface of the pad electrodes such as a scratch. In order to ensure an adequate electrical conductivity of the pad electrodes and connectivity with a wiring even if such a contact mark is left, the pad electrodes must be formed to a sufficient thickness.

In the fourth variation, the protective metal film 65 is formed to a thickness equal to the depth of the opening 57b formed to the depth equivalent to the total thickness of the upper portion of the lower insulating film 55, the upper insulating film 56, and the upper protecting layer 61. Because the protective metal film 65 is thus formed thick in a positive manner, the electrical conductivity of the protective metal film 65 and the connectivity of the metal film 65 with a wiring can be adequately ensured even if a contact mark of probing is left on the surface of the protective metal film 65.

As has been described above, according to the fourth variation, a reliable FeRAM that reliably prevents penetration of water/hydrogen into a ferroelectric capacitor structure 30 to maintain a high performance of the ferroelectric capacitor structure 30 can be implemented with a relatively simple configuration.

[Fifth Variation]

A fifth variation differs from the FeRAM configuration disclosed in the first embodiment in the mode of formation of a protective metal film.

FIG. 13 shows schematic cross-sectional views illustrating main steps of a method for manufacturing an FeRAM according to the fifth variation.

As in the first embodiment, first a MOS transistor 20, a ferroelectric capacitor structure 30, first wirings 45, second wirings 54, and so on are formed through the steps shown in FIGS. 1A to 1D, 2A to 2D, 3A and 3B, and 4 (5A).

Figure 13A:
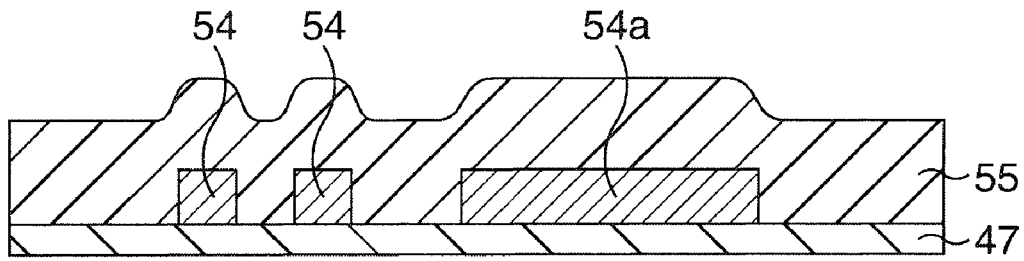
FIG. 13A is a schematic cross-sectional view illustrating a method for manufacturing an FeRAM according to a fifth variation of the first embodiment.

Then, a lower insulating film 55 is formed to cover second wirings 54 as shown in FIG. 13A, as in FIG. 5B.

In particular, a lower insulating film 55 is formed to cover the second wirings 54. The lower insulating film 55 may be formed by depositing a silicone oxide film by CVD using TEOS, for example, to such a thickness that the second wirings 54 are embedded. The surface of the lower insulating film 55 reflects the shape of the second wirings 54 and is uneven accordingly.

Figure 13B:
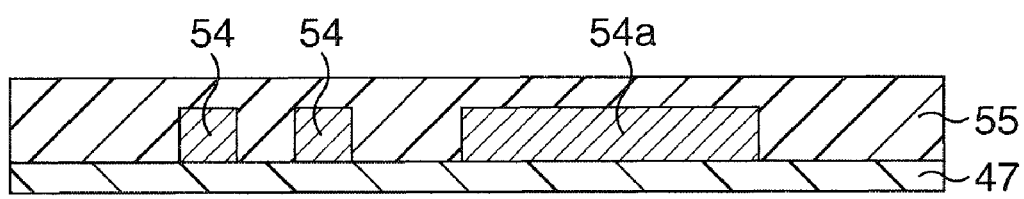
FIG. 13B is a schematic cross-sectional view illustrating a method for manufacturing an FeRAM according to the fifth variation of the first embodiment.

Then, the surface of the lower insulating film 55 is planarized as shown in FIG. 13B.

In particular, the surface of the lower insulating film 55 is planarized by CVM, for example. During the CMP, the surface of the lower insulating film 55 is polished to a predetermined thickness, for example approximately 100 nm, within limits that do not expose the surfaces of the second wirings 54.

As in the first embodiment, the lower insulating film 55 having an even surface may be formed as shown in FIG. 6, instead of using the steps shown in FIGS. 13A and 13B.

Figure 13C:
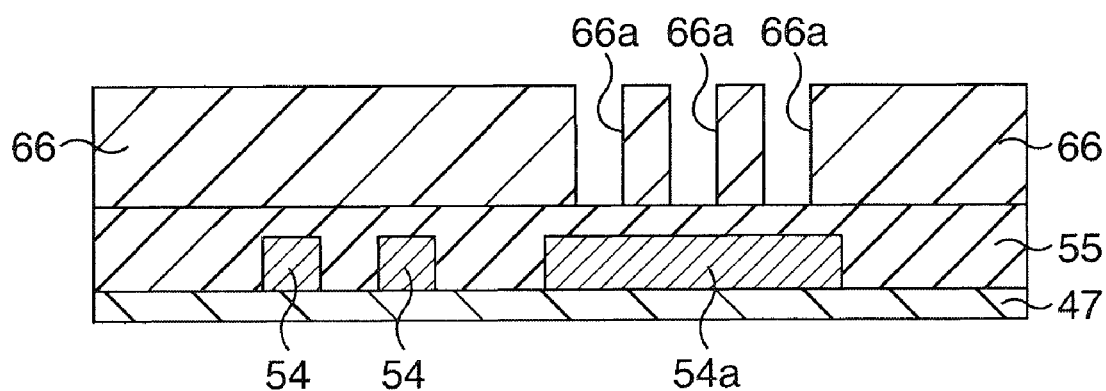
FIG. 13C is a schematic cross-sectional view illustrating a method for manufacturing an FeRAM according to the fifth variation of the first embodiment.

Then, a resist pattern 66 is formed as shown in FIG. 13C.

In particular, a resist is applied to the entire surface of the lower insulating film 55 and then is patterned by lithography to form a resist pattern 66 having multiple small openings 66a in locations in the lower insulating film 55 above and in alignment with a pad electrode 54a.

Figure 13D:
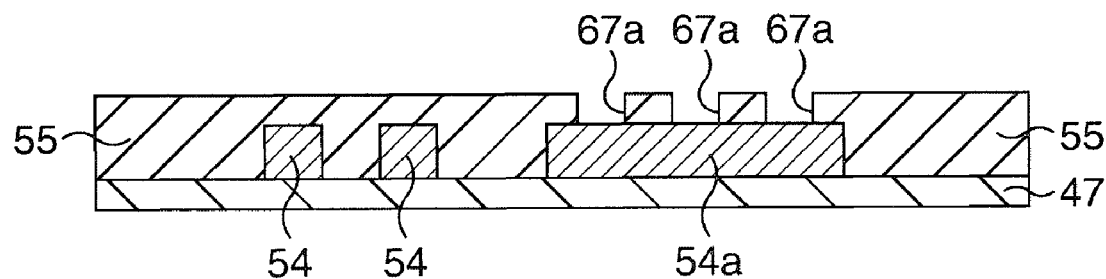
FIG. 13D is a schematic cross-sectional view illustrating a method for manufacturing an FeRAM according to the fifth variation of the first embodiment.

Then, the lower insulating film 55 is worked as shown in FIG. 13D.

In particular, the resist pattern 66 is used as a mask and the pad electrode 54a is used as an etching stopper to etch an upper portion (the insulating film 55b in the example in FIG. 6C) of the lower insulating film 55 by dry etching. Here, multiple small first openings 67a are formed in the lower insulating film 55 that expose portions of the surface of the pad electrode 54a according to the openings 66a of the resist pattern 66.

Then, the resist pattern 66 is removed by a method such as incineration.

Figure 13E:
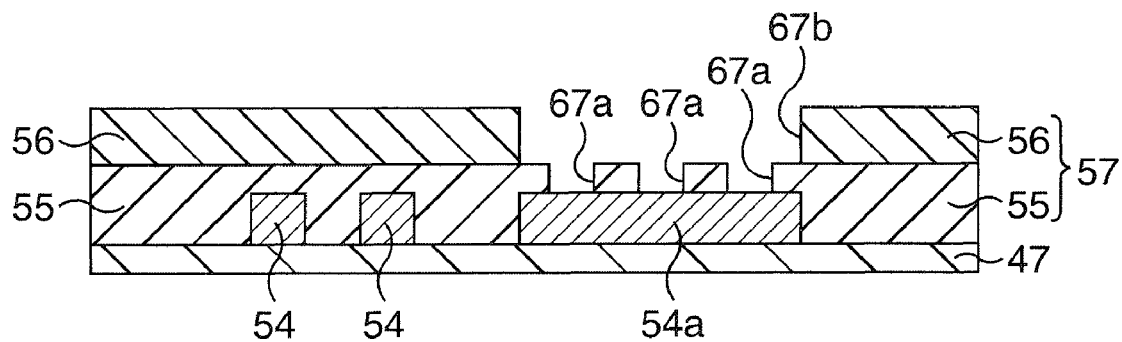
FIG. 13E is a schematic cross-sectional view illustrating a method for manufacturing an FeRAM according to the fifth variation of the first embodiment.

Then, an upper insulating film 56 having a second opening 67b is formed as shown in FIG. 13E.

In particular, first an upper insulating film 56 is formed on the lower insulating film 55. The upper insulating film 56 is formed by depositing a film of a material having a lower etching rate than that of the lower insulating film 55 and the capability of preventing penetration of hydrogen, for example a silicon nitride film, by CVD to a thickness of approximately 400 nm. The lower insulating film 55 and the upper insulating film 56 form a fourth interlayer insulating film 57.

Then, the upper insulating film 56 is etched by using a resist pattern (not shown) by dry etching to form a second opening 67b in alignment and integral with the first openings 67a.

Then the resist pattern is removed by a method such as incineration.

Figure 13F:
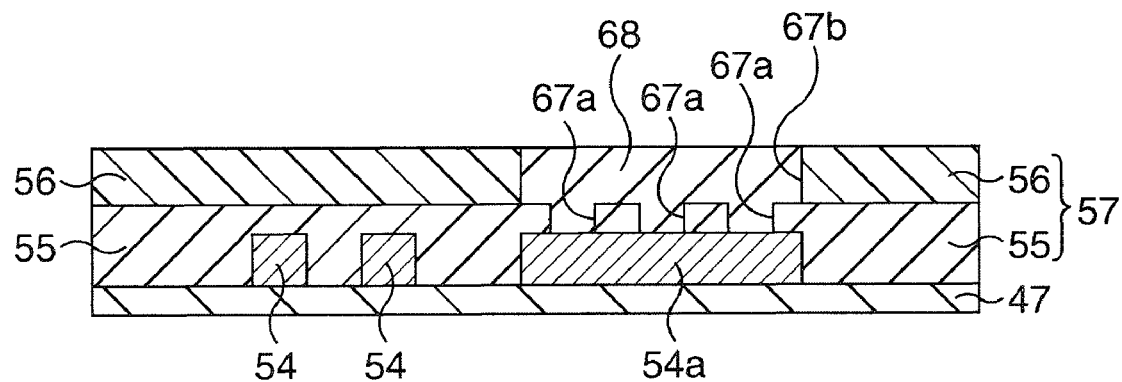
FIG. 13F is a schematic cross-sectional view illustrating a method for manufacturing an FeRAM according to the fifth variation of the first embodiment.

Then, a protective metal film 68 is formed as shown in FIG. 13F.

In the fifth variation, the protective metal film 68 is formed by using a method such as the so-called damascene method including the process steps for forming the first and second openings 67a and 67b described above.

In particular, first tantalum (Ta) is deposited by MOCVD, for example, on the walls of the first and second openings 67a and 67b integrated into a trench, to form a barrier film (not shown) and a plating seed film (not shown) on the barrier film. Then, the first and second openings 67a and 67b are filled with a moisture-resistant metal, Cu (or a Cu alloy or the like) in this example, by plating. Then, the superficial layer of Cu (and the plating seed film) is removed by CMP using the upper insulating film 56 as a stopper, and the first and second openings 67a and 67b are filled with Cu to form a protective metal film 68 on the pad electrode 54a that is electrically connected to the pad electrode 54a. Here, the two-layer structure consisting of the pad electrode 54a and the protective metal film 68 forms a pad electrode for electrically connecting to an external element. Thus, the protective metal film 68 in effect functions as a pad electrode.

In the fifth variation, the surface of the lower insulating film 55 is planarized and the damascene method can be used when the protective metal film 68 is formed, as described above. The planarization is performed so that the protective metal film 68 is flush with the upper insulating film 56 formed on the lower insulating film 55. Accordingly, the upper insulating film 56 and the protective metal film 68 have an excellent coverage and are formed to even thicknesses. Consequently, the resistance of the protective metal film 68 to damage during packaging, for example, may be significantly improved. Because the upper insulating film 56 and the protective metal film 68 are formed so that they have an excellent coverage in this way, the ability of the upper insulating film 56 and the protective metal film 68 to prevent penetration of water/hydrogen is maximized. With this configuration, property degradation of the ferroelectric capacitor structure 30 can be reliably prevented.

Furthermore, the protective metal film 68 in the fifth variation is connected with the pad electrode 54a through Cu in the first openings 67a formed in the upper portion (the insulating film 55b in the example in FIG. 6C) of the lower insulating film 55. Because the protective metal film 68 is formed at a distance from the pad electrode 54a in a positive manner, a contact mark is made on the protective metal film 68 by probing during an inspection of the functionality of the pad electrode cannot affect Cu in the first openings 67a. Therefore, adequate electrical conductivity of the pad electrode 54a and the protective metal film 68 as a pad electrode and connectivity with a wiring can be ensured.

Figure 13G:
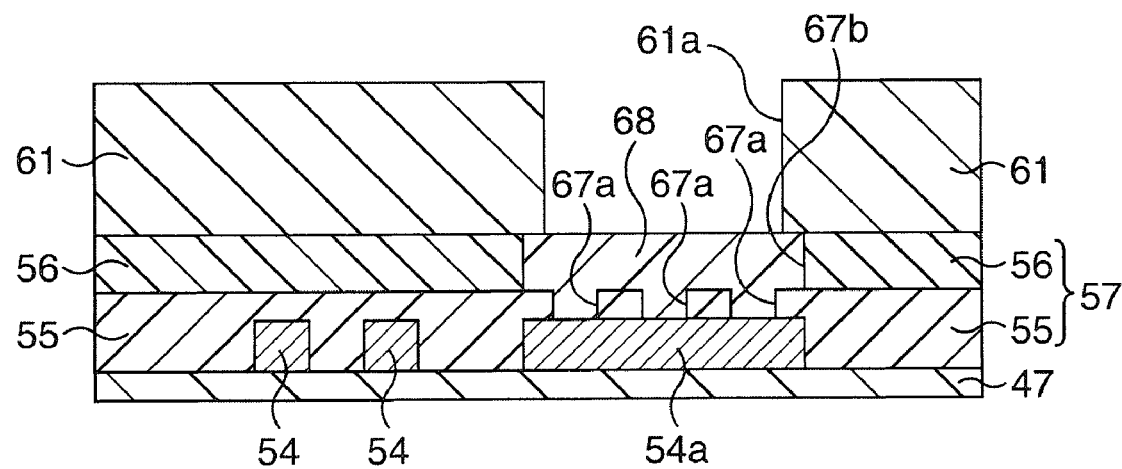
FIG. 13G is a schematic cross-sectional view illustrating a method for manufacturing an FeRAM according to the fifth variation of the first embodiment.

Then, an upper protecting layer 61 that covers the area surrounding the protective metal film 68 is formed as shown in FIG. 13G.

In particular, first an upper protecting layer 61 is formed on the upper insulating film 56 to cover the protective metal film 65. The upper protective layer 61 may be formed by depositing polyimide, for example.

Then an opening 61a is formed in the upper protecting layer 61 to expose the surface of the protective metal film 68. This completes the FeRAM.

As has been described above, according to the fifth variation, a reliable FeRAM that reliably prevents penetration of water/hydrogen into a ferroelectric capacitor structure 30 to maintain a high performance of the ferroelectric capacitor structure 30 can be implemented with a relatively simple configuration.

[Sixth Variation]

A sixth variation differs from the FeRAM configuration disclosed in the first embodiment in the mode of formation of a protective metal film.

FIG. 14 shows schematic cross-sectional views illustrating main steps of a method for manufacturing an FeRAM according to the first variation.

As in the first embodiment, first a MOS transistor 20, a ferroelectric capacitor structure 30, first wirings 45, second wirings 54, and so on are formed through the steps shown in FIGS. 1A to 1D, 2A to 2D, 3A and 3B, and 4 (5A).

Figure 14A:
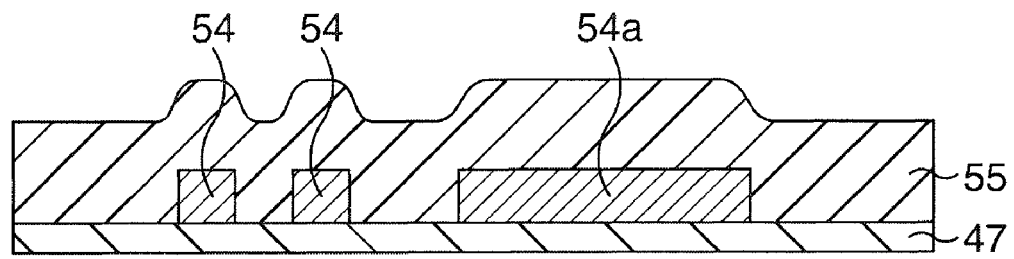
FIG. 14A is a schematic cross-sectional view illustrating a method for manufacturing an FeRAM according to a sixth variation of the first embodiment.

Then, a lower insulating film 55 is formed to cover the second wirings 54 as shown in FIG. 14A, as in FIG. 5B.

In particular, a lower insulating film 55 is formed to cover the second wirings 54. The lower insulating film 55 may be formed by depositing a silicone oxide film by CVD using TEOS, for example, to such a thickness that the second wirings 54 are embedded. The surface of the lower insulating film 55 reflects the shape of the second wirings 54 and is uneven accordingly.

Figure 14B:
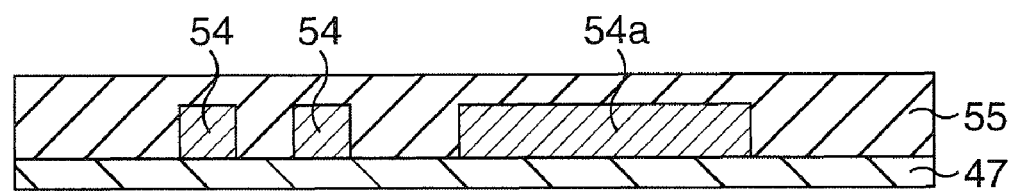
FIG. 14B is a schematic cross-sectional view illustrating a method for manufacturing an FeRAM according to the sixth variation of the first embodiment.

Then, the surface of the lower insulating film 55 is planarized as shown in FIG. 14B.

In particular, the surface of the lower insulating film 55 is planarized by CMP, for example. During the CMP, the surface of the lower insulating film 55 is polished to a predetermined thickness, for example approximately 100 nm, within limits that do not expose the surfaces of the second wirings 54.

As in the first embodiment, the lower insulating film 55 having an even surface may be formed as shown in FIG. 6, instead of using the steps shown in FIGS. 14A and 14B.

Figure 14C:
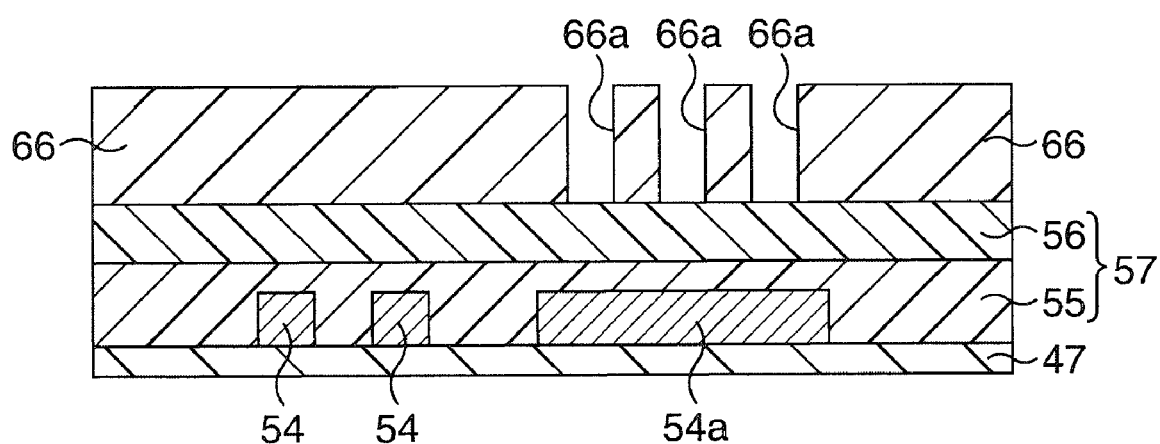
FIG. 14C is a schematic cross-sectional view illustrating a method for manufacturing an FeRAM according to the sixth variation of the first embodiment.

Then, an upper insulating film 56 and a resist pattern 66 are formed as shown in FIG. 14C.

In particular, first an upper insulating film 56 is formed on the lower insulating film 55. The upper insulating film 56 is formed by depositing a film of a material having a lower etching rate than that of the lower insulating film 55 and the capability of preventing penetration of hydrogen, for example a silicon nitride film, by CVD to a thickness of approximately 400 nm. The lower insulating film 55 and the upper insulating film 56 form a fourth interlayer insulating film 57.

Then, a resist is applied to the entire surface of the upper insulating film 56 and is patterned by lithography to form a resist pattern 66 having multiple small openings 66a in locations in the upper insulating film 56 above and in alignment with a pad electrode 54a.

Figure 14D:
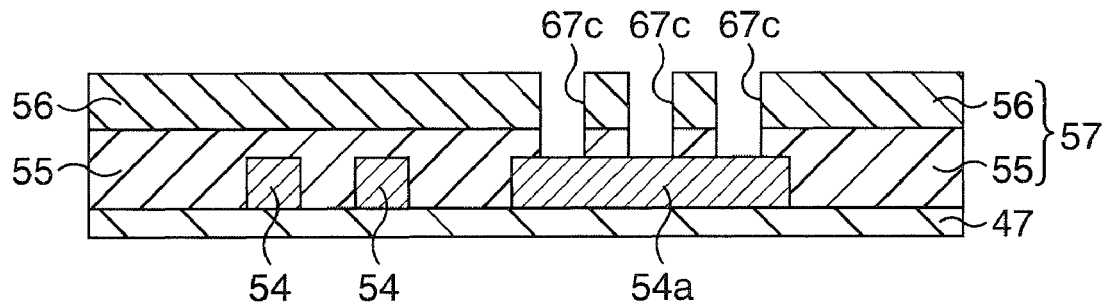
FIG. 14D is a schematic cross-sectional view illustrating a method for manufacturing an FeRAM according to the sixth variation of the first embodiment.

Then, the fourth interlayer insulating film 57 is worked as shown in FIG. 14D.

In particular, the resist pattern 66 is used as a mask and the pad electrode 54a is used as an etching stopper to etch the fourth interlayer insulating film 57, which is the upper insulating film 56 and an upper portion (the insulating film 55b in the example in FIG. 6C) of the lower insulating film 55 in this example, by dry etching. Here, multiple small first openings 67a are formed in the fourth interlayer insulating film 57 that expose portions of the surface of the pad electrode 54a according to the openings 66a of the resist pattern 66.

Then the resist pattern 66 is removed by a method such as incineration.

Figure 14E:
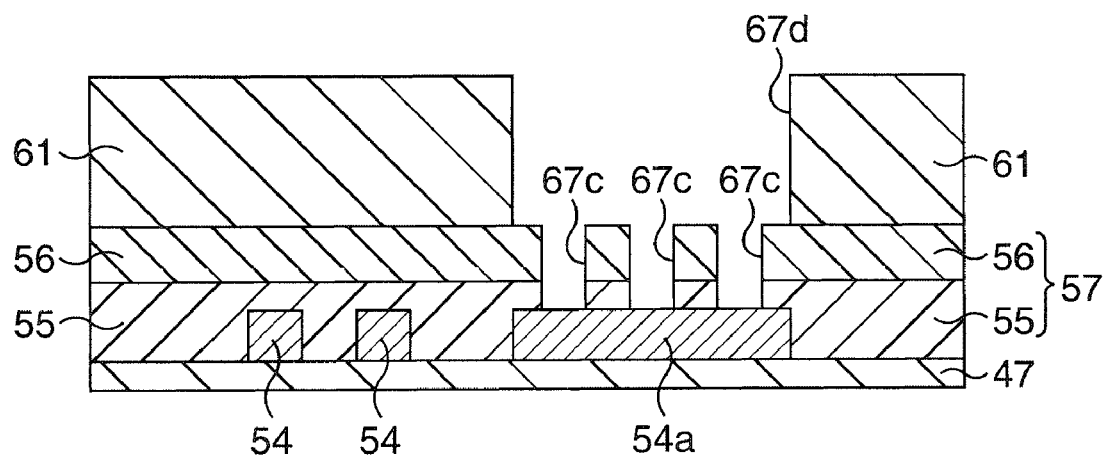
FIG. 14E is a schematic cross-sectional view illustrating a method for manufacturing an FeRAM according to the sixth variation of the first embodiment.

Then, an upper protecting layer 61 is formed that covers areas surrounding the multiple first openings 67c as shown in FIG. 14E.

In particular, first an upper protecting layer 61 is formed on the entire surface. The upper protecting layer 61 may be formed by depositing polyimide, for example.

Then, an opening is formed in the upper protecting layer 61 to expose the locations where the first openings 67c are formed. The opening is a second opening 67d in alignment and integral with the first openings 67c.

Figure 14F:
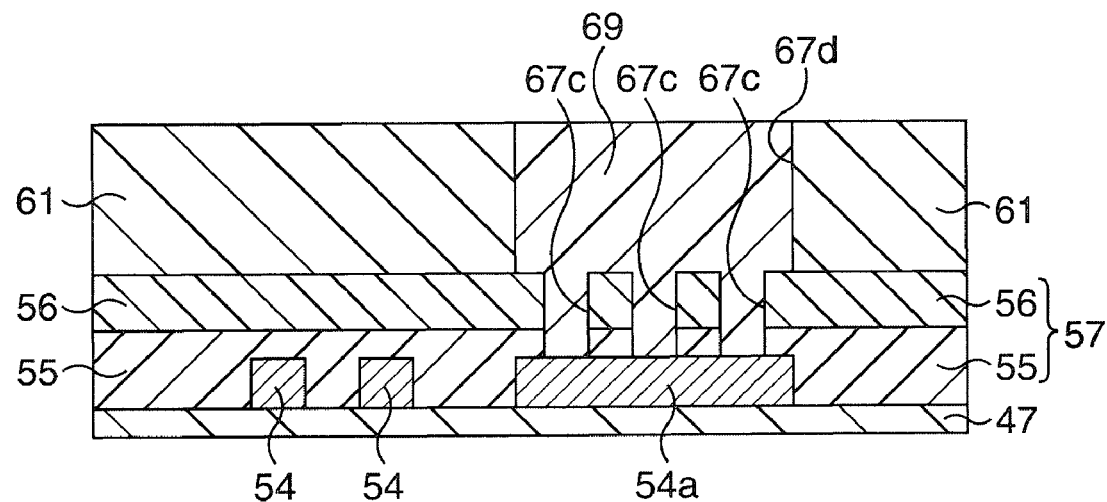
FIG. 14F is a schematic cross-sectional view illustrating a method for manufacturing an FeRAM according to the sixth variation of the first embodiment.

Then, a protective metal film 69 is formed as shown in FIG. 14F.

In the sixth variation, a so-called damascene method (dual-damascene method in this example) including the steps of forming the first and second openings 67c and 67d described above is used to form the protective metal layer 69. With this, an FeRAM is completed.

In particular, first tantalum (Ta) is deposited by MOCVD, for example, on the walls of the first and second openings 67c and 67d integrated into a trench to form a barrier film (not shown) and a plating seed film (not shown) is formed on the barrier film. Then, the first and second openings 67c and 67d are filled with a moisture-resistant metal, Cu (or a Cu alloy or the like) in this example, by plating. Then, the superficial layer of Cu (and the plating seed film) is removed by CMP using the upper protecting layer 61 as a stopper, and the first and second openings 67c and 67d are filled with Cu to form a protective metal film 69 on the pad electrode 54a that is electrically connected with the pad electrode 54a. Here, the two-layer structure consisting of the pad electrode 54a and the protective metal film 69 forms a pad electrode for electrically connecting to an external element. Thus, the protective metal film 69 in effect functions as a pad electrode.

Furthermore, the protective metal film 69 in the sixth variation is formed to the thickness equal to the depth of the opening 67d formed to a thickness equivalent to the thickness of the thick (for example approximately 100 μm) upper protecting layer 61 and is connected to the pad electrode 54a through Cu in the first openings 67c formed in the upper insulating film 56 and an upper portion (the insulating film 55b in the example in FIG. 6C) of the lower insulating film 55.

Because the protective metal film 69 is formed at a distance from the pad electrode 54*a* in a positive manner, the electrical conductivity of the pad electrode 54*a* and the protective metal film 69 as a pad electrode and connectivity with a wiring can be adequately ensured even if a contact mark is made on the surface of the protective metal film 69 by probing during an inspection of the functionality of the pad electrode.

As has been described above, according to the sixth variation, a reliable FeRAM that reliably prevents penetration of water/hydrogen into a ferroelectric capacitor structure 30 to maintain a high performance of the ferroelectric capacitor structure 30 can be implemented with a relatively simple configuration.

[Seventh Variation]

A seventh variation differs from the FeRAM configuration disclosed in the second variation of the first embodiment in the mode of formation of an upper insulating film 56.

FIG. 15 shows schematic cross-sectional views illustrating main steps of a method for manufacturing an FeRAM according to the seventh variation.

As in the first embodiment, first a MOS transistor 20, a ferroelectric capacitor structure 30, first wirings 45, second wirings 54, and so on are formed through the steps shown in FIGS. 1A to 1D, 2A to 2D, 3A and 3B, and 4 (5A).

Figure 15A:
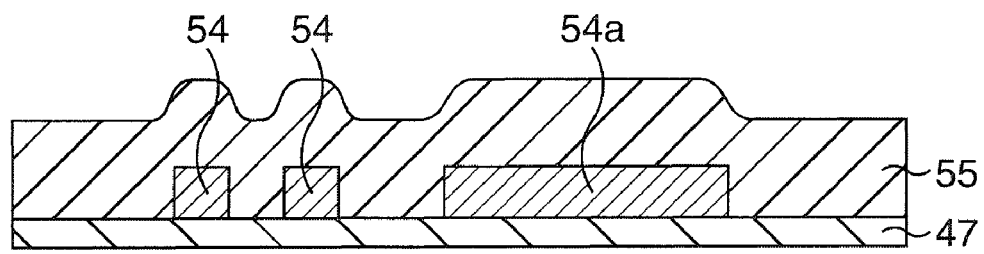
FIG. 15A is a schematic cross-sectional view illustrating a method for manufacturing an FeRAM according to a seventh variation of the first embodiment.

Then, a lower insulating film 55 is formed to cover second wirings 54 as shown in FIG. 15A, as in FIG. 5B.

In particular, a lower insulating film 55 is formed to cover the second wirings 54. The lower insulating film 55 may be formed by depositing a silicone oxide film by CVD using TEOS, for example, to such a thickness that the second wirings 54 are embedded. The surface of the lower insulating film 55 reflects the shape of the second wirings 54 and is uneven accordingly.

Figure 15B:
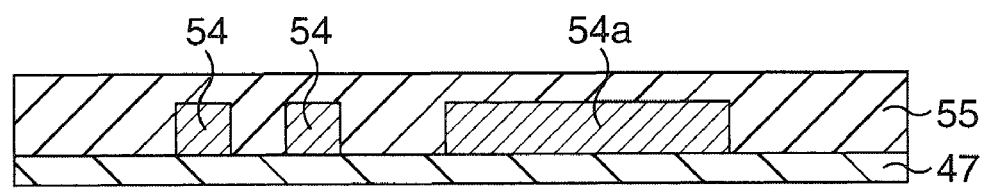
FIG. 15B is a schematic cross-sectional view illustrating a method for manufacturing an FeRAM according to the seventh variation of the first embodiment.

Then, the surface of the lower insulating film 55 is planarized as shown in FIG. 15B.

In particular, the surface of the lower insulating film 55 is planarized by CMP, for example. During the CMP, the surface of the lower insulating film 55 is polished to a predetermined thickness, for example approximately 100 nm, within limits that do not expose the surfaces of the second wirings 54.

As in the first embodiment, the lower insulating film 55 having an even surface may be formed as shown in FIG. 6, instead of using the steps shown in FIGS. 15A and 15B.

Figure 15C:
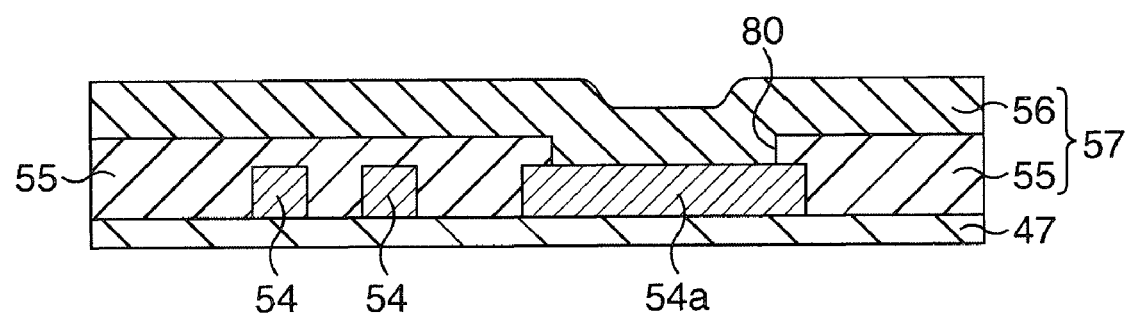
FIG. 15C is a schematic cross-sectional view illustrating a method for manufacturing an FeRAM according to the seventh variation of the first embodiment.

An opening 55*a* is formed in the lower insulating film 55 and then an upper insulating film 56 is formed as shown in FIG. 15C.

In particular, first a predetermined resist pattern (not shown) is used to pattern the lower insulating film 55 to form an opening 80 that expose a portion of the surface of a pad electrode 54*a*.

Then, an upper insulating film 56 is formed on the lower insulating film 55 to cover the inner wall of the opening 80. The upper insulating film 56 may be formed by depositing a film of a material having a lower etching rate than that of the lower insulating film 55 and the capability of preventing penetration of hydrogen, for example a film of silicon nitride, by CVD to a thickness of approximately 400 nm.

Then, the resist pattern is removed by a method such as incineration.

Figure 15D:
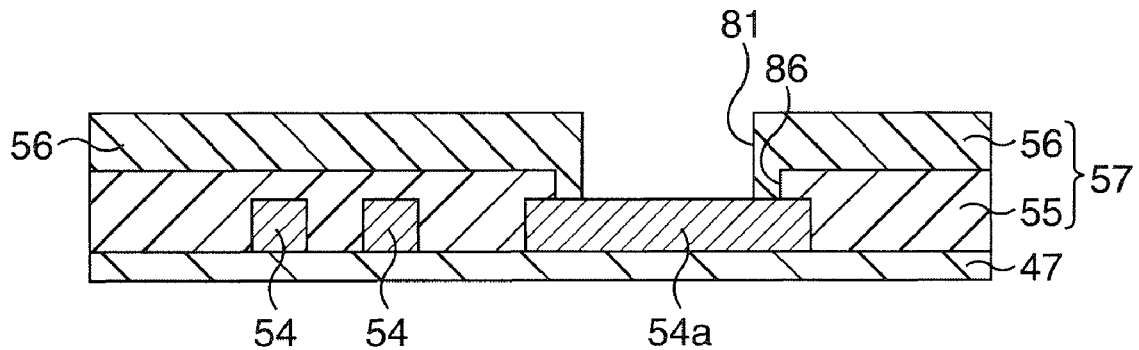
FIG. 15D is a schematic cross-sectional view illustrating a method for manufacturing an FeRAM according to the seventh variation of the first embodiment.

Then, the upper insulating film 56 is worked as shown in FIG. 15D.

In particular, a predetermined resist pattern (not shown) is used to pattern the upper insulating film 56 to form an opening 81 smaller than the opening 80 in the lower insulating film 55 in alignment with the opening 80 to expose a portion of the surface of the pad electrode 54*a*. Here, the upper insulating film 56 covers the lower insulating film 55 and the sidewall of the opening 80. The lower insulating film 55 and the upper insulating film 56 form a fourth interlayer insulating film 57.

Then, the resist pattern is removed by a method such as incineration.

Figure 15E:
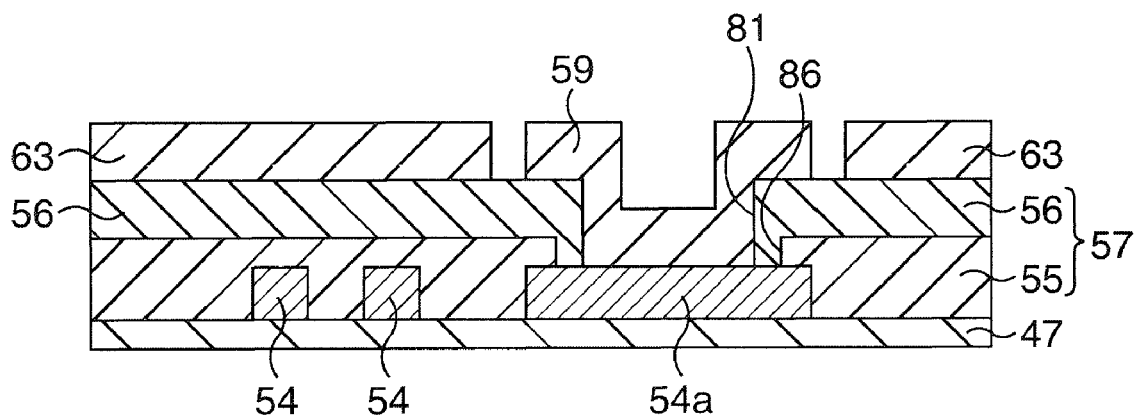
FIG. 15E is a schematic cross-sectional view illustrating a method for manufacturing an FeRAM according to the seventh variation of the first embodiment.

Then, a protective metal films 59 and 63 are patterned at the same time as shown in FIG. 15E.

In particular, first a moisture-resistant metal, Al in this example, is deposited on the fourth interlayer insulating film 57, including the inside of the opening 81, by sputtering to a thickness of approximately 800 nm, for example, to form an Al film. The moisture-resistant metal may be an Al alloy such as Al—Cu, or Ti, TiN, TiON, or Cu, or a multilayered film consisting of any of these, instead of Al.

Then, the Al film is etched by dry etching using a resist pattern (not shown) and using the upper insulating film 56 as an etching stopper to form a protective metal film 59 on the pad electrode 54*a* that is connected to the pad electrode 54*a* and, at the same time, a protective metal film 63 on the upper insulating film 56 that is electrically insulated from the protective metal film 59 (pad electrode 54*a*) and surrounds the pad electrode 54*a*. Here, the two-layer structure consisting of the pad electrode 54*a* and the protective metal film 59 forms a pad electrode for electrically connecting to an external element. Thus, the protective metal film 59 in effect functions as a pad electrode.

Then the resist pattern is removed by a method such as incineration.

In this way, the protective metal film 59 covers the pad electrodes 54*a* and the protective metal film 63 covers the entire top surface of the silicon semiconductor substrate 10 except the portions where the pad electrodes 54*a* are formed. Because the areas in which the pad electrodes 54*a* are formed and areas surrounding the pad electrodes 54*a* where water/hydrogen is most likely to enter are covered with the moisture-resistant protective metal films 59 and 63, penetration of water/hydrogen into the inside can be efficiently prevented.

Because the surface of the lower insulating film 55 is planarized in the seventh variation, the upper insulating film 56 formed on the lower insulating film 55 has an excellent coverage and a uniform thickness. The protective metal film 59 and the protective metal film 63 formed on the upper insulating film 56 also have an excellent coverage, which may improve the resistance to damage during packaging, for example. Because the upper insulating film 56 also covers the sidewall of the opening 80 of the lower insulating film 55, penetration of hydrogen which would otherwise be caused by exposure of the sidewall can be prevented to the maximum extent. Because the upper insulating film 56 and the protective metal films 59 and 63 are formed to have an excellent coverage and the upper insulating film 56 extends onto the sidewall of the opening 80, the ability of the upper insulating film 56 and the protective metal films 59 and 63 to prevent penetration of water/hydrogen is maximized. With this configuration, property degradation of the ferroelectric capacitor structure 30 can be reliably prevented.

Figure 15F:
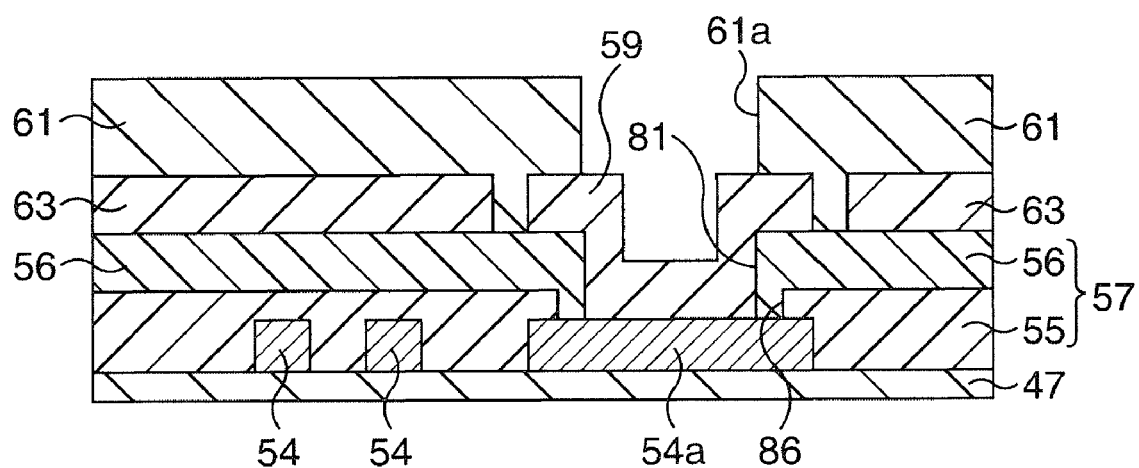
FIG. 15F is a schematic cross-sectional view illustrating a method for manufacturing an FeRAM according to the seventh variation of the first embodiment.

Then, an upper protecting layer 61 that covers the area surrounding the protective metal film 59 is formed as shown in FIG. 15F.

In particular, first an upper protecting layer 61 is formed on the protective metal film 63 to cover the protective metal film 59. The upper protecting layer 61 may be formed by depositing polyimide, for example.

Then, an opening 61*a* is formed in the upper protecting layer 61 to expose a portion of the surface of the protective metal film 59. With this, an FeRAM is completed.

As has been described above, according to the seventh variation, a reliable FeRAM that reliably prevents penetration of water/hydrogen into a ferroelectric capacitor structure 30 to maintain a high performance of the ferroelectric capacitor structure 30 can be implemented with a relatively simple configuration.

While the upper insulating film 56 is extended onto the sidewall of the opening 80 in the lower insulating film 55 in the example of the seventh variation on the basis of the configuration of the second variation, the seventh variation is not limited to this configuration. For example, the seventh variation can be suitably applied to any of the configurations of the first embodiment and the first, third, and fourth variations of the first embodiment.

Second Embodiment

A second embodiment differs from the FeRAM disclosed in the first embodiment in the mode for connecting a protective metal film to a pad electrode 54a.

FIG. 16 shows schematic cross-sectional views illustrating main steps of a method for manufacturing an FeRAM according to the second embodiment.

As in the first embodiment, first a MOS transistor 20, a ferroelectric capacitor structure 30, first wirings 45, second wirings 54, and so on are formed through the steps shown in FIGS. 1A to 1D, 2A to 2D, 3A and 3B, and 4 (5A).

Figure 16A:
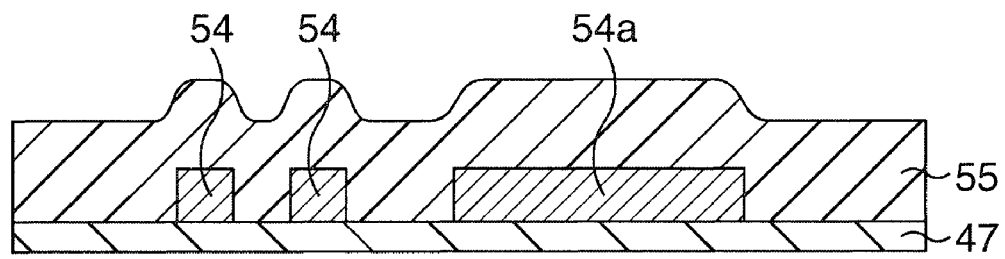
FIG. 16A is a schematic cross-sectional view illustrating a method for manufacturing an FeRAM according a second embodiment.

Then, a lower insulating film 55 is formed to cover second wirings 54 as shown in FIG. 16A, as in FIG. 5B.

In particular, a lower insulating film 55 is formed to cover the second wirings 54. The lower insulating film 55 may be formed by depositing a silicone oxide film by CVD using TEOS, for example, to such a thickness that the second wirings 54 are embedded. The surface of the lower insulating film 55 reflects the shape of the second wirings 54 and is uneven accordingly.

Figure 16B:
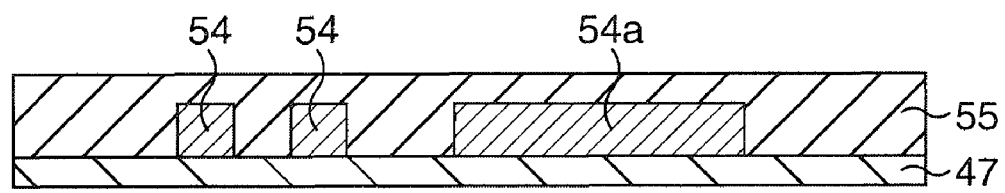
FIG. 16B is a schematic cross-sectional view illustrating a method for manufacturing an FeRAM according the second embodiment.

Then, the surface of the lower insulating film 55 is planarized as shown in FIG. 16B.

In particular, the surface of the lower insulating film 55 is planarized by CMP, for example. During the CMP, the surface of the lower insulating film 55 is polished to a predetermined thickness, for example approximately 100 nm, within limits that do not expose the surfaces of the second wirings 54.

As in the first embodiment, the lower insulating film 55 having an even surface may be formed as shown in FIG. 6, instead of using the steps shown in FIGS. 16A and 16B.

Figure 16C:
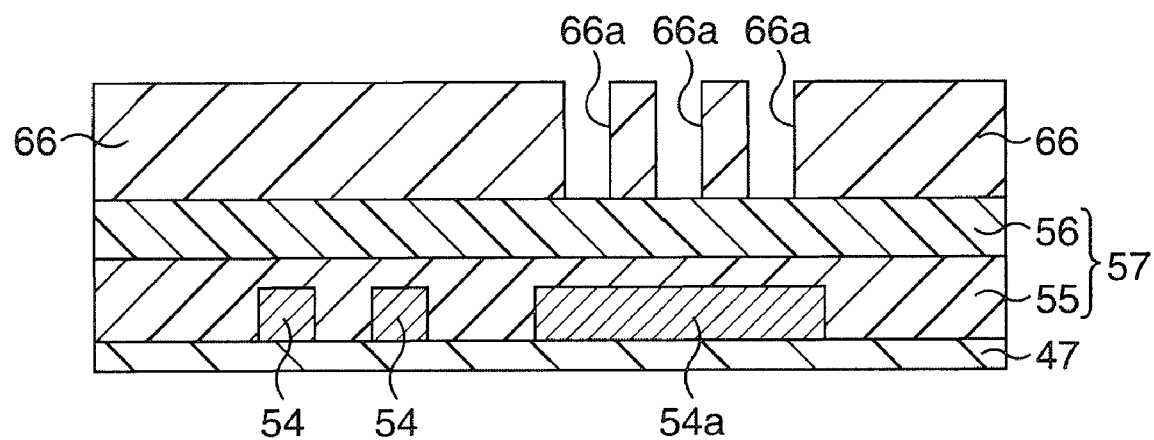
FIG. 16C is a schematic cross-sectional view illustrating a method for manufacturing an FeRAM according the second embodiment.

Then, an upper insulating film 56 and a resist pattern 66 are formed as shown in FIG. 16C.

In particular, first an upper insulating film 56 is formed on the lower insulating film 55. The upper insulating film 56 is formed by depositing a film of a material having a lower etching rate than that of the lower insulating film 55 and the capability of preventing penetration of hydrogen, for example a silicon nitride film, by CVD to a thickness of approximately 400 nm. The lower insulating film 55 and the upper insulating film 56 form a fourth interlayer insulating film 57.

Then, a resist is applied to the entire surface of the upper insulating film 56 and is patterned by lithography to form a resist pattern 66 having multiple small openings 66a in locations in the lower insulating film 55 above and in alignment with a pad electrode 54a.

Figure 16D:
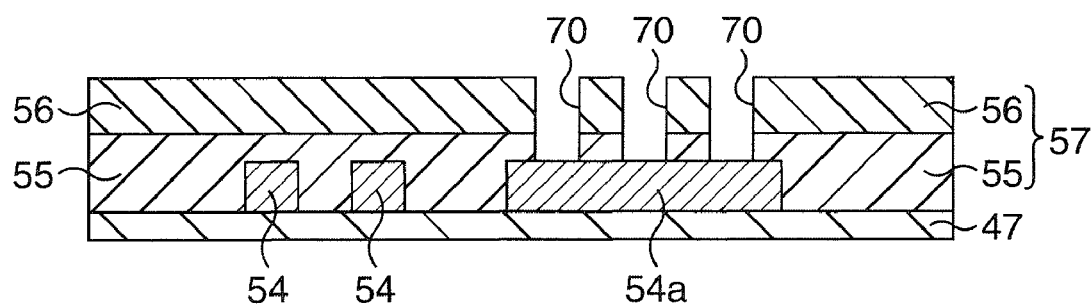
FIG. 16D is a schematic cross-sectional view illustrating a method for manufacturing an FeRAM according the second embodiment.

Then, the fourth interlayer insulating film 57 is worked as shown in FIG. 16D.

In particular, the resist pattern 66 is used as a mask and the pad electrode 54a is used as an etching stopper to etch the fourth interlayer insulating film 57, which is the upper insulating film 56 and an upper portion (the insulating film 55b in the example in FIG. 6C) of the lower insulating film 55 in this example, by dry etching. During the dry etching, multiple small via holes 70 are formed in the fourth interlayer insulating film 57 that expose portions of the surface of the pad electrode 54a according to the openings 66a of the resist pattern 66.

Then the resist pattern 66 is removed by a method such as incineration.

Figure 16E:
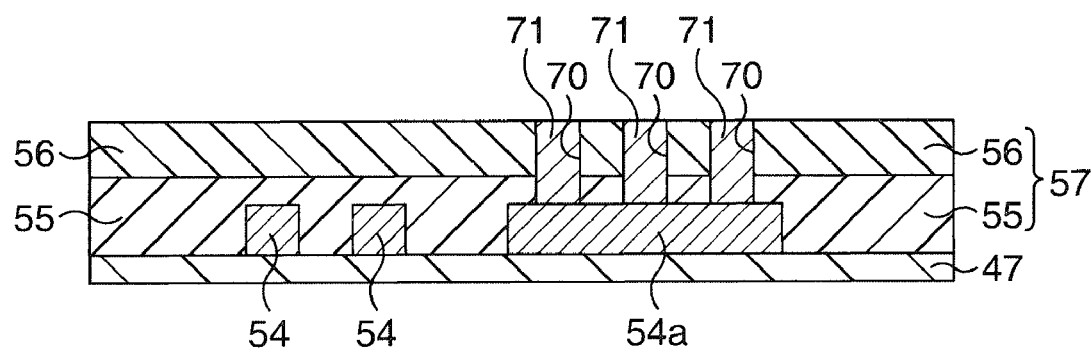
FIG. 16E is a schematic cross-sectional view illustrating a method for manufacturing an FeRAM according the second embodiment.

Then, conductive plugs 71 connected to a pad electrode 54a are formed as shown in FIG. 16E.

In particular, a tungsten (W) film, for example, is formed in such a manner that the via holes 70 are embedded. Then, the W film is polished by CMP by using the upper insulating film 56 as a stopper to form conductive plugs 71 in the via holes 70 filled with W.

Figure 16F:
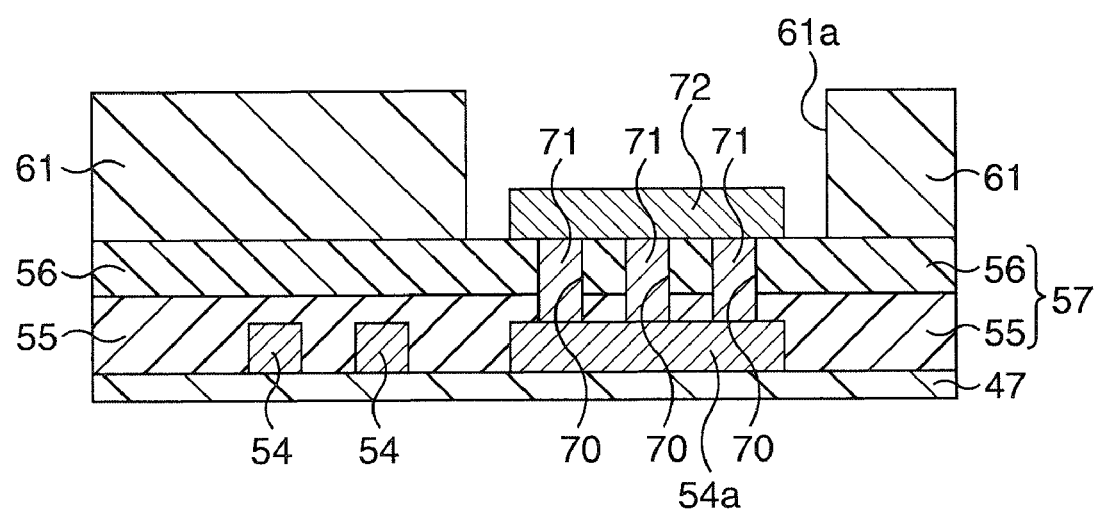
FIG. 16F is a schematic cross-sectional view illustrating a method for manufacturing an FeRAM according the second embodiment.

Then, a protective metal film 72 and an upper protecting layer 61 are formed as shown in FIG. 16F.

In particular, first a moisture-resistant metal, Al in this example, is deposited on the upper insulating film 56 by sputtering, for example, to a thickness of approximately 800 nm, for example, to form an Al film. The moisture-resistant metal may be an Al alloy, such as Al—Cu, or Ti, TiN, TiOn, or Cu, or a multilayered structure consisting of any of these, instead of Al.

Then, the Al film is etched by dry etching using a resist pattern (not shown) and using the upper insulating film 56 as an etching stopper to form a protective metal film 72 on the upper insulating film 56 that is electrically connected to the pad electrode 54a through the conductive plugs 71. Here, the two-layer structure consisting of the pad electrode 54a and the protective metal film 72 connected to the pad electrode 54a through the conductive plugs 71 forms a pad electrode for electrically connecting to an external element. Thus, the protective metal film 72 in effect functions as a pad electrode.

Then, the resist pattern is removed by a method such as incineration.

Then, an upper protecting layer 61 is formed on the upper insulating film 56 to cover the protective metal film 72. The upper protecting layer 61 may be formed by depositing polyimide, for example.

Then, an opening 61a is formed in the upper protecting layer 61 to expose the surface of the protective metal film 72. With this, an FeRAM is completed.

According to the present embodiment, the upper insulating film 56 formed on the lower insulating film 55 has an excellent coverage and is formed evenly because the surface of the lower insulating film 55 is planarized. The protective metal film 72 formed on the evenly formed upper insulating film 56 in such a manner that the protective metal layer 72 connect to the conductive plugs 71 also has an excellent coverage, which may significantly improve the resistance to damage during processes such as packaging. Because the upper insulating film 56 and the protective metal film 72 having an excellent coverage are formed in this way, the ability of the upper insulating film 56 and the protective metal film 72 to prevent penetration of water/hydrogen is maximized. With this configuration, property degradation of the ferroelectric capacitor structure 30 can be reliably prevented.

Furthermore, the protective metal film 72 in the present embodiment is connected to the pad electrode 54a through conductive plugs 71. In this way, the protective metal film 72 is formed at a distance from the pad electrode 54a in a positive manner. Accordingly, a contact mark made on the surface of the protective metal film 72 by probing during a functionality inspection of the pad electrode cannot affect the conductive plugs 71. Therefore, the electrical conductivity of the pad electrode 54a and the protective metal film 72 as a pad electrode and connectivity with a wiring can be adequately ensured.

As has been described above, according to the present embodiment, a reliable FeRAM that reliably prevents penetration of water/hydrogen into a ferroelectric capacitor structure 30 to maintain a high performance of the ferroelectric capacitor structure 30 can be implemented with a relatively simple configuration.

Variations

Variations of the second embodiment will be described below. In the description of the variations, the same components as disclosed in the second embodiment will be labeled with the same reference numerals, detailed description of which will be omitted.

[First Variation]

In a first variation, a protective metal film surrounding a pad electrode 54a is formed in the FeRAM configuration disclosed in the second embodiment.

FIG. 17 shows schematic cross-sectional views illustrating main steps of a method for manufacturing an FeRAM according to the first variation.

As in the first embodiment, first a MOS transistor 20, a ferroelectric capacitor structure 30, first wirings 45, second wirings 54, and so on are formed through the steps shown in FIGS. 1A to 1D, 2A to 2D, 3A and 3B, and 4 (5A).

Figure 17A:
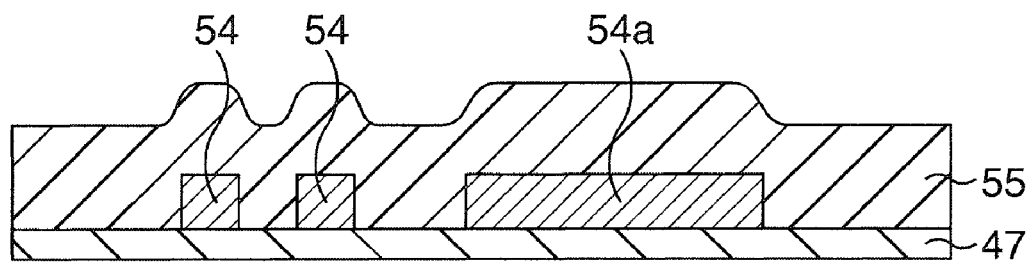
FIG. 17A is a schematic cross-sectional view illustrating a method for manufacturing an FeRAM according a first variation of the second embodiment.

Then, a lower insulating film 55 is formed to cover second wirings 54 as shown in FIG. 17A, as in FIG. 5B.

In particular, a lower insulating film 55 is formed to cover the second wirings 54. The lower insulating film 55 may be formed by depositing a silicone oxide film by CVD using TEOS, for example, to such a thickness that the second wirings 54 are embedded. The surface of the lower insulating film 55 reflects the shape of the second wirings 54 and is uneven accordingly.

Figure 17B:
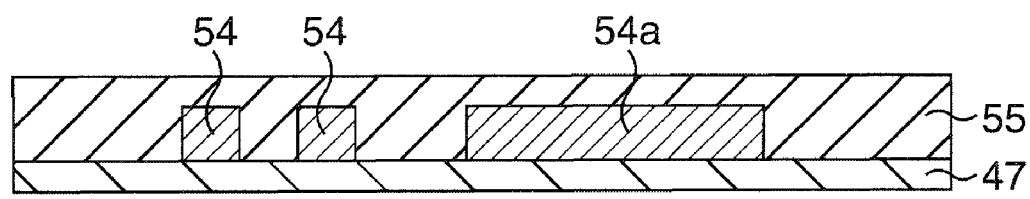
FIG. 17B is a schematic cross-sectional view illustrating a method for manufacturing an FeRAM according the first variation of the second embodiment.

Then, the surface of the lower insulating film 55 is planarized as shown in FIG. 17B.

In particular, the surface of the lower insulating film 55 is planarized by CMP, for example. During the CMP, the surface of the lower insulating film 55 is polished to a predetermined thickness, for example approximately 100 nm, within limits that do not expose the surfaces of the second wirings 54.

As in the first embodiment, the lower insulating film 55 having an even surface may be formed as shown in FIG. 6, instead of using the steps shown in FIGS. 17A and 17B.

Figure 17C:
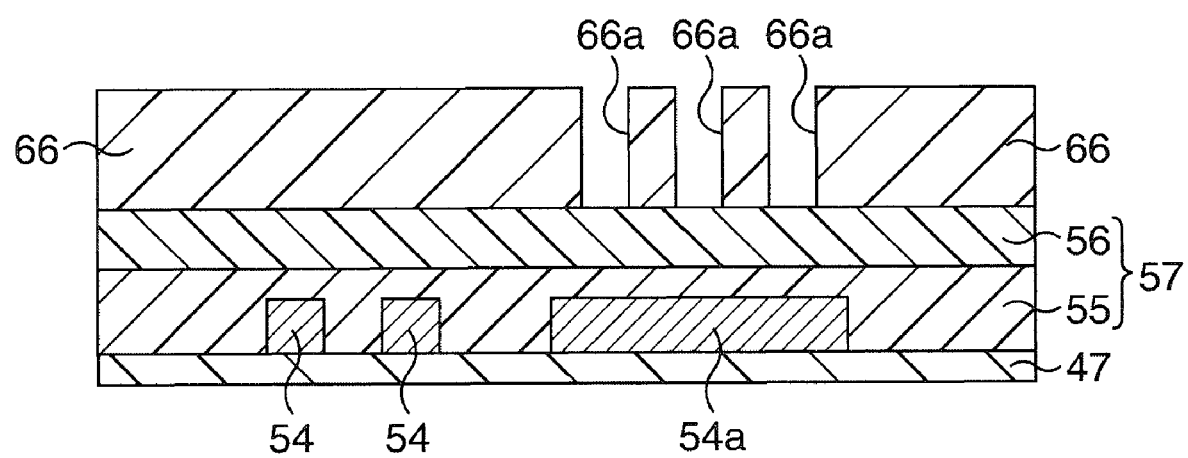
FIG. 17C is a schematic cross-sectional view illustrating a method for manufacturing an FeRAM according the first variation of the second embodiment.

Then, an upper insulating film 56 and a resist pattern 66 are formed as shown in FIG. 17C.

In particular, first an upper insulating film 56 is formed on the lower insulating film 55. The upper insulating film 56 is formed by depositing a film of a material having a lower etching rate than that of the lower insulating film 55 and the capability of preventing penetration of hydrogen, for example a silicon nitride film, by CVD to a thickness of approximately 400 nm. The lower insulating film 55 and the upper insulating film 56 form a fourth interlayer insulating film 57.

Then, a resist is applied to the entire surface of the upper insulating film 56 and is patterned by lithography to form a resist pattern 66 having multiple small openings 66a in locations in the upper insulating film 56 above and in alignment with a pad electrode 54a.

Figure 17D:
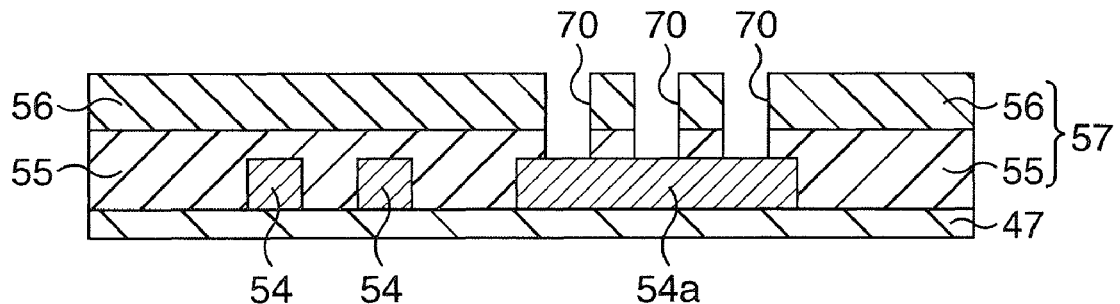
FIG. 17D is a schematic cross-sectional view illustrating a method for manufacturing an FeRAM according the first variation of the second embodiment.

Then, the fourth interlayer insulating film 57 is worked as shown in FIG. 17D.

In particular, the resist pattern 66 is used as a mask and the pad electrode 54a is used as an etching stopper to etch the fourth interlayer insulating film 57, which is the upper insulating film 56 and an upper portion (the insulating film 55b in the example in FIG. 6C) of the lower insulating film 55 in this example), by dry etching. Here, multiple small via holes 70 are formed in the fourth interlayer insulating film 57 that expose portions of the surface of the pad electrode 54a according to the openings 66a of the resist pattern 66.

Then the resist pattern 66 is removed by a method such as incineration.

Figure 17E:
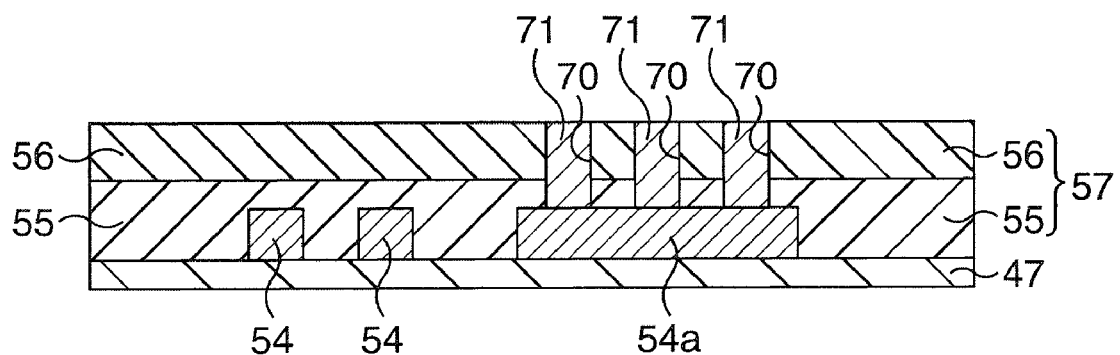
FIG. 17E is a schematic cross-sectional view illustrating a method for manufacturing an FeRAM according the first variation of the second embodiment.

Then, conductive plugs 71 connected to a pad electrode 54a are formed as shown in FIG. 17E.

In particular, a tungsten (W) film, for example, is formed in such a manner that the via holes 70 are embedded. Then, the W film is polished by CMP by using the upper insulating film 56 as a stopper to form conductive plugs 71 in the via holes 70 filled with W.

Figure 17F:
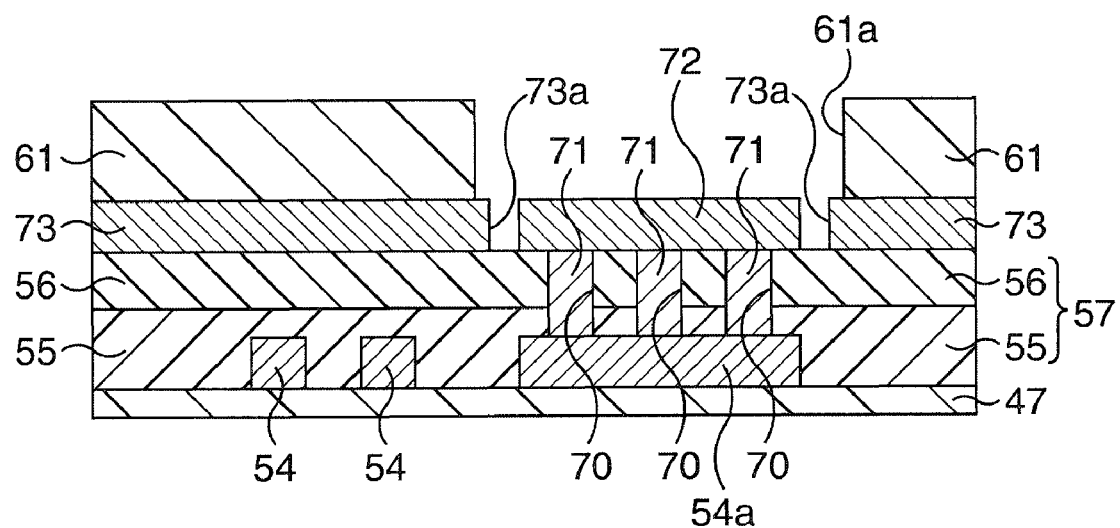
FIG. 17F is a schematic cross-sectional view illustrating a method for manufacturing an FeRAM according the first variation of the second embodiment.

Then, a protective metal films 72 and 73 are patterned at the same time and then an upper protective layer 61 is formed, as shown in FIG. 17F.

In particular, first a moisture-resistant metal, Al in this example, is deposited on the upper insulating film 56 by sputtering, for example, to a thickness of approximately 800 nm, for example, to form an Al film. The moisture-resistant metal may be an Al alloy, such as Al—Cu, or Ti, TiN, TiOn, or Cu, or a multilayered structure consisting of any of these, instead of Al.

Then, the Al film is etched by dry etching using a resist pattern (not shown) and using the upper insulating film 56 as an etching stopper. During the etching, a portion of the Al film on the upper insulating film 56 is removed according to the resist pattern to form an opening 73a. By the etching, a protective metal film 72 electrically connected to a pad electrode 54a through the conductive plugs 71 is formed on the upper insulating film 56 and, at the same time, a protective metal film 73 that is electrically insulated from the protective metal film 72 (pad electrode 54a) and surrounds the pad electrode 54a is formed on the upper insulating film 56. Here, the two-layer structure consisting of the pad electrode 54a and the protective metal film 72 connected to the pad electrode 54a through the conductive plugs 71 forms a pad electrode for electrically connecting to an external element. Thus, the protective metal film 72 in effect functions as a pad electrode.

Then the resist pattern is removed by a method such as incineration.

Then, an upper protecting layer 61 is formed on the protective metal film 73 to cover the protective metal film 72. The upper protecting layer 61 may be formed by depositing polyimide, for example.

Then, an opening 61a is formed in the upper protective layer 61 to expose the surface of the protective metal film 72. With this, an FeRAM is completed.

Figure 18:
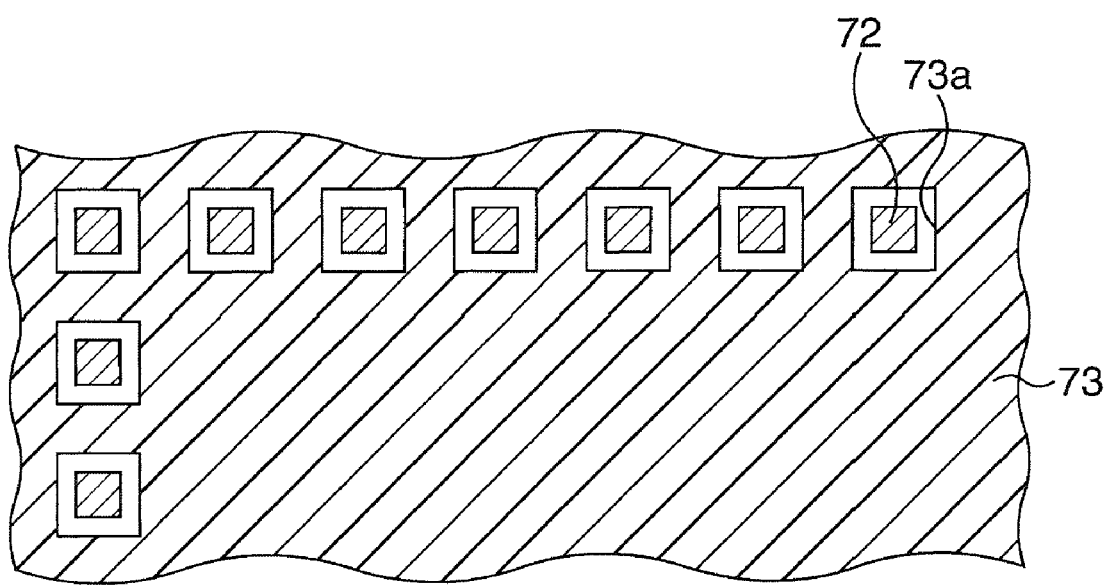
FIG. 18 is a schematic plan view showing a protective metal film according to the first variation of the first embodiment.

FIG. 18 shows a plan view of the protective metal films 72 and 73.

As shown, the protective metal film 72 covers the pad electrodes 54a and the protective metal film 73 covers the entire top surface of the silicon semiconductor substrate 10 except the portions where the pad electrodes 54a are formed. Because the areas in which the pad electrodes 54a are formed and areas surrounding the pad electrodes 54a where water/hydrogen is most likely to enter are covered with the moisture-resistant protective metal films 72 and 73, penetration of water/hydrogen into the inside can be efficiently prevented.

Because the surface of the lower insulating film 55 is planarized in the first variation, the upper insulating film 56 formed on the lower insulating film 55 has an excellent coverage and a uniform thickness. The protective metal film 72 formed on the evenly formed upper insulating film 56 with the conductive plugs 71 between them and the protective metal layer 73 formed on the upper insulating film 56 also have an excellent coverage, which may significantly improve the resistance to damage during packaging, for example. Because the upper insulating film 56 and the protective metal films 72 and 73 are formed so that they have an excellent coverage in this way, the ability of the upper insulating film 56 and the protective metal films 72 and 73 to prevent penetration of water/hydrogen is maximized. With this configuration, property degradation of the ferroelectric capacitor structure 30 can be reliably prevented.

Furthermore, the protective metal film 72 is connected to the pad electrode 54a through the conductive plugs 71 in the first variation. Thus, the protective metal film 72 is formed at a distance from the pad electrode 54a in a positive manner and a contact mark made on the surface of the protective metal film 72 by probing during a functionality inspection of the pad electrode 54a cannot affect the conductive plugs 71. Therefore, the electrical conductivity of the pad electrode 54a and the protective metal film 72 as a pad electrode and connectivity with a wiring can be adequately ensured.

As has been described above, according to the first variation, a reliable FeRAM that reliably prevents penetration of water/hydrogen into a ferroelectric capacitor structure 30 to maintain a high performance of the ferroelectric capacitor structure 30 can be implemented with a relatively simple configuration.

[Second Variation]

A second variation differs from the FeRAM configuration disclosed in the second embodiment in the mode of formation of a protective metal film.

FIG. 19 shows schematic cross-sectional views illustrating main steps of a method for manufacturing an FeRAM according to the first variation.

As in the first embodiment, first a MOS transistor 20, a ferroelectric capacitor structure 30, first wirings 45, second wirings 54, and so on are formed through the steps shown in FIGS. 1A to 1D, 2A to 2D, 3A and 3B, and 4 (5A).

Figure 19A:
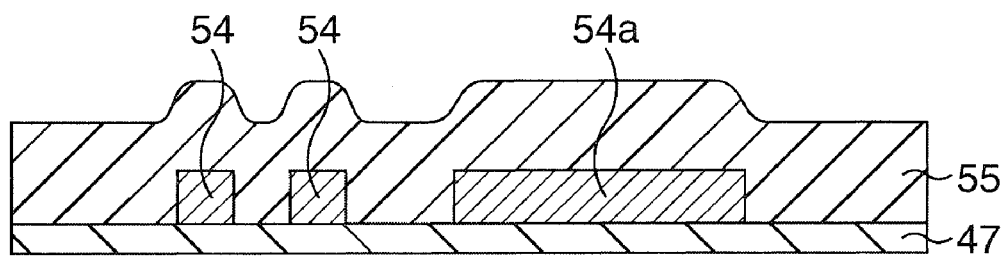
FIG. 19A is a schematic cross-sectional view illustrating a method for manufacturing an FeRAM according a second variation of the second embodiment.

Then, a lower insulating film 55 is formed to cover second wirings 54 as shown in FIG. 19A, as in FIG. 5B.

In particular, a lower insulating film 55 is formed to cover the second wirings 54. The lower insulating film 55 may be formed by depositing a silicone oxide film by CVD using TEOS, for example, to such a thickness that the second wirings 54 are embedded. The surface of the lower insulating film 55 reflects the shape of the second wirings 54 and is uneven accordingly.

Figure 19B:
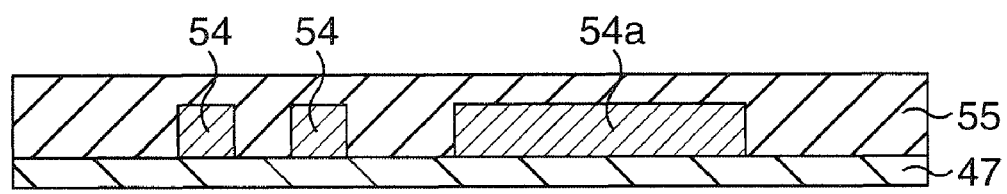
FIG. 19B is a schematic cross-sectional view illustrating a method for manufacturing an FeRAM according the second variation of the second embodiment.

Then, the surface of the lower insulating film 55 is planarized as shown in FIG. 19B.

In particular, the surface of the lower insulating film 55 is planarized by CMP, for example. During the CMP, the surface of the lower insulating film 55 is polished to a predetermined thickness, for example approximately 100 nm, within limits that do not expose the surfaces of the second wirings 54.

As in the first embodiment, the lower insulating film 55 having an even surface may be formed as shown in FIG. 6, instead of using the steps shown in FIGS. 19A and 19B.

Figure 19C:
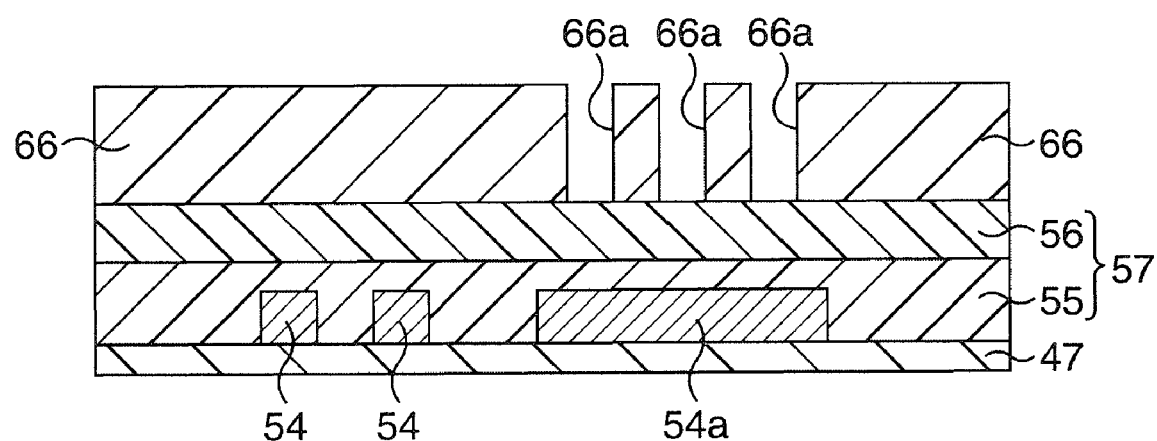
FIG. 19C is a schematic cross-sectional view illustrating a method for manufacturing an FeRAM according the second variation of the second embodiment.

Then, a resist pattern 66 is formed as shown in FIG. 19C.

In particular, a resist is applied to the entire surface of the lower insulating film 55 and is patterned by lithography to form a resist pattern 66 having multiple small openings 66a in locations in the lower insulating film 55 above and in alignment with a pad electrode 54a.

Figure 19D:
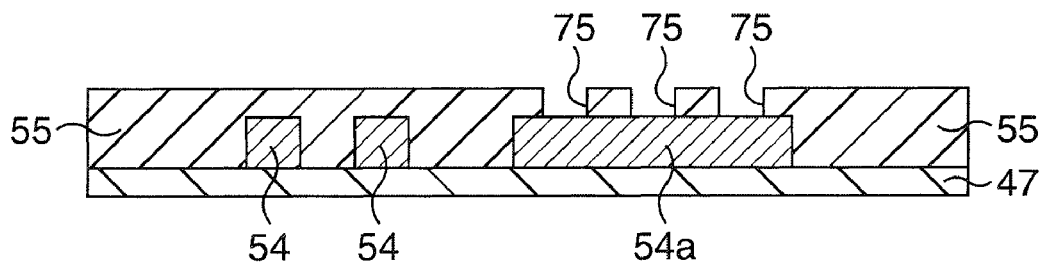
FIG. 19D is a schematic cross-sectional view illustrating a method for manufacturing an FeRAM according the second variation of the second embodiment.

Then, as shown in FIG. 19D, the lower insulating film 55 is worked.

In particular, the resist pattern 66 is used as a mask and the pad electrode 54a is used as an etching stopper to etch an upper portion (the insulating film 55b in the example in FIG. 6C) of the lower insulating film 55, by dry etching. During this etching, multiple small via holes 75 are formed in the lower insulating film 55 that expose portions of the surface of the pad electrode 54a according to the openings 66a of the resist pattern 66.

Then, the resist pattern 66 is removed by a method such as incineration.

Figure 19E:
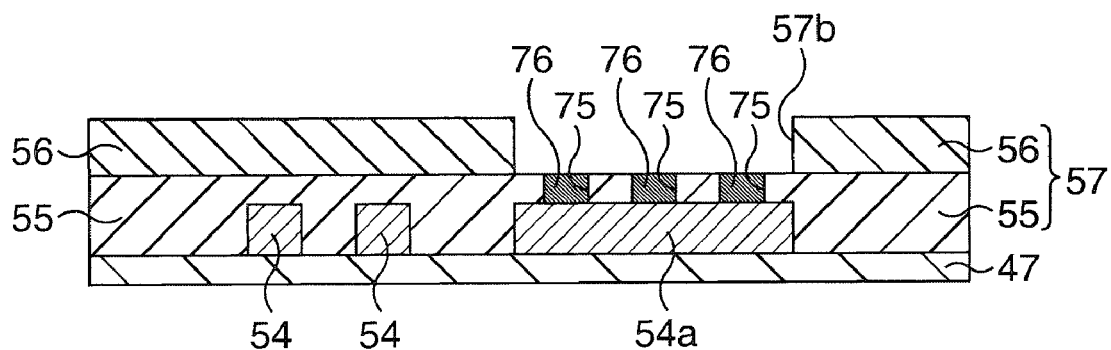
FIG. 19E is a schematic cross-sectional view illustrating a method for manufacturing an FeRAM according the second variation of the second embodiment.

Then, an upper insulating film 56 having conductive plugs 76 connected to the pad electrode 54a and a second opening 57b is formed as shown in FIG. 19E.

In particular, a tungsten (W) film, for example, is formed in such a manner that the via holes 75 are embedded. Then, the W film is polished by CMP by using the lower insulating film 55 as a stopper to form conductive plugs 76 in the via holes 75 filled with W.

Then, an upper insulating film 56 is formed on the lower insulating film 55, including on the conductive plugs 76. The upper insulating film 56 is a film of a material having an etching rate lower than that of the lower insulating film 55 and the capability of preventing penetration of hydrogen, for example a silicon nitride film, formed to a thickness of approximately 400 nm by CVD. The lower insulating film 55 and the upper insulating film 56 make up a fourth interlayer insulating film 57.

Then, the upper insulating film 56 is etched by dry etching using a resist pattern (not shown) to form an opening 57b in a location above and in alignment with the pad electrode 54a to expose the multiple via holes 76.

Then, the resist pattern is removed by a method such as incineration.

Figure 19F:
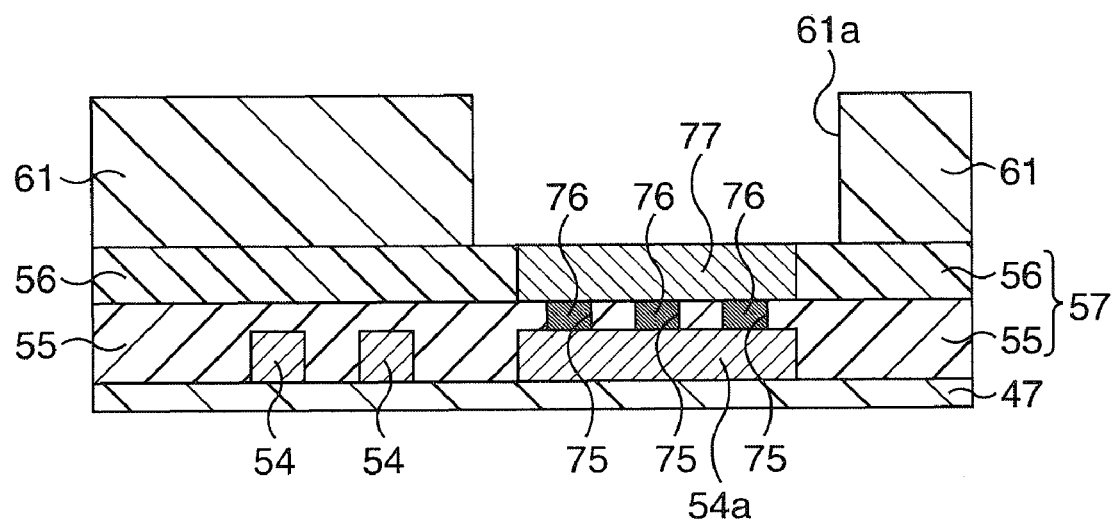
FIG. 19F is a schematic cross-sectional view illustrating a method for manufacturing an FeRAM according the second variation of the second embodiment.

Then, a protective metal film 77 and an upper protecting layer 61 are formed as shown in FIG. 19F.

In particular, a moisture-resistant metal, Al in this example, is deposited on the upper insulating film 56 by sputtering to a thickness of approximately 800 nm in such a manner that the opening 57b is embedded to form an Al film. The moisture metal may be an Al-alloy such as Al—Cu, or Ti, TiN, TiOn, or Cu, instead of Al.

Then, the surface of the Al film is polished by CMP, for example, using the upper insulating film 56 as a stopper to expose the surface of the upper insulating film 56. As a result, a portion of the Al film remains only in the opening 57b and fills the opening 57b to form a protective metal film 77 electrically connected to the pad electrode 54a through the conductive plugs 76. The two-layer structure consisting of the pad electrode 54a and the protective metal film 77 connected to the pad electrode 54a through the conductive plugs 76 forms a pad electrode for providing electric connection to an external element. The protective metal film 77 in effect functions as a pad electrode.

Then, an upper protecting layer 61 is formed on the upper insulating film 56 to cover the protective metal film 77. The upper protecting layer 61 may be formed by depositing polyimide, for example.

Then, an opening 61a is formed in the upper protecting layer 61 to expose the surface of the protective metal layer 77. With this, an FeRAM is completed.

In the second variation, the surface of the lower insulating film 55 is planarized and CMP can be used when the protective metal film 77 is formed, as described above. The planarization is performed so that the protective metal film 77 and the upper insulating film 56 formed on the lower insulating film 55 form the same plane. Accordingly, both upper insulating film 56 and protective metal film 77 have an excellent coverage and even thicknesses. Consequently, the resistance of the protective metal film 77 to damage during packaging, for example, may be significantly improved. Because the upper insulating film 56 and the protective metal film 77 are formed so that they have an excellent coverage in this way, the ability of the upper insulating film 56 and the protective metal film 77 to prevent penetration of water/hydrogen is maximized. With this configuration, property degradation of the ferroelectric capacitor structure 30 can be reliably prevented.

Furthermore, the protective metal film 77 is connected to the pad electrode 54a through the conductive plugs 76 in the second variation. Thus, the protective metal film 77 is formed at a distance from the pad electrode 54a in a positive manner and therefore a contact mark made on the surface of the protective metal film 77 by probing during a functionality inspection of the pad electrode 54a cannot affect the conductive plugs 76. Thus, the electrical conductivity of the pad electrode 54a and the protective metal film 77 as a pad electrode and connectivity with a wiring can be adequately ensured.

As has been described above, according to the second variation, a reliable FeRAM that reliably prevents penetration of water/hydrogen into a ferroelectric capacitor structure 30 to maintain a high performance of the ferroelectric capacitor structure 30 can be implemented with a relatively simple configuration.

[Third Variation]

A third variation differs from the FeRAM configuration disclosed in the second embodiment in the mode of formation of a protective metal film.

FIG. 20 shows schematic cross-sectional views illustrating main steps of a method for manufacturing an FeRAM according to the third variation.

As in the first embodiment, first a MOS transistor 20, a ferroelectric capacitor structure 30, first wirings 45, second wirings 54, and so on are formed through the steps shown in FIGS. 1A to 1D, 2A to 2D, 3A and 3B, and 4 (5A).

Figure 20A:
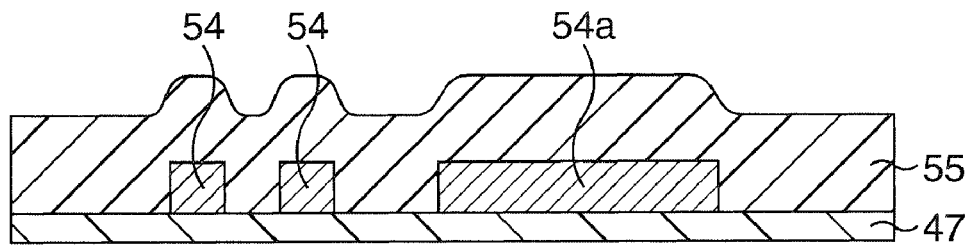
FIG. 20A is a schematic cross-sectional view illustrating a method for manufacturing an FeRAM according a third variation of the second embodiment.

Then, a lower insulating film 55 is formed to cover second wirings 54 as shown in FIG. 20A, as in FIG. 5B.

In particular, a lower insulating film 55 is formed to cover the second wirings 54. The lower insulating film 55 may be formed by depositing a silicone oxide film by CVD using TEOS, for example, to such a thickness that the second wirings 54 are embedded. The surface of the lower insulating film 55 reflects the shape of the second wirings 54 and is uneven accordingly.

Figure 20B:
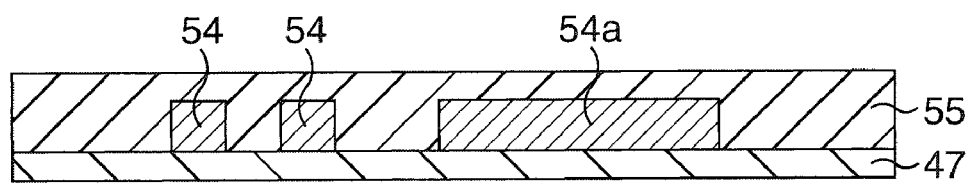
FIG. 20B is a schematic cross-sectional view illustrating a method for manufacturing an FeRAM according the third variation of the second embodiment.

Then, the surface of the lower insulating film 55 is planarized as shown in FIG. 20B.

In particular, the surface of the lower insulating film 55 is planarized by CMP, for example. During the CMP, the surface of the lower insulating film 55 is polished to a predetermined thickness, for example approximately 100 nm, within limits that do not expose the surfaces of the second wirings 54.

As in the first embodiment, the lower insulating film 55 having an even surface may be formed as shown in FIG. 6, instead of using the steps shown in FIGS. 20A and 20B.

Figure 20C:
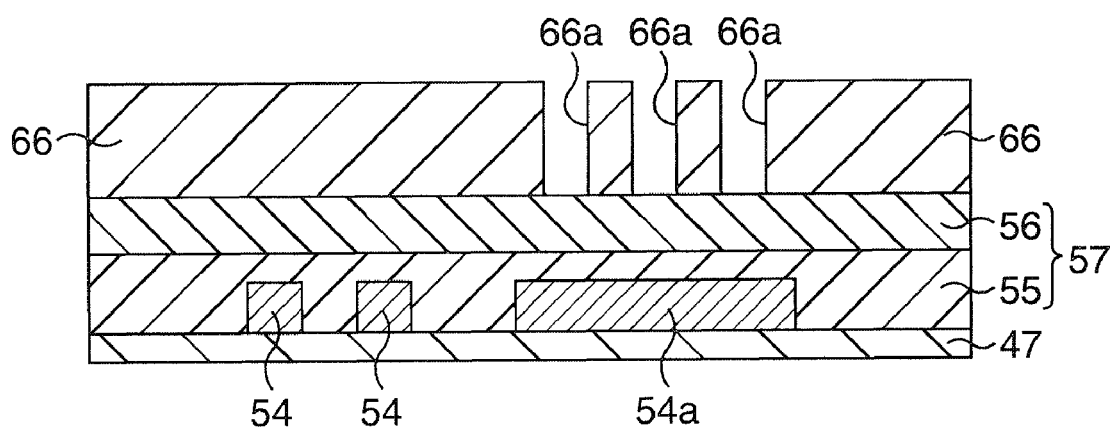
FIG. 20C is a schematic cross-sectional view illustrating a method for manufacturing an FeRAM according the third variation of the second embodiment.

Then, an upper insulating film 56 and a resist pattern 66 are formed as shown in FIG. 20C.

In particular, first an upper insulating film 56 is formed on the lower insulating film 55. The upper insulating film 56 is formed by depositing a film of a material having a lower etching rate than that of the lower insulating film 55 and the capability of preventing penetration of hydrogen, for example a silicon nitride film, by CVD to a thickness of approximately 400 nm. The lower insulating film 55 and the upper insulating film 56 form a fourth interlayer insulating film 57.

Then, a resist is applied to the entire surface of the upper insulating film 56 and is patterned by lithography to form a resist pattern 66 having multiple small openings 66a in locations in the upper insulating film 56 above and in alignment with a pad electrode 54a.

Figure 20D:
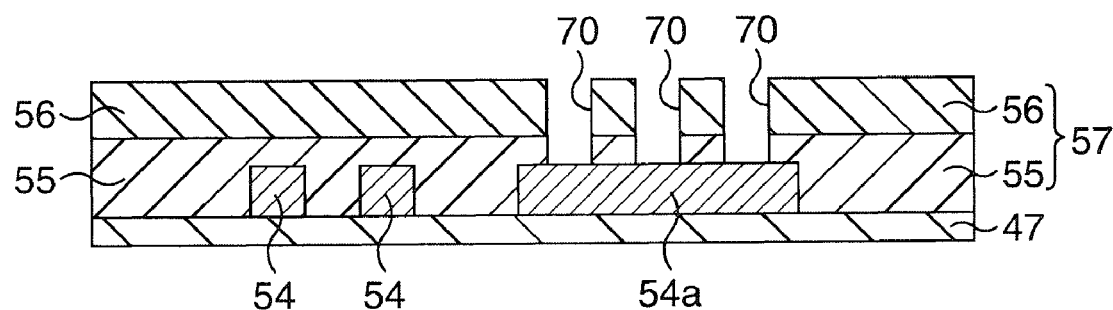
FIG. 20D is a schematic cross-sectional view illustrating a method for manufacturing an FeRAM according the third variation of the second embodiment.

Then, the fourth interlayer insulating film 57 is worked as shown in FIG. 20D.

In particular, the resist pattern 66 is used as a mask and the pad electrode 54a is used as an etching stopper to etch the fourth interlayer insulating film 57, which is the upper insulating film 56 and an upper portion (the insulating film 55b in the example in FIG. 6C) of the lower insulating film 55 in this example, by dry etching. During the dry etching, multiple small via holes 70 are formed in the fourth interlayer insulating film 57 that expose portions of the surface of the pad electrode 54a according to the openings 66a of the resist pattern 66.

Then the resist pattern 66 is removed by a method such as incineration.

Figure 20E:
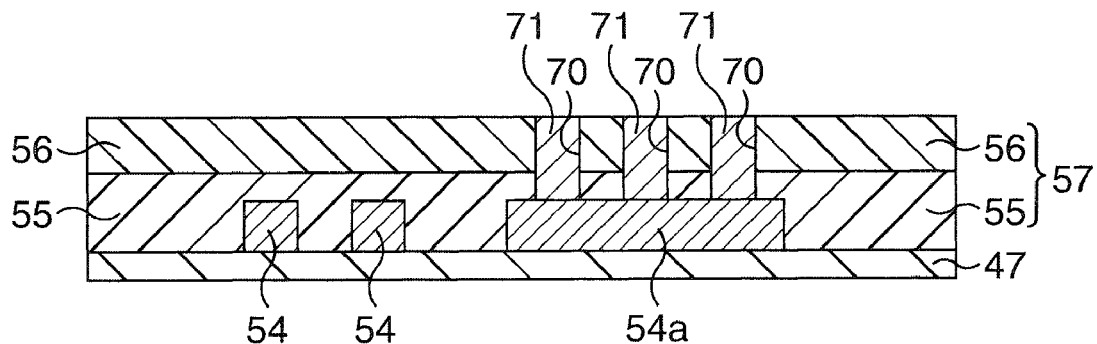
FIG. 20E is a schematic cross-sectional view illustrating a method for manufacturing an FeRAM according the third variation of the second embodiment.

Then, conductive plugs 71 connecting to the pad electrode 54a are formed as shown in FIG. 20E.

In particular, a tungsten (W) film, for example, is formed in such a manner that the via holes 70 are embedded. Then, the W film is polished by CMP by using the upper insulating film 56 as a stopper to form conductive plugs 71 in the via holes 70 filled with W.

Figure 20F:
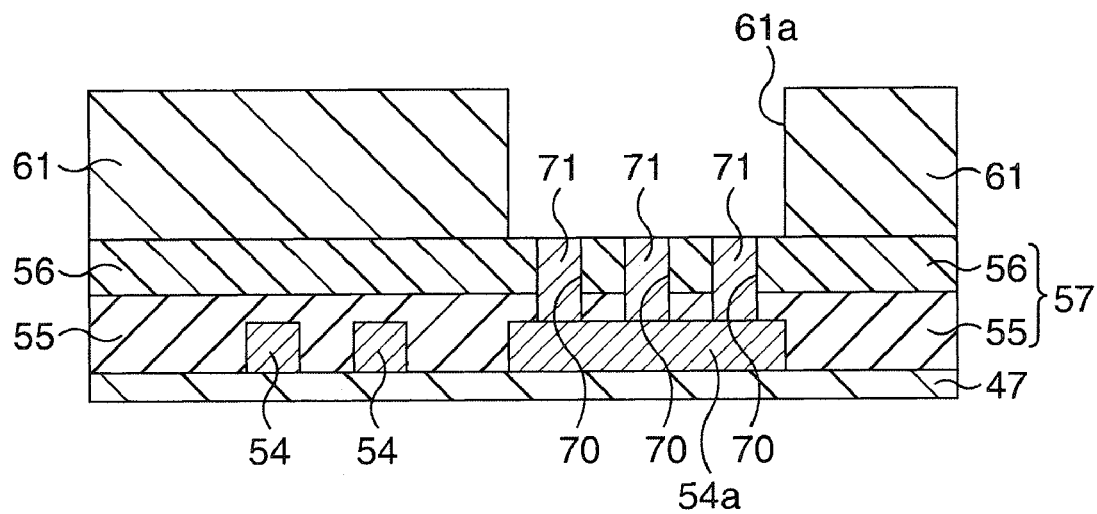
FIG. 20F is a schematic cross-sectional view illustrating a method for manufacturing an FeRAM according the third variation of the second embodiment.

Then, an upper insulating film 61 that covers the area surrounding the multiple conductive plugs 71 is formed as shown in FIG. 20F.

In particular, first an upper protecting layer 61 is formed on the entire surface. The upper protecting layer 61 may be formed by depositing polyimide, for example.

Then, an opening 61a is formed in the upper protecting layer 61 above and in alignment with the pad electrode 54a to expose the regions where the multiple conductive plugs 71 are formed.

Figure 20G:
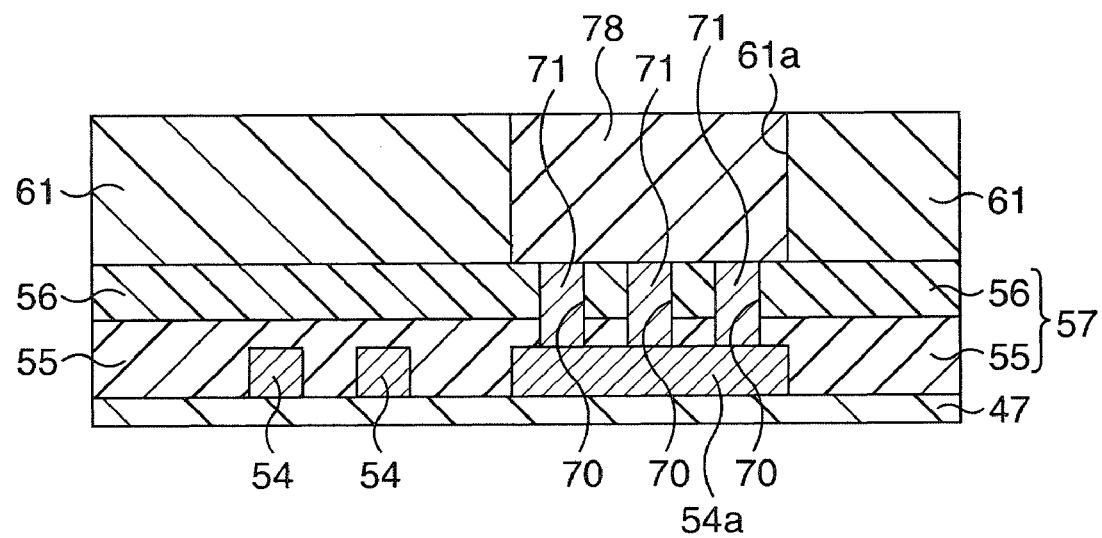
FIG. 20G is a schematic cross-sectional view illustrating a method for manufacturing an FeRAM according the third variation of the second embodiment.

Then, a protective metal film 78 is formed as shown in FIG. 20G.

In particular, a moisture-resistant metal, Al in this example, is deposited on the upper protecting layer 61, including inside the opening 61a, by sputtering to form an Al film. The Al film is formed thicker than the depth of the opening 61a, for example to a thickness of approximately 100 μm. The moisture-resistant metal may be an Al alloy such as Al—Cu, or Ti, Tin, TiON, or Cu, or a multilayered film of any of these, instead of Al.

Then, the surface of the Al film is polished by CMP, for example, using the upper protecting layer 61 as a stopper to expose the surface of the upper protecting layer 61. As a result, a portion of the Al film remains only in the opening 61a and fills the opening 61a to form a protective metal film 78 on the upper insulating film 56 that is electrically connected to the pad electrode 54a through the conductive plugs 71. The two-layer structure consisting of the pad electrode 54a and the protective metal film 78 connected to the pad electrode 54a through the conductive plugs 71 forms a pad electrode for providing electric connection to an external element. The protective metal film 78 in effect functions as a pad electrode. With this, an FeRAM is completed.

In the third variation, the surface of the lower insulating film 55 is planarized and CMP can be used when the protective metal film 78 is formed, as described above. The planarization is performed so that the protective metal film 78 is flush with the upper protective layer 61 formed on the lower insulating film 55 with the upper insulating film 56 between them. Accordingly, the upper insulating film 56, the upper protecting layer 61, and the protective metal film 78 have an excellent coverage and even thicknesses. Consequently, the resistance of the protective metal film 78 to damage during packaging, for example, may be significantly improved. Because the upper insulating film 56, the upper protecting layer 61, and the protective metal film 78 are formed so that they have an excellent coverage in this way, the ability of the upper insulating film 56 and the protective metal film 78 to prevent penetration of water/hydrogen is maximized. With this configuration, property degradation of the ferroelectric capacitor structure 30 can be reliably prevented.

Furthermore, the protective metal film 78 is connected to the pad electrode 54a through the conductive plugs 71 in the third variation. Thus, the protective metal film 78 is formed at a distance from the pad electrode 54a in a positive manner and therefore a contact mark made on the surface of the protective metal film 78 by probing during a functionality inspection of the pad electrode 54a cannot affect the conductive plugs 71. Thus, the electrical conductivity of the pad electrode 54a and the protective metal film 78 as a pad electrode and connectivity with a wiring can be adequately ensured.

INDUSTRIAL APPLICABILITY

According to the embodiment, a reliable semiconductor device in which penetration of water/hydrogen into a capacitor structure, especially a ferroelectric capacitor structure, is reliably prevented to maintain a high performance of the capacitor structure can be implemented with a relatively simple structure.

What is claimed is:

1. A semiconductor device, comprising:
   a semiconductor substrate;
   a capacitor structure formed over the semiconductor substrate and including a lower electrode and an upper electrode that sandwich a dielectric film;
   a wiring structure formed over the capacitor structure and electrically connected to the capacitor structure;
   a pad electrode electrically connected to the wiring structure and providing electric connection to an external element outside of the semiconductor device;
   an insulating film covering a portion of the pad electrode, a surface of the insulating film being planarized; and
   a protective metal film made of a moisture-resistant metal formed on the insulating film and the pad electrode,
   wherein the protective metal film is located over the pad electrode and is coupled to the pad electrode, and a second protective film located on the insulating film covers an area that surrounds the protective metal film and is electrically insulated from the protective metal film.

2. The semiconductor device according to claim 1, wherein the protective metal film is located over the pad electrode, is coupled to the pad electrode, and forms, together with the pad electrode, a two-layer pad structure.

3. The semiconductor device according to claim 1, wherein the insulating film comprises a lower portion, and an upper portion made of a silicon nitride.

4. The semiconductor device according to claim 3, wherein the upper portion covers an inner wall of an opening formed in the lower portion and exposing a portion of the pad electrode.

5. The semiconductor device according to claim 2, wherein the protective metal film is connected to the pad electrode.

6. The semiconductor device according to claim 5, wherein an upper protecting layer made of an insulating material is formed on the insulating film and the protective metal film is formed so that an opening formed in the upper protecting layer and the insulating film and exposing a portion of the pad electrode is filled with the protective metal film.

7. The semiconductor device according to claim 5, wherein the insulating film comprises a lower portion, and an upper portion made of a silicon nitride; and
   the protective metal film is formed so that a plurality of first openings formed in the lower portion and exposing a portion of the pad electrode and a second opening formed in the upper portion are filled with the protective metal film, the second opening being aligned with the first openings.

8. The semiconductor device according to claim 2, wherein the protective metal film is coupled to the pad electrode through a conductive plug.

9. The semiconductor device according to claim 8, wherein an upper protecting layer made of an insulating material is formed on the insulating film and the protective metal film is formed so that an opening formed in the upper protecting layer is filled with the protective metal film.

10. A semiconductor device, comprising:
    a semiconductor substrate;
    a capacitor structure formed over the semiconductor substrate and including a lower electrode and an upper electrode that sandwich a dielectric film;
    a wiring structure formed over the capacitor structure and electrically connected to the capacitor structure;
    a pad electrode electrically connected to the wiring structure and providing electric connection to an external element outside of the semiconductor device;
    an insulating film covering a portion of the pad electrode, a surface of the insulating film being planarized; and
    a protective metal film made of a moisture-resistant metal formed on the insulating film and the pad electrode,
    wherein the insulating film includes a lower portion, and an upper portion made of a silicon nitride, and
    wherein the upper portion covers an inner wall of an opening formed in the lower portion and exposing a portion of the pad electrode.

* * * * *